(12) United States Patent
Sontakke et al.

(10) Patent No.: US 9,581,645 B2
(45) Date of Patent: Feb. 28, 2017

(54) TEST CIRCUIT PROVIDING DIFFERENT LEVELS OF CONCURRENCY AMONG RADIO CORES

(71) Applicant: Texas Instruments Incorporated, Dallas, TX (US)

(72) Inventors: Adesh Sontakke, Karnataka (IN);
Rajesh Kumar Mittal, Karnataka (IN);
Rubin A. Parekhji, Karnataka (IN);
Upendra Narayan Tripathi, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 475 days.

(21) Appl. No.: 14/179,046

(22) Filed: Feb. 12, 2014

(65) Prior Publication Data
US 2014/0232422 A1 Aug. 21, 2014

Related U.S. Application Data

(62) Division of application No. 13/042,849, filed on Mar. 8, 2011, now Pat. No. 8,694,276.

(30) Foreign Application Priority Data

Jan. 20, 2011 (IN) .............................. 191/CHE/2011

(51) Int. Cl.
*G01R 31/319* (2006.01)
*G01R 31/14* (2006.01)
*G01R 31/317* (2006.01)

(52) U.S. Cl.
CPC . *G01R 31/31917* (2013.01); *G01R 31/31724* (2013.01); *G01R 31/31716* (2013.01)

(58) Field of Classification Search
CPC ........ G01R 31/31716; G01R 31/31724; G01R 31/31917
USPC ........ 702/58, 117, 118, 121, 119; 324/750.1, 324/750.3; 370/254, 328; 713/320; 714/723, 724, 729
See application file for complete search history.

(56) References Cited

U.S. PATENT DOCUMENTS

2010/0134133 A1* 6/2010 Pagani ............. G01R 31/31713
324/750.3

OTHER PUBLICATIONS

"System-on-a-Chip Test Scheduling With Precedence Relationships, Preemption, and Power Constraints", Vikram Iyengar and Krishnendu Chakrabarty, IEEE Transactions on Computer-Aided Design of Integrated Circuits and Systems, vol. 21, No. 9, Sep. 2002.*

* cited by examiner

*Primary Examiner* — John H Le
(74) *Attorney, Agent, or Firm* — Lawrence J. Bassuk; Charles A. Brill; Frank D. Cimino

(57) ABSTRACT

A testable integrated circuit chip (80, 100) includes a functional circuit (80) having modules (IP.i), a storage circuit (110) operable to hold a table representing sets of compatible tests that are compatible for concurrence, and an on-chip test controller (140, 150) coupled with the storage circuit (110) and with the functional circuit modules (IP.i. The test controller (140, 150) is operable to dynamically schedule and trigger the tests in those sets, which promotes concurrent execution of tests in the functional circuit modules (IP.i). Other circuits, wireless chips, systems, and processes of operation and processes of manufacture are disclosed.

16 Claims, 25 Drawing Sheets

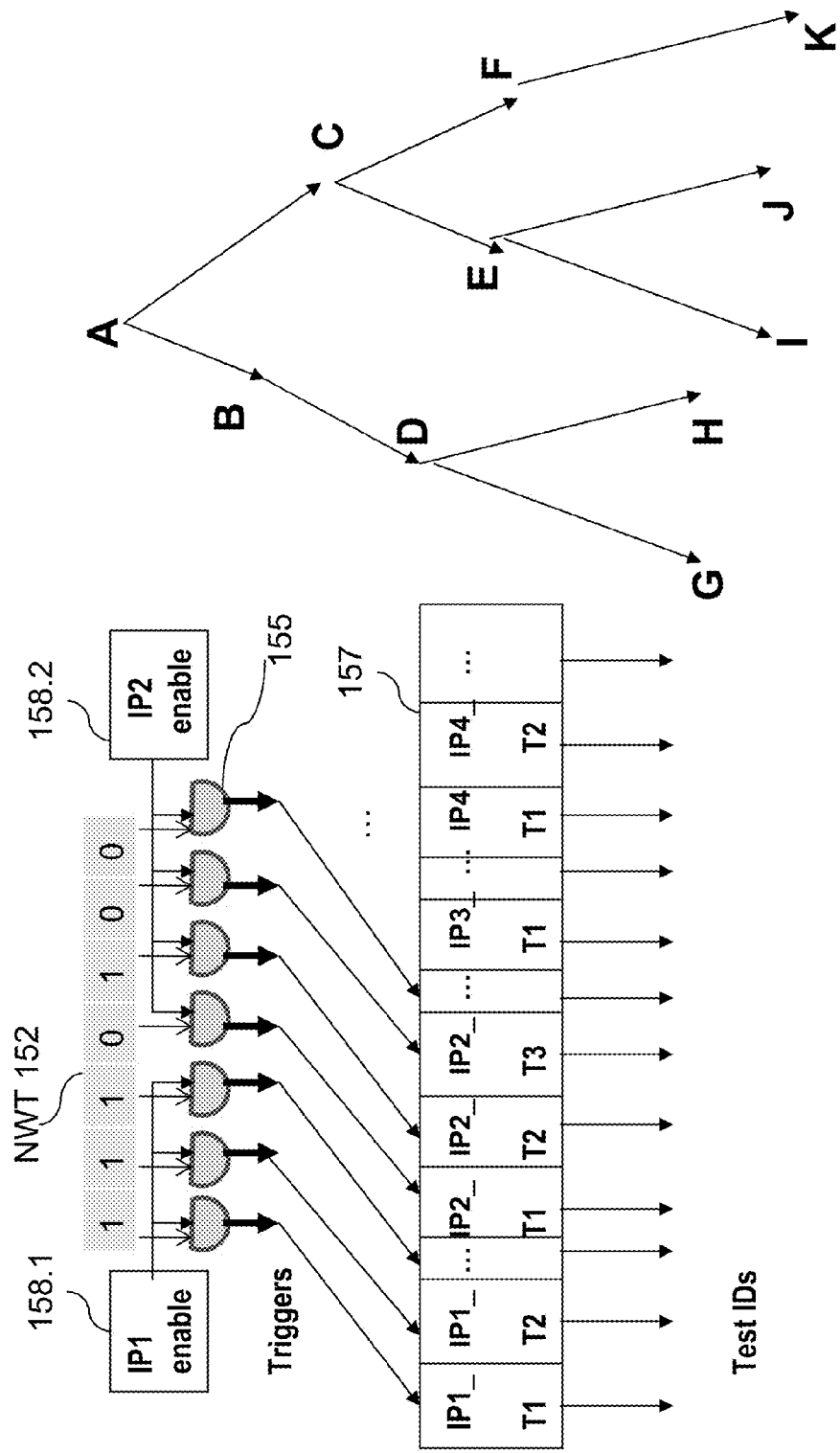

FIG. 14

| Power up | TDL.1 Time = T2 ms | | | TDL.2 Time = T3 ms | | | TDL.3 Time = T4 ms | | |
|---|---|---|---|---|---|---|---|---|---|
| | WLAN EXECUTION | | | | | | | | |
| | T2.1 ms | WLAN processor idle here | T3.1 ms | | WLAN processor idle here | T4.1 ms | | WLAN tests over | |
| | WR1+ WR2 + WR3+ WR4+ WR7 +WTXRX11+ WTX8 | | WTX9 + WTXR X12 | | | WT X10 | | | |
| | BT EXECUTION | | | | | | | | |
| | T2 ms | | T3 ms | | | BT tests over | | | |
| | BTWR2 + BTWR3 + BTWR4 + BTWR1 + BT9 | | T_BTWR5 + T_BTWR6 + T_BTWR7 + T_BTWR8 | | | | | | |
| | FM EXECUTION | | | | | | | | |
| | T2.2 ms | FM processor is idle here | T3.1 ms | | | T4 ms | | | |
| | FMRX2 + FM7 + FM6 + FM4 + FM5 | | FM3 + FM8 + FM9 + FM10 | | | FMTX1 | | | |
| | GPS EXECUTION | | | | | | | | |
| | T2.3 ms | GPS processor is idle here | T3.2 ms | | | GPS tests over | | | |
| | G1+G2+G3+G4+G5+G6+G8+G9+ G10 | | G7 | | | | | | |

TEST CIRCUIT PROVIDING DIFFERENT LEVELS OF CONCURRENCY AMONG RADIO CORES

CROSS-REFERENCES TO RELATED APPLICATIONS

This application is a divisional of application Ser. No. 13/042,849, filed Mar. 8, 2011, now U.S. Pat. No. 8,694,276, issued Apr. 8, 2014, which is incorporated herein by reference in its entirety, which claims priority under the Paris Convention and 35 U.S.C. 119 and all other applicable law to India Patent Application 191/CHE/2011 "Built-In Self-Test Methods, Circuits and Apparatus for Concurrent Test of RF Modules with a Dynamically Configurable Test Structure" filed Jan. 20, 2011, which is incorporated herein by reference in its entirety.

STATEMENT REGARDING FEDERALLY SPONSORED RESEARCH OR DEVELOPMENT

Not applicable.

COPYRIGHT NOTIFICATION

Portions of this patent application contain materials that are subject to copyright protection. The copyright owner has no objection to the facsimile reproduction by anyone of the patent document, or the patent disclosure, as it appears in the United States Patent and Trademark Office, but otherwise reserves all copyright rights whatsoever.

BACKGROUND

The field of the invention pertains to integrated circuits (ICs), system on a chip (SOC) ICs, and processes and circuits for making and testing them.

In a mixed-signal SOC, a significant portion of the overall test time (and hence the test cost) is spent on testing the non-digital modules or IPs in the device. "IP" refers to an internal circuitry core or module (internal details not necessarily known to tester), and may generally refer to a circuit module hardware core or a soft core defined in design code. RF (radio frequency) circuit test time can even dominate SOC test time and be much higher compared to structural circuit test time and power management PM test/calibration time. When test time is in a production flow, it can limit achievable rates of production, which is expensive and problematic for manufacturers and consuming public alike.

RF testing is expensive because high pin count SoCs entail more test resources. Transmit tests may call for a complex demodulator to do tests for various modulation types EVM and standards coverages as in 802.11 (WiFi), and to do tests for BER (bit error rate) and other performances. Receive tests can call for RF test sources to test Sensitivity, Noise Figure, etc. Both TX and RX tests are even more complicated when multiple radios are integrated, such as Bluetooth, GPS, WLAN, FM, etc. Ports on the SoCs and on testing devices are likely to be limited in number. With multiple radios, co-existence tests are also likely to be called for.

This inconvenient and expensive test-time problem is further accentuated in devices with RF radios, wherein the tests require sophisticated instrumentation on the tester (in the form of stimuli sources and response loggers), further impacting the test cost. While highly accurate performance and specification tests could be intelligently replaced with coarser defect catching tests, (hence alleviating the need for expensive instrumentation on the tester), the test time still remains a bottleneck due to the need for applying these tests individually for the different radio IPs in an integrated SOC.

Consequently, new departures are needed to somehow address the above problems, and new types of circuits, devices and systems and processes of manufacturing and testing them would be most desirable.

SUMMARY OF THE INVENTION

Generally, and in one form of the invention, a testable integrated circuit chip includes a functional circuit having modules, a storage circuit operable to hold a table representing sets of compatible tests that are compatible for concurrence, and an on-chip test controller coupled with said storage circuit and with said functional circuit modules, said test controller operable to dynamically schedule and trigger the tests in those sets, whereby promoting concurrent execution of tests in said functional circuit modules. Other circuits, wireless chips, systems, and processes of operation and processes of manufacture are disclosed.

Generally, and in another form of the invention, a wireless chip includes mixed-signal cores for at least two different radios, wherein at least one of the radios has a transmitter and/or a receiver, and a test circuit coupled with the radios, the test circuit including a configurable controller operable to trigger compatible tests and to dynamically create a schedule responsive to test completions for concurrent tests on the radios.

Generally, and in a manufacturing process form of the invention, a manufacturing process includes downloading tests and a table identifying different sets of the tests that are compatible, executing at least two of the tests concurrently on an integrated circuit to be tested whereby the tests complete at different times, and dynamically scheduling concurrency among at least some of the different tests depending on the table and the actual order of test completion.

Generally, and in a process of operation form of the invention, an electronic process of dynamic scheduling includes accessing different compatibility classes, selectively triggering tests from at least one of the compatibility classes, and electronically executing a repeated conditional determination of whether tests represented by another accessed compatibility class are a superset of all triggered still-active tests from any such accessed compatibility class, and if so then triggering any tests in said another compatibility class that are yet to be triggered.

Generally, and in a further form in the invention, an integrated circuit includes a control storage having an address input to access any of plural test lists and having a test list output, an address generator operable for changing an address to said control storage, a sequential control logic operable coupled to said address generator to cause said address generator to effect a change or reverse a change on command, said sequential control logic having a stop input that receives a stop active from the address generator when a predetermined address is reached, and a test list updating logic coupled with said control storage test list output to receive at least one test list addressed by said address generator, said test list updating logic operable to compare such test lists and coupled with and actuated by said sequential control logic to select one of such test lists based on such comparison and generate test trigger output signals based on the selected test list.

Generally, and in an additional form of the invention, a testable apparatus includes a first modem for a first type of radio, a second modem for a second type of radio, a processor coupled with said first and second modems, and a storage circuit operable to hold a configurable table representing sets of compatible tests that are compatible for concurrency, and to hold self test control instructions accessible by said processor to dynamically schedule the tests in those sets of tests for at least some concurrency of test of said modems.

Generally, and in yet another form of the invention, an electronic test circuit includes a storage with a test identification table having entries selectively representing compatibility between different test identifications, a processing circuit operable to access a first portion of said storage so that two or more tests that are compatible can be triggered for execution, and further to access a second portion of said storage for additional entries if all tests in the first portion are completed.

Generally, and in another further form of the invention, an electronic circuit includes a storage circuit that is loadable with sets of data bits, and a sequential logic circuit coupled with said storage circuit and operable to respond to the sets of data to issue test triggers for compatible tests in a coordinated manner that executes faster than executing the tests seriatim, while tests that are incompatible are prevented from executing in an overlapping manner.

Generally, and in a testing system form of the invention, a multi-site system includes a test storage, at least two dies, one or more testers, and a test line gateway operable to distribute test codes for various tests and compatibility data as between tests from said test storage to one or more of said testers.

Generally, and in a tester form of the invention, a tester includes a storage having a first storage area representing various tests and a second storage area representing instructions to generate a test scheduling table, an electronic interface connectable to convey the various tests in the test scheduling table externally to the tester, a tester processor coupled with said storage and with said electronic interface, said tester processor operable in response to said instructions to generate the test scheduling table to represent sets of the tests that are compatible with each other, said tester processor further operable to deliver the test scheduling table to said electronic interface.

Generally, and in a still further form of the invention, portions of the test controller and test storage lie even within the die or device under test (DUT). The external tester provides the start of test indication and optional clocks, and the whole test operation is performed using the storage and control mechanisms embedded inside the die as an enhanced built-in self-test (BIST) tester function that is inventively embedded inside the die embodiment. The external tester performs a high-level role having built-in storage, processors and interfaces and instructions to schedule various tests. Such an external tester controls the test of multiple dies in a multi-site system. With the whole test operation embedded inside the die, the external tester provides data on the various tests and their compatibility to fill the test storage inside the die, in turn directing a test schedule. If the test schedule is fixed, an embedded ROM for such data on the various tests and their compatibility suffices in some embodiments, and the external tester provides the start signal and the clock and the die or DUT does the rest.

Other circuits, devices and systems, and processes of manufacturing and operation are also disclosed and claimed.

BRIEF DESCRIPTION OF THE DRAWINGS

FIG. 3A is a schematic diagram of an output portion for a test list updating logic in FIG. 3.

FIG. 7 is a process of operation diagram showing a tree of different possible test schedules dynamically determinable from a given scheduling table, e.g. TABLE 1A, of tests using a hardware scheduling circuit embodiment of any of FIGS. 3-6.

FIG. 14 is a timing-bar diagram of parallel test bars for four IP cores as in FIG. 9 according to a parallel-scheduled process embodiment that reduces test time.

Figure 1:
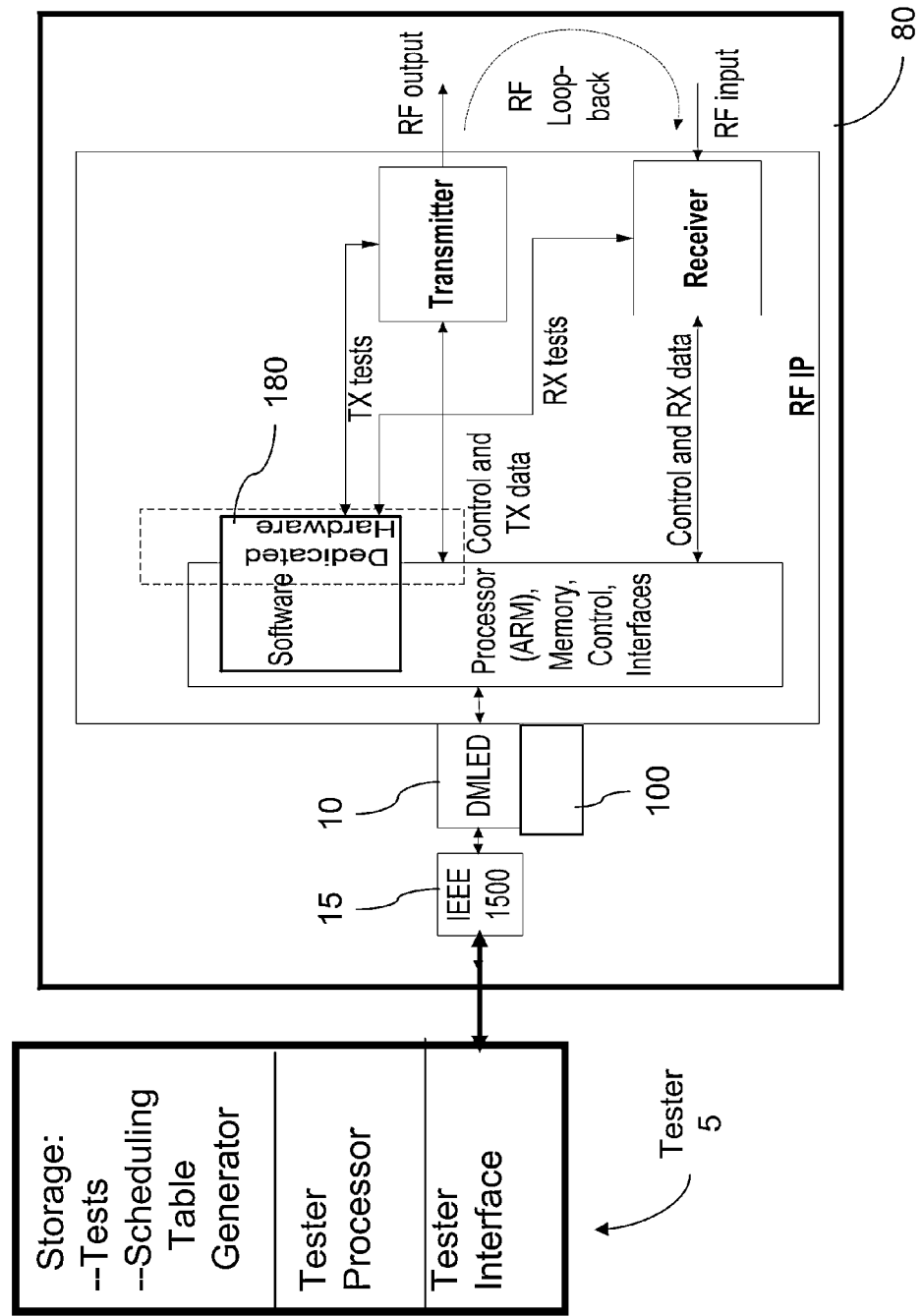
FIG. 1 is a block diagram of a tester and a device under test (DUT) that has one or more radio cores improved with test circuitry as described herein.

Corresponding numerals in different Figures indicate corresponding parts except where the context indicates otherwise. A minor variation in capitalization or punctuation for the same thing does not necessarily indicate a different thing. A suffix .i, .j, .k, .m, or .n refers to any of several numerically suffixed elements having the same prefix, or any of these letters may be used as an index.

DETAILED DESCRIPTION OF EMBODIMENTS

Some of the embodiments address the various problems by providing hardware for dynamically-scheduled concurrent testing of individual modules, of which radio IPs are a good example, in an SOC. Radios likely have dedicated processors or at least dedicated local control circuitry, and it is recognized herein that tests on different radio modules should and can be run concurrently under on-chip dynamic scheduling control. Not all tests are compatible, since they compete either for same tester/board resources or they result in interference. However, several of such tests still are compatible. Compatible tests are run in parallel using dynamic scheduling herein to fully exploit this opportunity for parallelism.

Some of the embodiments provide a type of electronic circuit for test that includes a functional circuit having modules and a radio core, as well as a configurable hardware built-in self test (BIST) controller sub-combination embodiment integrated with the functional circuit. The BIST controller embodiment creates a dynamic schedule for a set of concurrent tests wherein concurrency is based on a parallel application of identical test stimuli to the different modules of the functional circuit and on parallel execution of individual and different firmware sequences as multiple tests on the functional circuit. Various levels and types of concurrency of tests for the functional circuit are thus provided. Further, a combining circuit and a load execute dump interface are included. The combining circuit is coupled to the hardware BIST controller to combine results of the multiple tests and transfer the results through the load execute dump interface.

Among other remarkable process and structure features, various embodiments may involve any one, some or all of the following:
(a) Concurrent test of non-digital modules, and more specifically radio IPs, is provided effectively with an embedded processor that performs the dynamic scheduling or with some other scheduling circuit like a state machine to do so.
(b) The concurrency is based suitably on parallel application of identical test stimuli to different modules, and/or on parallel execution of individual (and different) firmware sequences on individual processors or other local control circuits for the modules.
(c) The concurrency goes beyond statically configured and can be dynamically controlled.
(d) The generation of concurrent tests is handled by a built-in hardware controller in some embodiments. No specific tester interaction is required. Different test schedules can also be created without having to manually generate the corresponding test sequence (across IPs) and then apply it from the tester.
(e) The level of concurrency and the level of multi-site test are independent.

Among other advantages and benefits, various embodiments may have any one, some or all the following:
(a) Parallelism is possible across different load-execute-dump phases, as well as within the execute phase.
(b) The test schedule can be dynamically configured to take into account the tradeoffs in parallelism and tester characteristics (resources available for independent stimuli and resources) and device characteristics (correlation between different tests and IPs due to co-existence issues, variation across different lots). The BIST control not only permits the concurrent test of individual RF modules, but also allows the tests to be dynamically scheduled in the individual modules to account for any issues arising due to concurrency, (e.g. tester resources, power, co-existence, yield fallout etc.). Test vectors corresponding to different test schedules do not have to be manually generated and applied externally from the tester. A BIST embodiment, therefore, permits tradeoffs in the test time and test quality to be exploited for maximizing production yield and test throughput. This flexibility is important since RF tests are developed and certified iteratively, from the first time they are applied to adequate levels of characterization until they are finalized for production test. Creating the right schedule for concurrent application of such tests is an iterative process (where different static configurations can be considered), and hence the ability to create a dynamic schedule and built-in test vector generation is a significant advantage.
(c) Different parallel test schedules can be created based on the individual Test IDs for each IP and their linkage within the test scheduler.
(d) The level of concurrency achieved is in addition to the level of multi-site that is possible for a given DUT-tester configuration.
(e) The embodiments can also be extended to support concurrency of different tests within an IP (core or module).
(f) The theoretical test time with a concurrent schedule can be computed as the sum of (i) initialization time, (ii) execution time of the longest test in each set of compatible tests across all IPs, (iii) execution time of the longest test in each set of incompatible tests. As indicated earlier, the execution time is the dominant component of a DMLED test. Analysis on an SOC with four radio modules (BT, FM, GPS and WLAN) points to a potential of 56% saving in the concurrent schedule, as against a serial schedule. The test time reduction is from 9980 ms to 4338 ms, i.e. about 5642 milliseconds in concurrent process embodiment approach over serial approach.

A Glossary of terms is provided for reference.
Glossary
 ATE: Automatic Test Equipment
 ATPG: Automatic Test Pattern Generation. Uses tools to generate patterns to check the quality of silicon during production. Generally refers to the stuck-at fault test pattern generation. Also can refer to $I_{DDQ}$ (static current into chip) and delay test pattern generation.

BIST: Built-In Self Test. Controller logic internal to a chip and designed to apply stimulus to test a block of logic without applying test vectors (software).

BT: Bluetooth

CDR, prefix 'Cdr_': Core Data Register or programmable register for test mode control.

DFT: Design for Test.

DUT: Design Under Test (functional IC)

FM: Frequency Modulation

GPS: Global Positioning System

IC: Integrated Circuit

I/O: I=Input, O=Output.

IP: Intellectual property core or module (internal details not necessarily known to tester). General reference in the industry to a circuit module hardware core or to a soft core defined in design code.

IR/DR: Instruction Register/Data Register.

JTAG: Joint Test Action Group, or the IEEE 1149.1 Standard, which defines a Test Access Port (TAP) and boundary scan design at the chip level.

NFC: Near Field Communication

PE: Product engineers

Scan: Structural test methodology places the chip in a special scan state where virtually all functional flops are connected into one or more shift registers accessible to the tester, permitting test stimuli to be applied, and responses to be collected.

Setup/Header content: Control bits to configure the TAP controller (not the bits for a scan chain) or equivalent logic for test mode and ATPG setup.

SI/SO: Scan In/Scan Out

SOC: System on Chip

TDL: Test Description Language.

TAP: Test Access Port. Defines I/O and state machine for test mode access.

WLAN: Wireless Local Area Network

IEEE1500: Standard for core based testing, similar to JTAG 1149.

Figure 2:
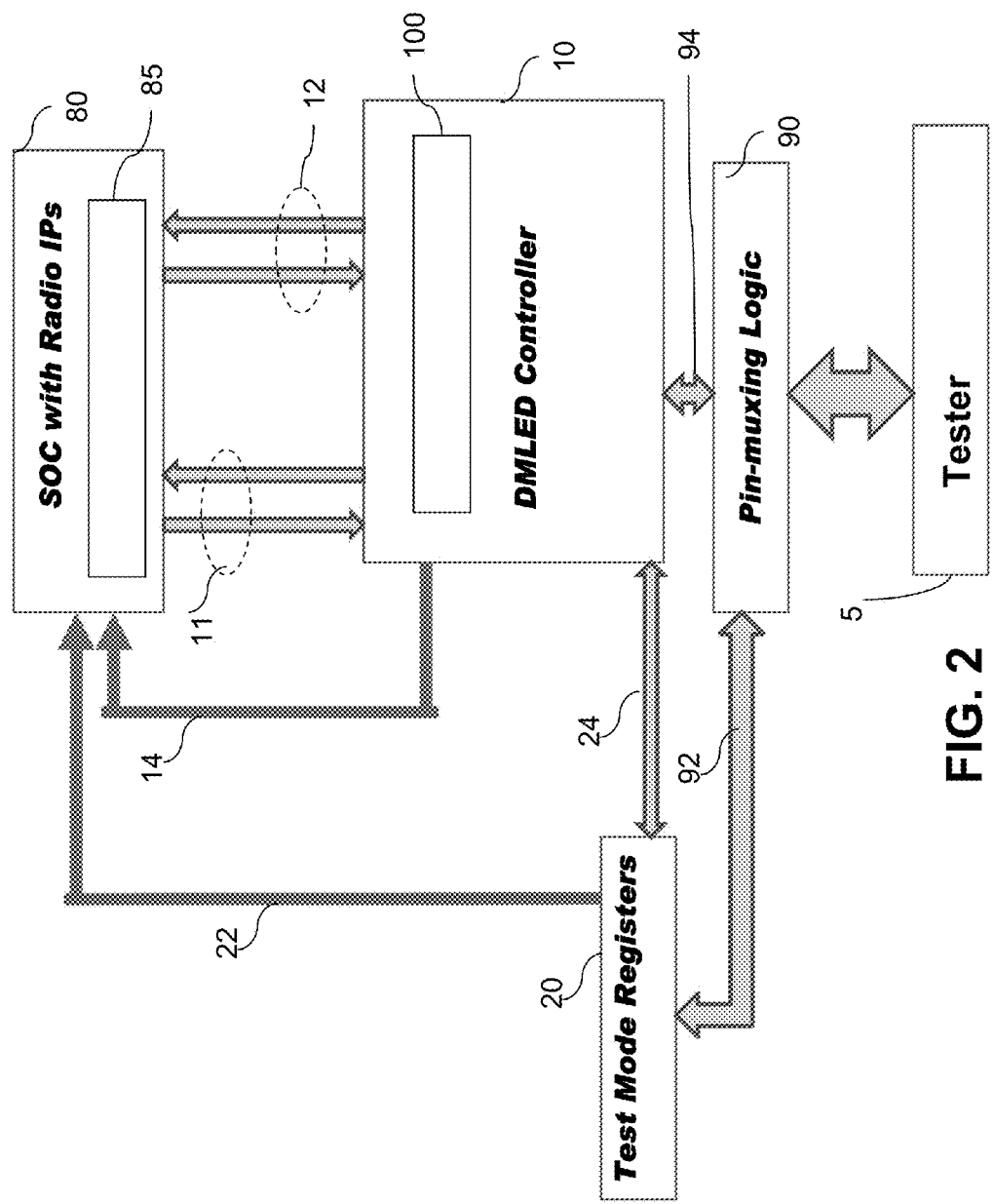
FIG. 2 is a block diagram of parts of a test circuit embodiment for use with the DUT of FIG. 1 and improved as in the other Figures and described herein.
Figure 3:
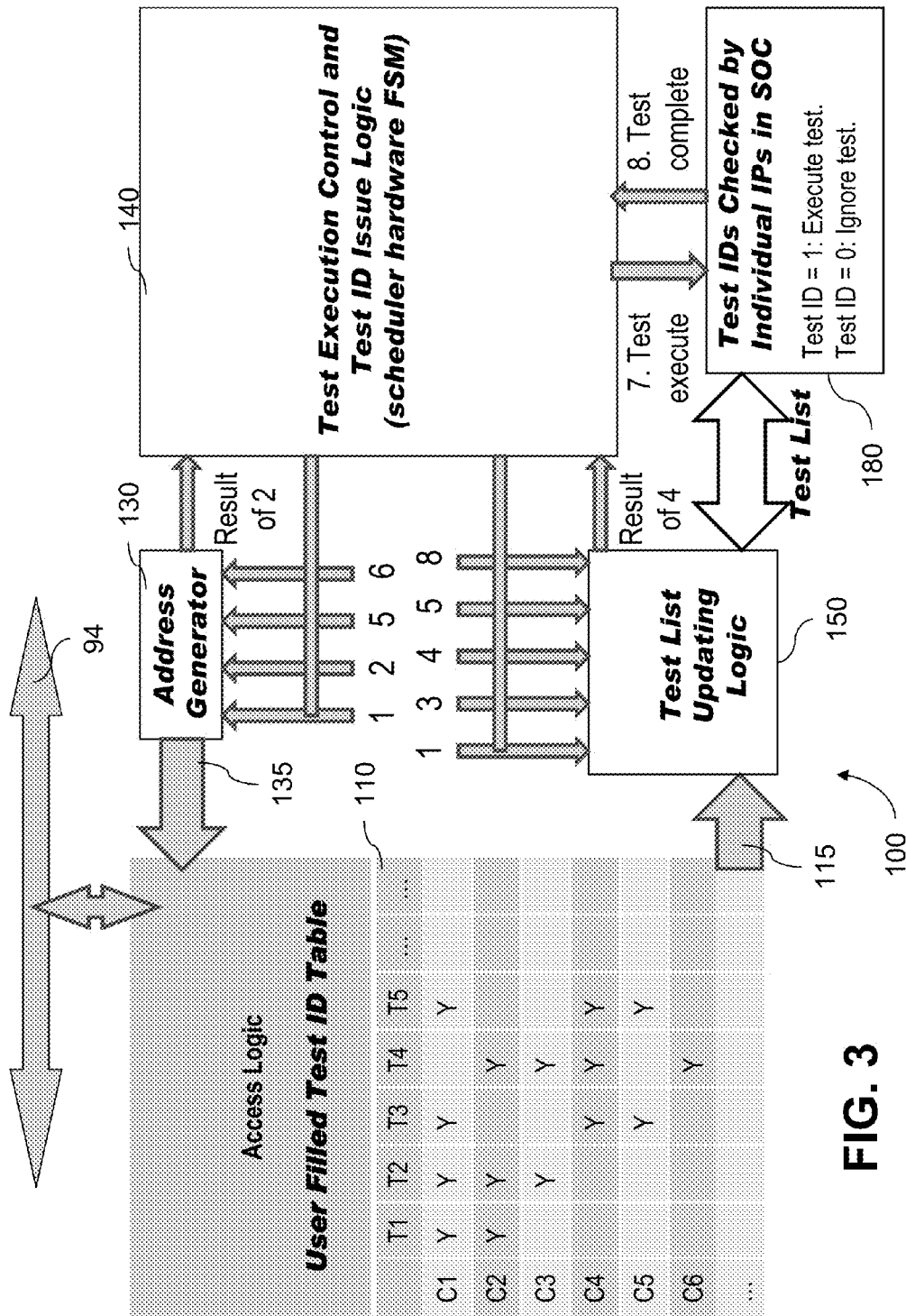
FIG. 3 is a block diagram of a hardware scheduling circuit embodiment for use in FIGS. 2 and 1.

In FIGS. 1-3, a built-in self-test (BIST) controller embodiment 100 in a SOC 80 is used both for scheduling the tests for multiple RF modules and for actual test control 180 for the IP modules themselves. This provides the ability to create a dynamic test schedule structure that can be changed if required without having to less-efficiently re-create test vectors externally and apply them through the tester 5 and a test interface 15. Thus, hardware 100 is coupled with DMLED 10 and is implemented to run IP-specific tests simultaneously or concurrently on different IPs. Different tests, or sets of tests, are assigned unique Test IDs to which IP-specific control circuits 180 locally respond, and they can be selected and results of individual tests can be observed. Some embodiments provide a hardware scheduler 140 on-chip that permits and βcreates dynamic test execution schedules without the need to create distinct TDL (test description language of an external tester) sets for different test schedules. The hardware scheduler enables different configurations easily, based on known or newly-observed incompatibilities.

DMLED 10 control by the special controller 100 in some embodiments supports parallelization across all the phases of DMLED (load, execute, dump) across multiple IPs. The DMLED control is arranged in a process embodiment to overlap an execute phase in one IP with a download phase in another IP, see FIGS. 10 and 12. Download parallelism is controlled through tester controlled sequences and represented by compatibility classes in a scheduling table called Test ID Table 110 in FIG. 3. A sequence is repeated for different sets of compatible sets of tests. A top level combiner (e.g., in FIGS. 8 and 9) brings out IP-specific test status onto SOC pins.

As an example, different tests can be included in one firmware image, which is loaded into the memory, and the processor runs the tests (identified by the Test ID) by correspondingly indexing into the memory, as determined by the test schedule. Being a BIST embodiment, in which the tests are run by the on-chip processor from the internal memory, higher multi-site test (FIG. 21) such as of multiple die on the same wafer is also accommodated or enabled, and hence in this way embodiments can further reduce test costs.

In furtherance of various solutions to the problems noted earlier hereinabove, consider also that a radio IP (intellectual property) core, as in FIGS. 1 and 19, has two main parts, an embedded processor which provides the control, and the RF (radio frequency) plus MS (mixed-signal) circuit which does the signal processing, including the transmission and reception. A conventional RF test might directly drive the RF+MS circuit providing the continuous wave source and doing RF signal+power measurements. A test applied herein using a low cost tester (without such source and measurement capabilities) runs on an embedded processor of a SOC, which in turn controls the operation and sequencing of the RF+MS modules to run a functional radio (transmit and/or receive) sequence. Such sequence is enabled through built-in (die level) or external (board level) loopback between the transmit and receive channels within or across radio modules. The DMLED test, (DMLED means Direct Memory Load-Execute-Dump), includes three parts:

(i) Download of the code into the memory before the processor starts executing it.

(ii) Code execution.

(iii) Dumping the result of the test to ascertain the pass/fail status.

Some of the embodiments parallelize (FIGS. 10 and 12) all the three phases across multiple IPs, i.e. the LED sequence in one radio IP can be carried out in parallel with that of another radio IP. Since the download and the status dump times are small as compared to the test execution times, parallelizing the execution provides maximum gains. Therefore, this type of embodiment is most effective, from a hardware overhead and design complexity point of view, when the same test interface is re-used across all IPs to provide for both test download and result-dump operations for all of them. Moreover, such embodiments can parallelize all the three phases of the DMLED tests as well.

In FIG. 1, an organization of individual IP cores inside a SOC 80, as well as the structural configuration of embedded processor and loop-back, are shown. In FIG. 1 and FIG. 19, RF loop-back testing is controlled by software running hardware BIST. RF loop-back testing is done by connecting transmitter output to receiver input so as to avoid need for external RF source and sink capability. The different operations for these RF components are controlled by registers programmable through the software/firmware as in FIG. 2. An IEEE 1500 interface 15 (see also FIG. 18) couples test signals and controls from a tester 5 for a DMLED 10 and controller 100 and for the individual IP cores inside SOC 80, one of which cores is depicted. In an IP core as illustrated a core processor, memory, control of interfaces are coupled to DMLED 10 and controller 100. Software and tests-specific dedicated hardware 180 couple the processor with a transmitter and a receiver for the type of IP core radio to be tested. In this way, transmitter TX controls and data are coupled from the processor to the transmitter and the dedicated hardware performs the tests on command. Analogously, receiver RX controls and data are coupled from the processor to the receiver and the dedicated hardware performs the tests on command. By RF loopback, some tests involve both the transmitter and receiver in coordination.

FIG. 2 depicts how the DMLED controller 10 of FIG. 1 interfaces with the SOC 80 and IPs. The FIG. 2 hardware is provided at the SOC level to enable parallel test across multiple radio modules. Test execution (test_exec) and test_status signals from different IPs are combined at a device level pin in FIGS. 2, 8 and 9.

The DMLED controller overall circuit shown in FIG. 2 includes a DMLED controller block 10 and 100 with interfaces to the Tester 5 externally (off-chip as in FIG. 18) and internally as in FIG. 2 to the test mode controls and IPs internal to SOC 80. In FIG. 2, that DMLED controller block 10, 100 is provided as part of the integrated circuit, and some background on a type of DMLED controller 10 is found in "Testing of Integrated Circuits Using Test Module", U.S. Patent Application Publication US 20080320347 dated Dec. 25, 2008, which is hereby incorporated herein by reference. In addition, to address multiple IPs inside the SOC, the DMLED controller 10 also interfaces to memories inside each IP by memory read/write operations on lines 11 and by operations on lines 12 for configuration (control as well as status) registers 85 inside each IP. DMLED controls 14 for individual IP's are coupled from DMLED 10. Pin-muxing logic 90 has bi-directional test configuration lines 92 to SOC test mode registers 20. SOC test mode registers 20 in turn are coupled via lines 22 and 24 to SOC 80 and DMLED controller 10 respectively. Lines 22 convey test mode controls for individual IP's, and lines 24 bi-directionally convey test mode controls for DMLED controller 10. The firmware inside each IP core in SOC 80 controls the sequence of operation of how the individual tests for each IP are loaded, executed and status generated. This firmware is configured using the tester 5 by writing into the SOC test mode registers 20 in FIG. 2. Firmware download and status is coupled from the pin-muxing logic 90 via bidirectional bus lines 94 to DMLED controller 10 and at least some of this firmware is coupled via DMLED controller 10 and lines 11 and 12 to provide or update the firmware inside each IP in SOC 80. Bus lines 94 suitably also are used to download and convey configuration values or entries for Test ID Table 110.

Figure 4:
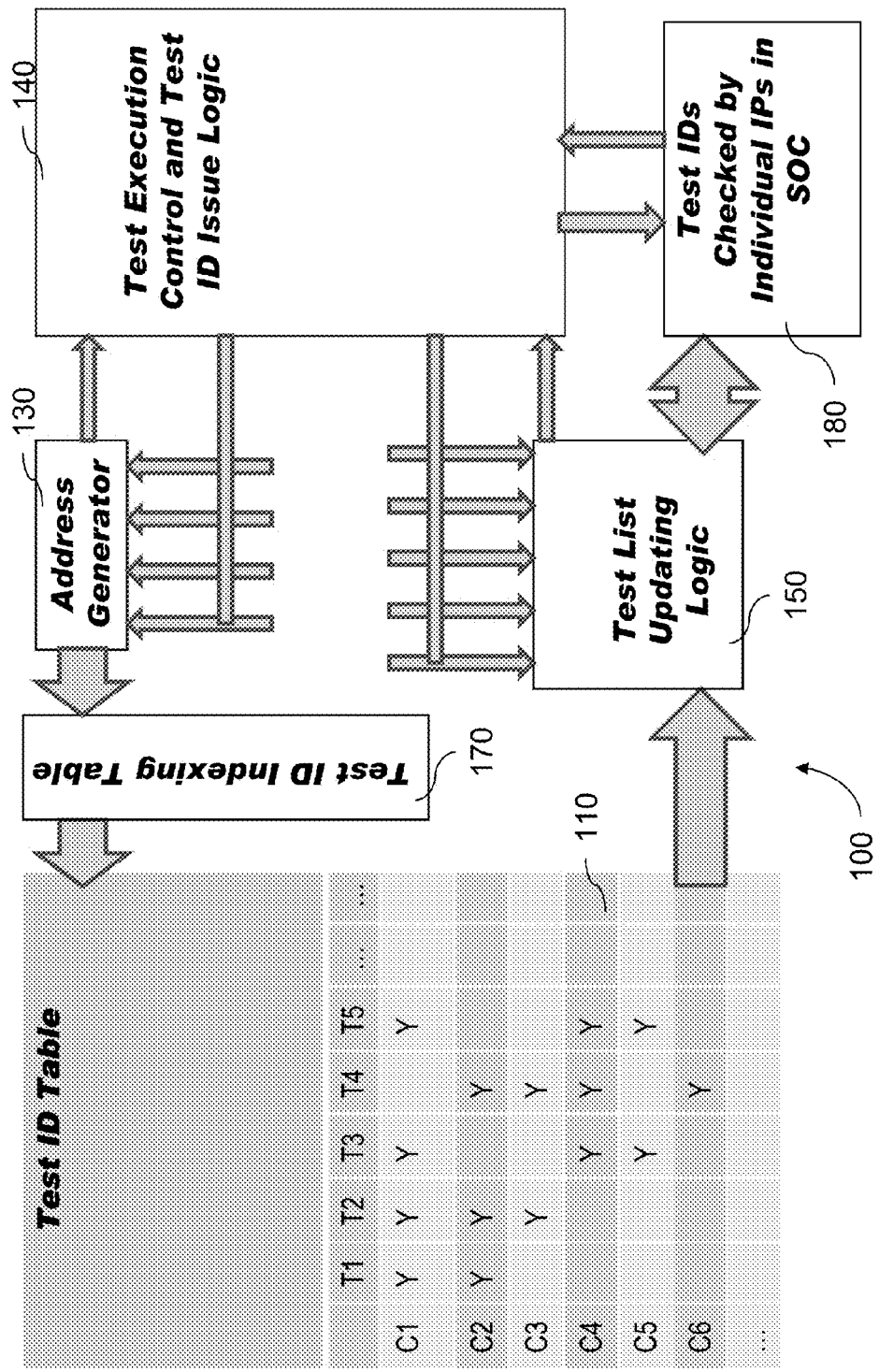
FIG. 4 is a block diagram of an alternative hardware scheduling circuit embodiment for use in FIGS. 2 and 1.

FIGS. 3-4 show two embodiments of structures and methods by which a dynamic scheduler controller 100 is added to FIG. 2 DMLED 10 and controls the execution of the tests. The tests are listed according to a format as shown in a user (tester) filled Test ID Table 110 of FIG. 3 or 4. Various dynamic scheduler states and controls in a controller finite state machine FSM of FIG. 25 or other circuit for Test Execution Control and Test ID Issue Logic 140 are shown and described. A test list updating logic 150 receives information from test ID Table 110 and, under control of, e.g., FSM 140 converts that information into trigger signals for circuits 180 in the IP cores.

Figure 10:
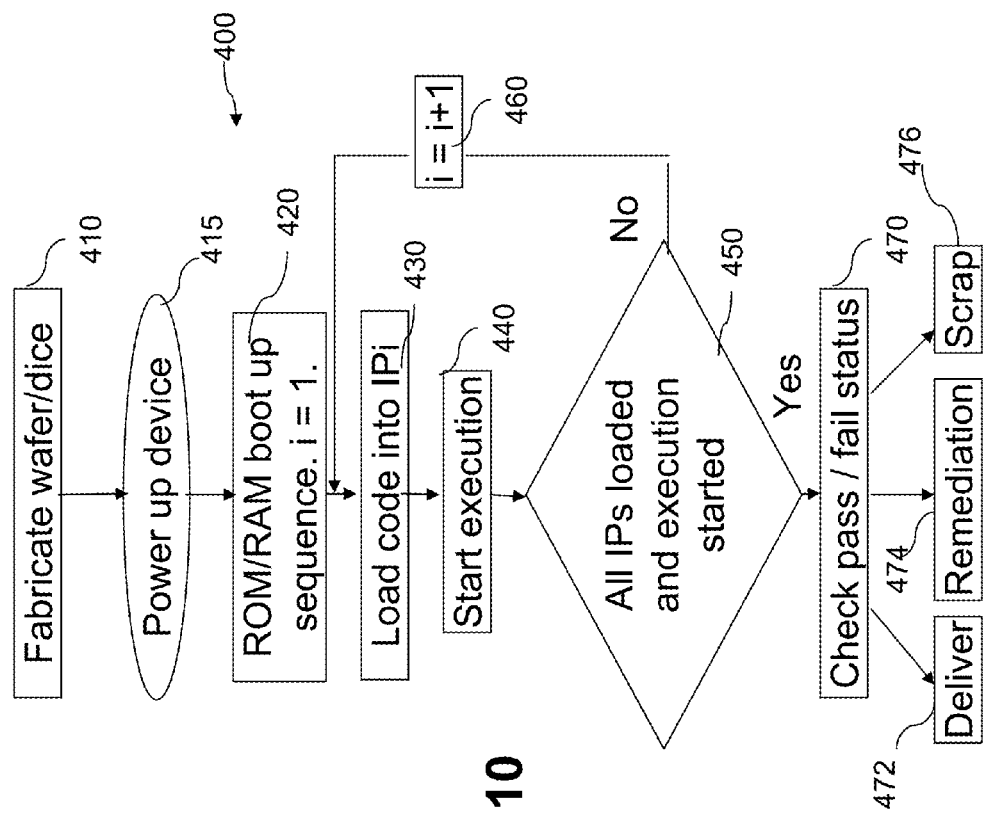
FIG. 10 is a flow diagram of a control process embodiment that loads and executes tests in the DUT of FIG. 9 using a hardware scheduling circuit embodiment of any of FIGS. 3-6 and responsive to a scheduling process embodiment such as in FIG. 17.
Figure 17:
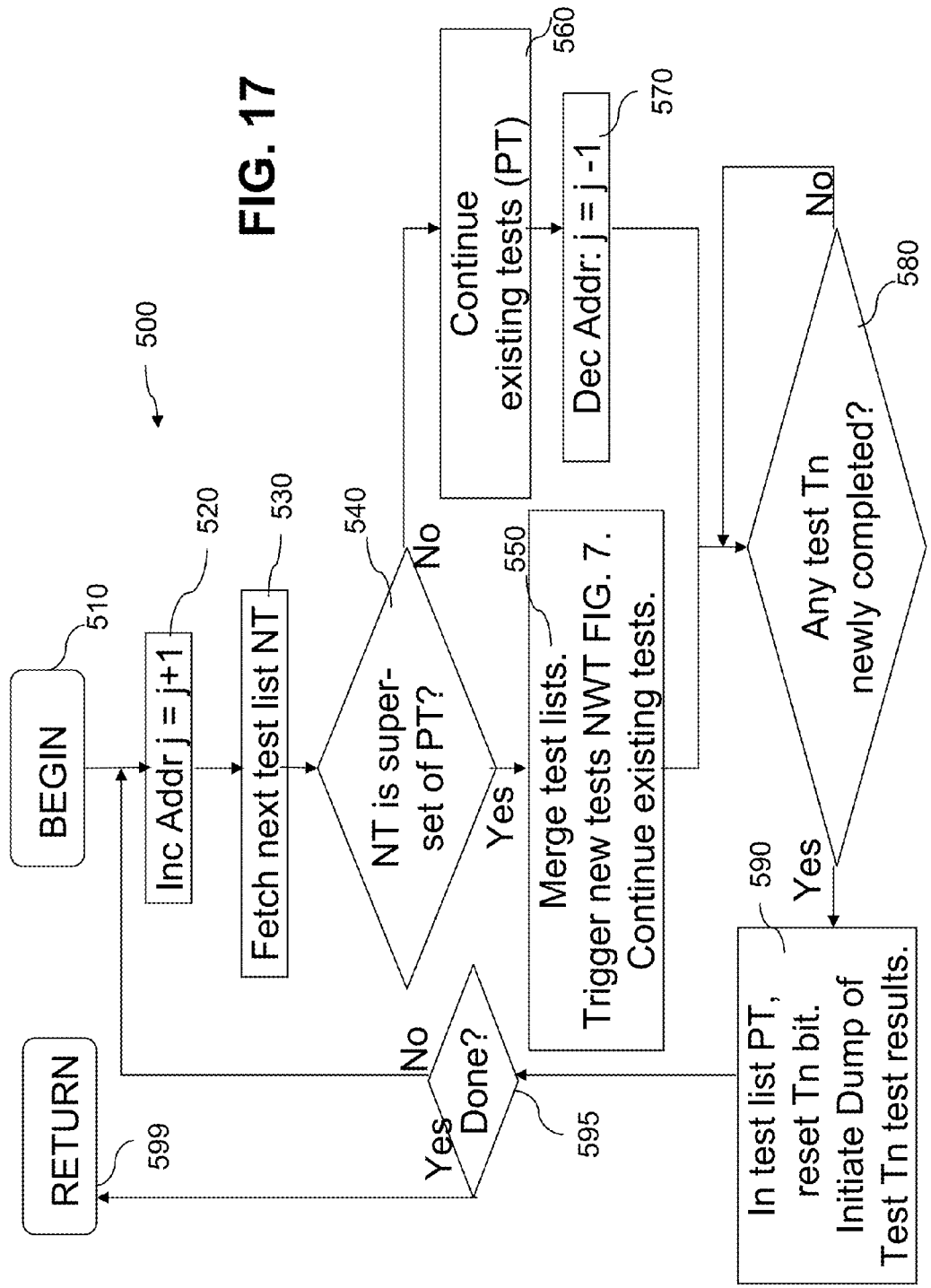
FIG. 17 is a flow diagram of a control process embodiment that dynamically schedules tests in the DUT of FIG. 9, and triggers tests using a process such as of FIG. 10.

In FIG. 3, the test circuitry embodiment 100 includes a storage with a Test ID Table 110 that is processed such as according to the flow description of FIGS. 10 and 17. Table entries for Test ID Table 110 are generated beforehand as described in any of FIGS. 22, 23, 24, and/or TABLE 6A. All tests in a given row (compatibility class) can be triggered for execution (unless block 140 has been arranged for some other type of operation as for TABLE 1A). In FIG. 3, the compatibility class is replaced with a new row if all tests in the existing row are completed, or the compatibility class is conditionally augmented by ORing the contents of the next compatibility class if all tests in the existing row are not yet complete. (See Steps 3, 4 and 5 of, e.g., a process embodiment in TABLE 4 later hereinbelow). In FIG. 3, the Test ID Table 110 is accessed by a pointer circuit or Address Generator 130 via address bus 135 and the row corresponding to that address is fetched or transferred via data bus 115 to the Test List Updating Logic 150. The triggering of tests that is output from Test List Updating Logic 150 is illustrated in FIG. 3A. Trigger enable bits in a test trigger enable register NWT or 152 of FIG. 3A that are active (1) indicate compatible tests that are ready for execution. Trigger enable bits that are inactive (0) indicate non-existent or incompatible tests.

In FIG. 3A, an output circuit portion for the FIG. 3 test list updating logic 150 has a set of OR gates 155 that receive respective bits from the test trigger enable register NWT 152 from preceding circuitry in logic 150, such as in portion 250 of FIG. 6 or as variously described in connection with FIG. 17 and pseudocode example Tables. Three of the OR-gates 155 have their outputs routed to IP core IP1 in FIG. 9 and are qualified by an enable line IP1_Enable connected to their second inputs in tandem. Another five of the OR-gates 155 have their outputs routed to IP core IP2 and are qualified by an enable line IP2_Enable connected to their second inputs in tandem. This illustrated output circuit portion is useful, for instance, to override some of the zero (0) bits in test trigger enable register 152, and instead activate all the triggers for a given IP core from their respective configuration register bit fields 158.1, 158.2, etc. Some embodiments either additionally or alternatively provide AND gates connected in the manner of the OR-gates 155, and the IP enable bits are suitably used to disqualify/prevent all the tests in a given IP core or conversely to enable such tests under the control of test trigger enable register 152.

In FIG. 3A, some embodiments have a further circuit 157 that issues a respective actual multi-bit identification code for the test that is triggered by its corresponding bit in register NWT or its corresponding gate 155. That circuit 157 can be a set of configurable registers having outputs respectively enabled or disabled by the applicable bit from register NWT 152 or the applicable gate 155 individually. Alternatively circuit 157 is a small memory circuit addressed by the ones and zeros from register NWT 152 or the gates 155 collectively. A configurable counterpart decoding circuit portion in each circuit 180.i in the IP cores IP.i of FIG. 9 checks each multi-bit identification code supplied by circuit 157 and only enables its IP core IP1, or IP2, etc. for that test provided the multi-bit identification code checks out as valid, by decoding valid for its IP core.

In FIG. 4, the test circuitry embodiment 100 is extended and includes a Test ID Indexing Table 170 between an Address Generator 130 and the Test ID Table 110. This facilitates Test ID indexing for access to the Test ID Table 110. In some embodiments, Test ID Indexing Table 170 is an efficiently-small programmable or configurable logic structure that facilitates access to the Test ID Table 110 to effectively introduce one or another particular permutation of table rows in Test ID Table 110. Such permutation can effectively alter the resulting dynamic schedule of tests to consume less test time and thereby more nearly optimize a test process.

Differences between a static schedule and dynamic schedule are noted as follows: In a static schedule (FIG. 11), the tests are configured for concurrent execution before the start of the execution. As a result, the sets of compatible tests apparently would need to be ascertained upfront. Also, the scheduling order of the tests themselves apparently would need to be created before the start of the execution. On the other hand, the tests according to a dynamic schedule of FIGS. 3, 4 and 12 are configured herein for parallel execution as in FIGS. 3-7 in a more flexible form in two ways: (i) By changing the entries in the Test ID Table 110 in FIG. 3. The Test Execution Control and Test ID Issue Logic 140 (such as an FSM) automatically executes the test in the new order, since it reads the updated table entries. (ii) If the Test ID Table 110 is not desired to be changed, a Test ID Indexing Table 170 can be provided, as shown in FIG. 4. The FSM 140 in FIG. 25 now accesses the Test ID Indexing Table 170 of FIG. 4 and hence indirectly accesses the Test ID table 110, wherein the order of entries in Test ID Table 110 are indirectly accessed as if they had been over-written, hence providing for a dynamic configuration. The individual test IDs can also be selectively set or reset to change the test schedule. Moreover, the dynamic scheduling can respond to particular lengths of actual time of test execution for each test to establish the actual schedule of tests on the fly, as described for FIGS. 7 and 17 and elsewhere herein. Further description of the blocks in FIGS. 3-4 is provided especially in connection with FIG. 17.

Figure 5:
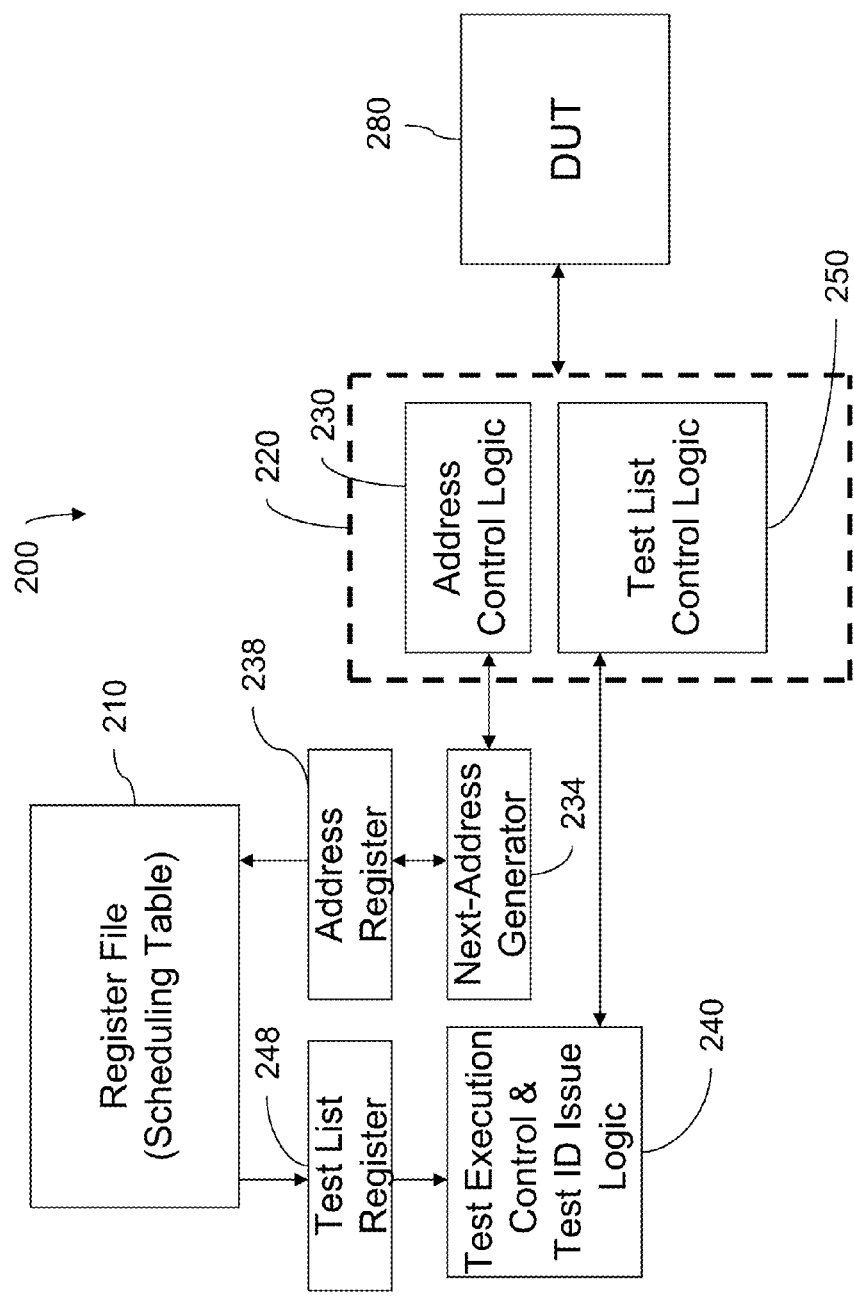
FIG. 5 is a block diagram of another alternative hardware scheduling circuit embodiment for use in FIGS. 2 and 1.
Figure 6:
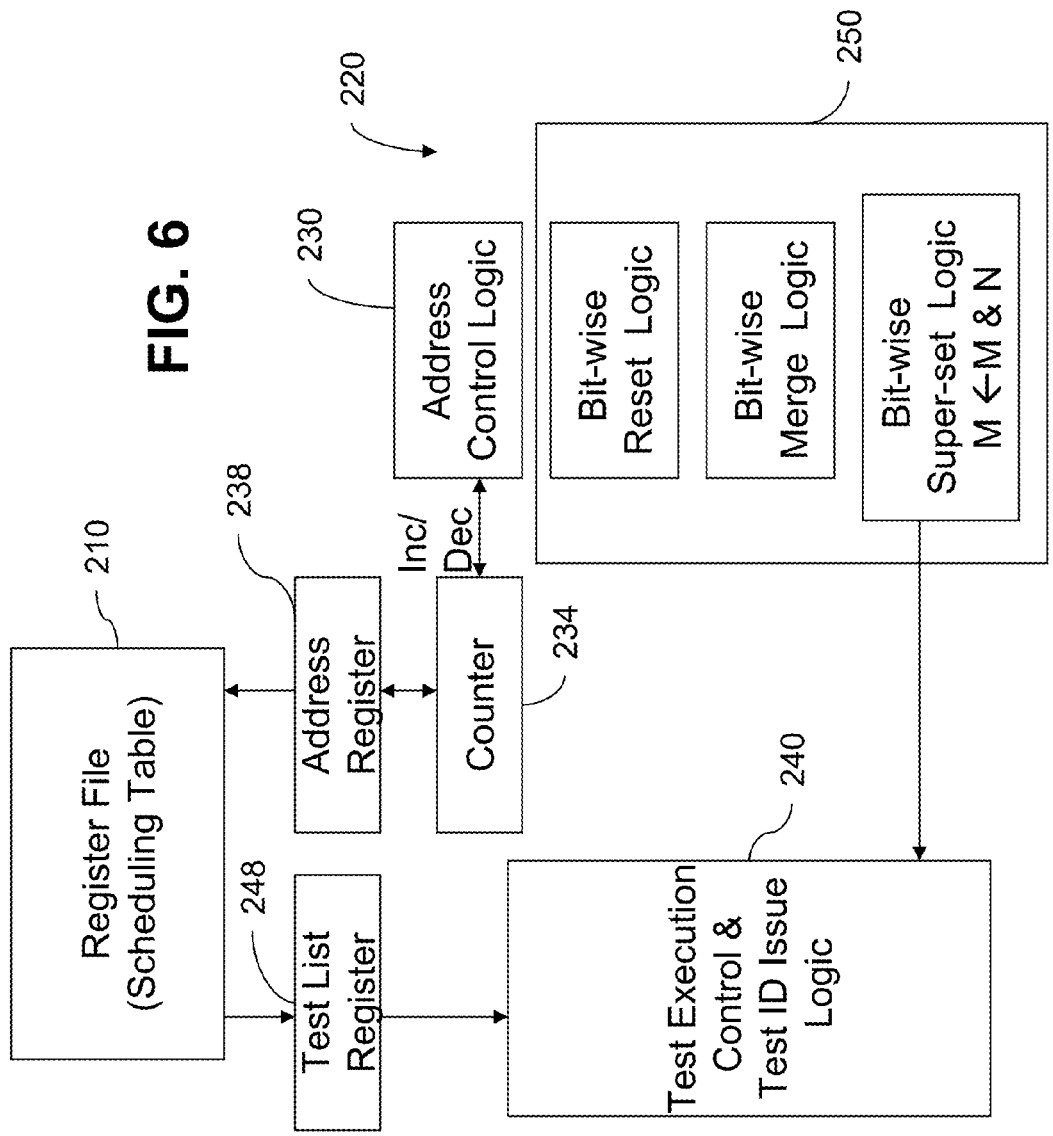
FIG. 6 is a block diagram detailing part of the hardware scheduling circuit embodiment of FIG. 5.

The scheduler operation for a hardware BIST controller is additionally discussed and illustrated in FIGS. 5-7.

In FIGS. 5-7, operations commence with Test Pointer set to first active row R1 of TABLE 1A or row C1 of Test ID Table 110, either of which is instantiated, for instance, by a register file 210 filled in by user or tester 5 with entries for one example of a Scheduling Table. TABLE 1A is simplified relative to Test ID Table 110 of FIG. 3 to simplify FIG. 7 and the introductory description. Also, TABLE 1A has values based on a particular interpretation called a Test Association Table that can be compared with values entered under an interpretation in FIG. 3 called a Test Compatibility Table. A processing example for the more extensive entries in Test ID Table 110 of FIG. 3 and TABLE 7 is then compactly shown in detail using TABLE 8 later herein.

TABLE 1A

SCHEDULING TABLE (1st EXAMPLE)
TEST ASSOCIATION TABLE R( )

|    | T1 | T2 | T3 | T4 |
|----|----|----|----|----|
| R1 | Y  | Y  | Y  |    |
| R2 | Y  | Y  |    |    |
| R3 | Y  |    | Y  | Y  |
| R4 |    |    | Y  | Y  |

In FIG. 5 and detailing in FIG. 6, a Hardware Scheduler 200 embodiment has 2Xx reference numerals with middle digits X applied for comparing with FIGS. 1-4. Hardware Scheduler 200 has a Register File 210 to hold a Scheduling Table and a Control Logic 220 coupled to a DUT 280 for executing concurrent tests on various modules of DUT 280 using the Scheduling Table in Register File 210. Control Logic 220 has Address Control Logic 230 coupled with a Next-Address Generator 234 which in turn is coupled with an Address Register 238 that itself is coupled to supply a latest address to access Register File 210. Control Logic 220 also has a Test List Control Logic 250 coupled with a Test Execution, Control and Test ID Issue Logic 240, which in turn is coupled with a Test List Register 248. Test List Register 248 is coupled to receive a latest Test List (row of Scheduling Table) access from Register File 210 in response to the address from Address Register 238.

User-filled register file 210, for a second different example analogous to TABLE 1, has five (5) tests and three (3) compatible groups as shown in TABLE 2. Notice that different Scheduling Tables can be symmetric in their entries as in TABLE 1A or asymmetric in their entries as in TABLE 2. Also, different Scheduling Tables can have equal numbers of rows and columns and thus be square as in TABLE 1, or have unequal numbers of rows and columns and thereby be rectangular as in TABLE 2.

TABLE 2

SCHEDULING TABLE (2nd EXAMPLE)

|    | T1 | T2 | T3 | T4 | T5 |
|----|----|----|----|----|----|
| C1 | Y  | Y  | Y  |    | Y  |
| C2 | Y  | Y  |    | Y  |    |
| C3 |    |    | Y  | Y  |    |

TABLE 1 and TABLE 2 thus provide examples of a format of the input provided by the user to load the Scheduling Table in Register File 210. In effect, loading of a Scheduling Table creates an electronic representation of a matrix with number of columns equal to the total number of tests and number of rows equal to the total number of different compatible test sets (groups).

FIG. 6 is further described in connection with FIG. 17 and TABLE 7 later hereinbelow.

Figure 9:
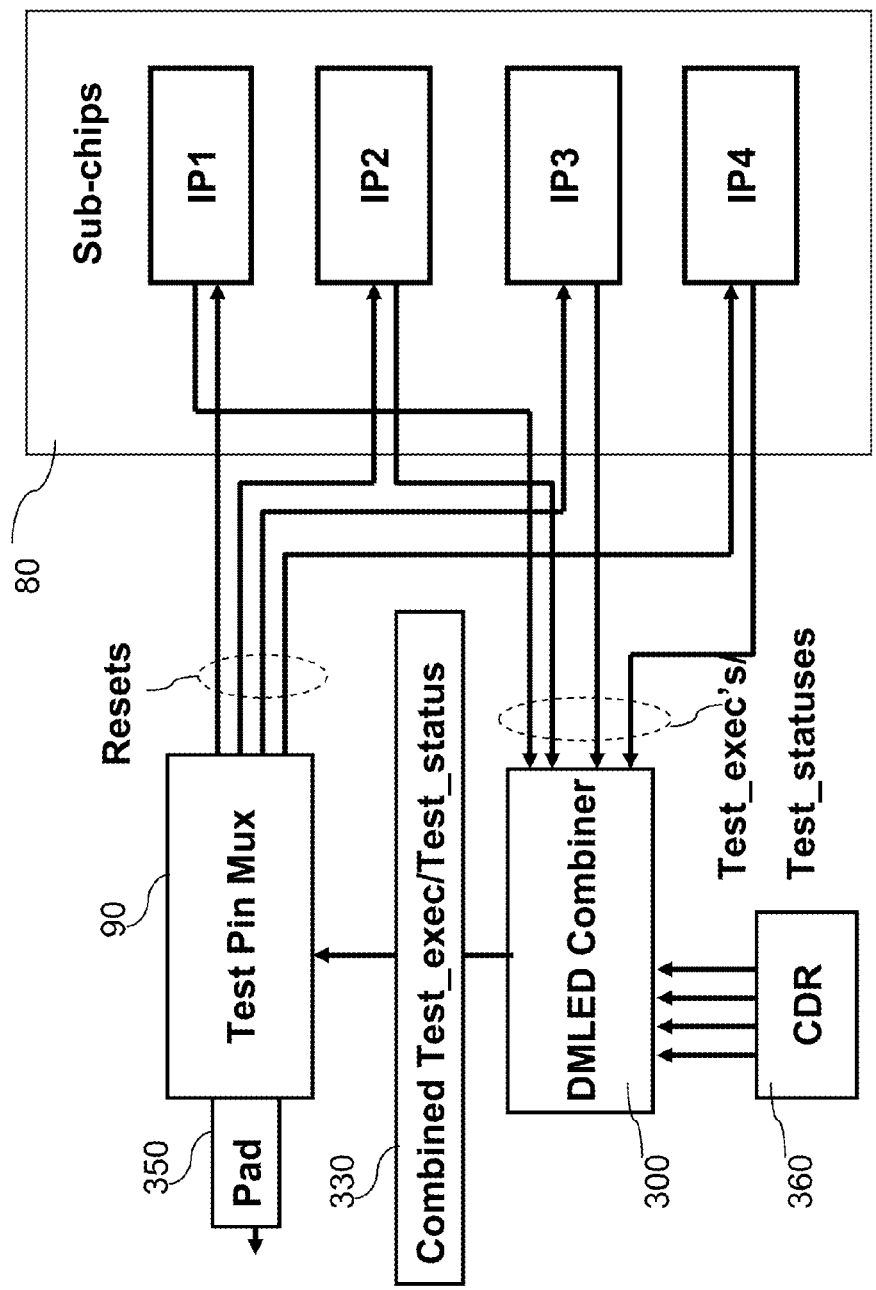
FIG. 9 is a block diagram of a device under test (DUT) embodiment that has four IP cores or sub-chips coupled as in FIG. 8 with test circuitry as described herein.

Next, FIG. 7 illustrates an operational example of the hardware 100 operation, which can result from using a decision-making process as in FIGS. 3-6 and 17 on TABLE 1A or TABLE 7 for creating a dynamic schedule to drive the IPs of FIG. 9. FIG. 7 shows a snapshot of a tree-shaped relationship of various possible sequences from which one concurrent and dynamic test execution schedule actually evolves. The economical hardware scheduler embodiment more time-efficiently executes a given schedule independent of the sum total of times required for individual tests. The schedule can be dynamically re-configured. Examples of pseudocode to dynamically schedule the narrated FIG. 7 process are provided in any of TABLES 10, 11A, and 11B, each of which is described later hereinbelow under FIG. 17.

Notice that FIG. 3 Test ID Table 110 (TABLE 7) and the distinct TABLE 1A discussed next are suitably used by two different embodiments wherein the table values represent unrelated examples. TABLE 7 is called a Test Compatibility Table herein, while TABLE 1A is called a Test Association Table herein. In TABLE 1A, tests T2 and T3 are not compatible because Row R2 does not have an entry for test T3 and Row R3 does not have an entry for Test T2. In the Test ID Table 110 in FIG. 3, tests T2 and T3 are designated to be compatible, since they are included in compatibility class C1.

The number of columns in a compatibility table like TABLE 7 (values in FIG. 3) can be different from the number of rows. If the rows indicate the Test ID associations as in TABLE 1A, however, the number of rows is equal to the number of columns by definition herein. So, if the rows indicate the compatibility classes as in TABLE 7, the number of rows is unrelated to the number of columns. In TABLE 1A the number or rows equals the number of columns, and it means that both the rows and columns contain the Test ID numbers in such a way that, in that case, the actual entries are symmetric. This is because Test N being compatible to Test M also implies that Test M is compatible to Test N.

In FIG. 7, tree-organized sequences between various nodes A to K represent possible sequences in which the schedule can be executed depending upon which tests are compatible and which tests finish earlier. A set of tables 1A-1K based on TABLE 1A are entitled in a manner corresponding to each node A-K so as to show an example of the possibilities for dynamic scheduling. Some of the tables are the same for different nodes, as indicated by their combined table titles. In FIG. 7, the execution starts at node A, see TABLE 1A. The process sets a Test Pointer (e.g., counter 234) to first active row R1. Either a pair of tests (T1, T2) or another pair of tests (T1, T3) can run in parallel. The process example chooses the first pair of tests (T1, T2) to run in parallel. Tests T1 and T2 are executed time-efficiently because they are in parallel, and then the process proceeds to FIG. 7 node B if test T1 finishes first or instead to node C if test T2 finishes first. Suppose test T1 completes first, so the process proceeds to node B. At node B and TABLE 1B, circuit and process operations in effect remove column T1 and row R1, or make them inapplicable (N/A) as in TABLE 1B. At node B, circuit and process operations advance Test Pointer to go to the next active table row (R2), see TABLE 1B; and test T2 runs to completion, whence node D is reached.

In the tree of FIG. 7, suppose instead that test T2 completed first at node A, so the process proceeds to node C instead of node B. At node C and TABLE 1C, circuit and process operations in effect remove column T2 and row R2, or make them inapplicable (N/A). The process adjusts the Test Pointer to go to the first active row, which is still R1. The pair of tests (T1, T3) run in parallel instead of T3 waiting for test T1 to complete, thus further avoiding undesirable time-consuming seriatim testing. Similarly, the execution proceeds through the subsequent steps. Tests can start and end asynchronously, and thus the on-chip scheduling is dynamic and time efficient. All control is built-in inside the scheduler 100 for true BIST.

The process is further described node by node by supposing that the process has reached such node. At node D and TABLE 1D after completing process node B, the process removes Column T2 and Row R2 and goes to the next active row R3 whereupon a pair of tests (T3, T4) run in parallel. Suppose test T3 completes first, and so the process proceeds to node G. At node G and TABLE 1G, the process in effect removes Column T3 and Row R3, and thereupon proceeds to the next active row R4. Test T4 is the only test remaining to complete, so test T4 runs to completion. However, if test T4 turned out to be the one to complete first at node D, then operations go from node D to node H. At node H and TABLE 1H, the process in effect removes Column T4 and Row R4, and proceeds to the next active row R3. There, test T3 is the only remaining test, and test T3 runs to completion.

Alternatively, suppose the process has instead reached node E because of test T1 completing before test T3 at node C. At node E and TABLE 1E, the process effectively removes the Column T1 and Row R1, see TABLE 1E, and the process proceeds to the next active row R3. Test T4 is triggered and the pair of tests (T3, T4) run in parallel. Suppose test T3 completes first, so operations move to node 'I'. At node 'I' and TABLE 1I, the process effectively removes Column T3 and Row R3, and thereupon proceeds to the next active row R4. There, test T4 is the only remaining test, and test T4 runs to completion. However, if test T4 turns out to be the one to complete first at node E, then operations go to node J. At node J and TABLE 1J, the process in effect removes Column T4 and Row R4, and proceeds to the next active row R3. There, test T3 is the only remaining test, and test T3 runs to completion.

In another alternative part of the tree of FIG. 7, suppose the process has instead reached node F because of test T3 completing first at node C. Test T1 is still running Δt node F and TABLE 1F, the process effectively removes the Column T3 and Row R3, see TABLE 1F, and the process proceeds to the first active row, still R1. Test T1 runs to completion, and operations move to node 'K'. At node 'K' and TABLE 1K, the process effectively removes Column T1 and Row R1, and thereupon proceeds to the next active row R4. There, test T4 is the only remaining test, and test T4 runs to completion.

TABLE 1B

SCHEDULING TABLE 1 AT NODE B

|    | T1  | T2  | T3  | T4  |
|----|-----|-----|-----|-----|
| R1 | N/A | N/A | N/A | N/A |
| R2 | N/A | Y   |     |     |
| R3 | N/A |     | Y   | Y   |
| R4 | N/A |     | Y   | Y   |

TABLE 1C

SCHEDULING TABLE 1 AT NODE C

|    | T1  | T2  | T3  | T4  |
|----|-----|-----|-----|-----|
| R1 | Y   | N/A | Y   |     |
| R2 | N/A | N/A | N/A | N/A |
| R3 | Y   | N/A | Y   | Y   |
| R4 |     | N/A | Y   | Y   |

TABLE 1D/1E

SCHEDULING TABLE 1 AT NODE 'D' OR 'E'

|    | T1  | T2  | T3  | T4  |
|----|-----|-----|-----|-----|
| R1 | N/A | N/A | N/A | N/A |
| R2 | N/A | N/A | N/A | N/A |
| R3 | N/A | N/A | Y   | Y   |
| R4 | N/A | N/A | Y   | Y   |

TABLE 1F

SCHEDULING TABLE 1 AT NODE 'F'

|    | T1  | T2  | T3  | T4  |
|----|-----|-----|-----|-----|
| R1 | Y   | N/A | N/A |     |
| R2 | N/A | N/A | N/A | N/A |
| R3 | N/A | N/A | N/A | N/A |
| R4 |     | N/A | N/A | Y   |

TABLE 1G/1I/1K

SCHEDULING TABLE 1 AT NODE 'G' OR 'I' OR 'K'

|    | T1  | T2  | T3  | T4  |
|----|-----|-----|-----|-----|
| R1 | N/A | N/A | N/A | N/A |
| R2 | N/A | N/A | N/A | N/A |
| R3 | N/A | N/A | N/A | N/A |
| R4 | N/A | N/A | N/A | Y   |

TABLE 1H/1J

SCHEDULING TABLE 1 AT NODE 'H' OR 'J'

|    | T1  | T2  | T3  | T4  |
|----|-----|-----|-----|-----|
| R1 | N/A | N/A | N/A | N/A |
| R2 | N/A | N/A | N/A | N/A |
| R3 | N/A | N/A | Y   | N/A |
| R4 | N/A | N/A | N/A | N/A |

The hardware scheduler permits co-existence studies without generating new TDL scripts, and is at least applicable to all RF SOCs with more than one radio module. A sample set of concurrent TDLs can be generated and validated, and aligned with product engineering group on silicon test. FIG. 7 thus illustrates a forking of tests in the sense of dynamically organizing them according to an hierarchical tree-shaped process. The lettered nodes in FIG. 7 are thus organized in a forked, tree form. Each different row or column of N/A cells in the corresponding TABLES 1A-1K represents those rows and columns that have been removed from eligibility, up to that point in time, for determining a next test or set of tests that are to be executed. Incrementing the Test Pointer (row index j) in effect removes a row from eligibility (i.e., makes all the cells N/A in that row j). Each time the row index j is incremented, columns are also removed or made inapplicable (N/A) for all tests i that have completed execution. Some embodiments, as discussed later hereinbelow for FIG. 17, accomplish this by ANDing the latest row vector, e.g. C(j) or R(j), by '& !Tn' for all tests Tn that have completed execution.

In FIG. 7, the hierarchical tree-shaped process is shown without extensive legends and even more explicitly in tree form to emphasize the forking in the legended forking of tests in FIG. 7. Possible sequences in FIG. 7 are whichever of sequences ABDG, ABDH, ACEI, ACEJ, or ACFK is selected by the dynamic scheduler depending on which tests are compatible as indicated by the entries in TABLE 1 and depending on which tests finish earlier than others. Notice that each single node-letter like "A" in a sequence refers to a whole row to which the Test Pointer points in TABLE 1 and thus can issue concurrent tests appropriate to its moment in the process. The tree arises from the conditional outcomes of the looping process of FIG. 17 as more fully described there. Notice that the process of FIG. 17 operates on whatever table like TABLE 1A or TABLE 2, or otherwise is presented, and the particular schedule of tests that results is determined on-the-fly.

The scheduling control process of FIG. 17 is implemented in the hardware scheduler 140. The hardware scheduler 140 executes one trace based on the order of the Compatibility Classes in the Test ID Table and the actual durations of the tests that determine which test ends first. The hardware scheduler 140 does not execute all the conceivable traces represented by FIG. 7, since FIG. 7 represents a tree of many scheduling possibilities based on the tabulated compatibility classes but without knowledge of which test might end first for purposes of any given decision point.

Figure 8:
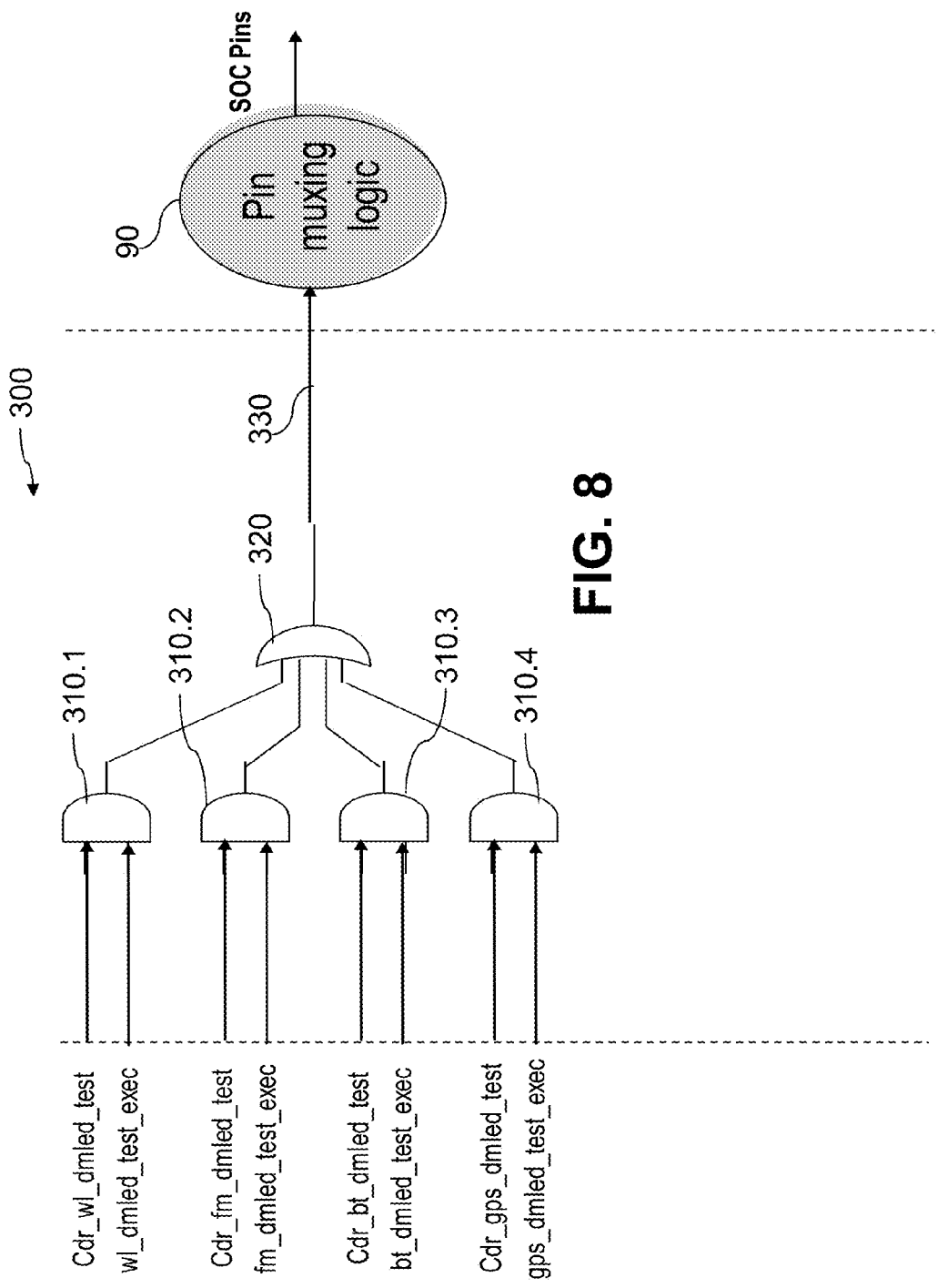
FIG. 8 is a partially-schematic, partially-block diagram of a combiner circuit to combine test signals from different cores in embodiments of FIG. 1 or FIG. 9.

In FIG. 8, a combiner circuit embodiment 300 supports a DMLED circuit by providing an economical interface for many tests and signals. Combiner circuit 300 has AND gates 310.1-310.4 that each receive a pair of signal lines—a respective qualifying or masking line Cdr_XX_dmled_test from a Core Data Register 360 of FIG. 9, and a corresponding line XX_dmled_test_exec that when active represents completion of execution of a test in a given IP core of FIG. 9. The placeholder symbolism XX represents wl: IP1 (WLAN), fm: IP2 (FM radio), bt: IP3 (Bluetooth), gps: IP4 (GPS satellite positioning receiver). A multi-input OR gate 320 is fed with the output from each of the AND gates 310.1-310.4. OR gate 320 output is coupled to the pin muxing logic 90 of FIGS. 2 and 9.

In FIG. 9, SOC 80 is fed from test pin mux circuit 90 with respective processor core Reset lines for the cores or sub-chips IP1-IP4 of SOC 80. A pad 350 carries signals to or from test pin mux circuit 90. Respective core test execute (completion) and test status lines convey their signals from the sub-chips IP1-IP4 to the DMLED Combiner 300 as detailed in FIG. 8. DMLED Combiner 300 supplies a combined output 330 representing the various test executes (completions) and test statuses from the various cores IP1-IP4, all as qualified or masked by test enable lines from CDR 360.

In FIGS. 8 and 9, one SOC level test interface is sufficient and confers economy of structure in a SOC embodiment. TEST_EXEC and TEST_STATUS output signals from the different IPs are combined into a device pin 350. These output signals are also registered and contents can be read out to obtain IP-specific status. Tests running concurrently in different IPs (IP1-IP4) can result in co-existence issues. A list of compatible test cases (see, e.g., FIG. 14) is identified herein to eliminate false fails.

In FIG. 10, a process embodiment 400 for Test Sequencing has overlapping load and execute as in FIG. 12. Simultaneous execution commences once loading is done for all IPs for which tests are triggered. Pass and fail status results of the testing are observed at step 470 at the end. In FIG. 10, software-based serialized and/or concurrent RF testing involves functional tests on RF IP of FIG. 9. The tests are executed through DMLED (Direct Memory Load-Execute-Dump) operation controlled through ATE. Tests are loaded and results observed through DMLED interface 10 of FIGS. 1, 2, 9. Tests are executed on an embedded host processor on-chip that communicates with internal memory. Process steps or components of RF tests in FIG. 10 include:

0) Wafer/dice fabrication 410.
1) Initialization 415 (power-up, E-Fuse shift, PLL lock for all IPs in parallel, ROM/RAM boot up 420 for all IPs for which tests are triggered by controller 100).
2) Firmware (FW) download+execution time. FW code is loaded sequentially into each IP at step 430. Once code download is complete, the processor reset is lifted in FIG. 9 and execution starts at step 440 in FIG. 10.
3) The FIG. 9 multiple radios on a single chip at decision step 450 have some or even all of them tested concurrently herein. Such process and structure embodiments provide capability to initiate new test download into another IP when earlier test is being executed in one IP. Level of concurrency depends upon L-E-D duration (for Load-Execute-Dump).

The process in FIG. 10 introduces a given one or more tests as soon as compatibility (e.g. TABLE 1A) and test completions detected by controller 100 permit so that the process in controller 100 dynamically schedules, triggers and thus packs the tests together with as much parallelism and time-efficiency as the table permits. Triggering is suitably in response to a trigger register NWT 152 in logic 150 of FIGS. 3 and 3A, where e.g., 10100 means to trigger tests T1 and T3 (i=1, i=3) or 00010 means to trigger test T4 (i=4). Each bit position of NWT 152 represents a Test ID, and a Test ID=1 at that bit position qualifies the circuitry 180 distributed in the individual IP cores of FIG. 9 so that the test can be performed if otherwise permitted to the given IP core by a configuration register such as CDR 360. In FIG. 10, the dynamic scheduling is diagrammatically represented by a loop on triggered values of index i from a decision step 455 via increment step 460 back to step 430 in FIG. 10. Compare this with the description and pseudocode for FIG. 17 that describes a set-based looping process in still further detail. FIG. 17 step 550 triggers one or more tests and can use the process of FIG. 10 to load and execute the thus-triggered tests. As the tests are completed, Pass-fail status 470 for each of the tests is output as in FIGS. 8-9. The SOC chip 80 is suitably passed to delivery 472, subjected to a software or hardware remediation process 474, or scrapped 476, depending on the test results.

Figure 11:
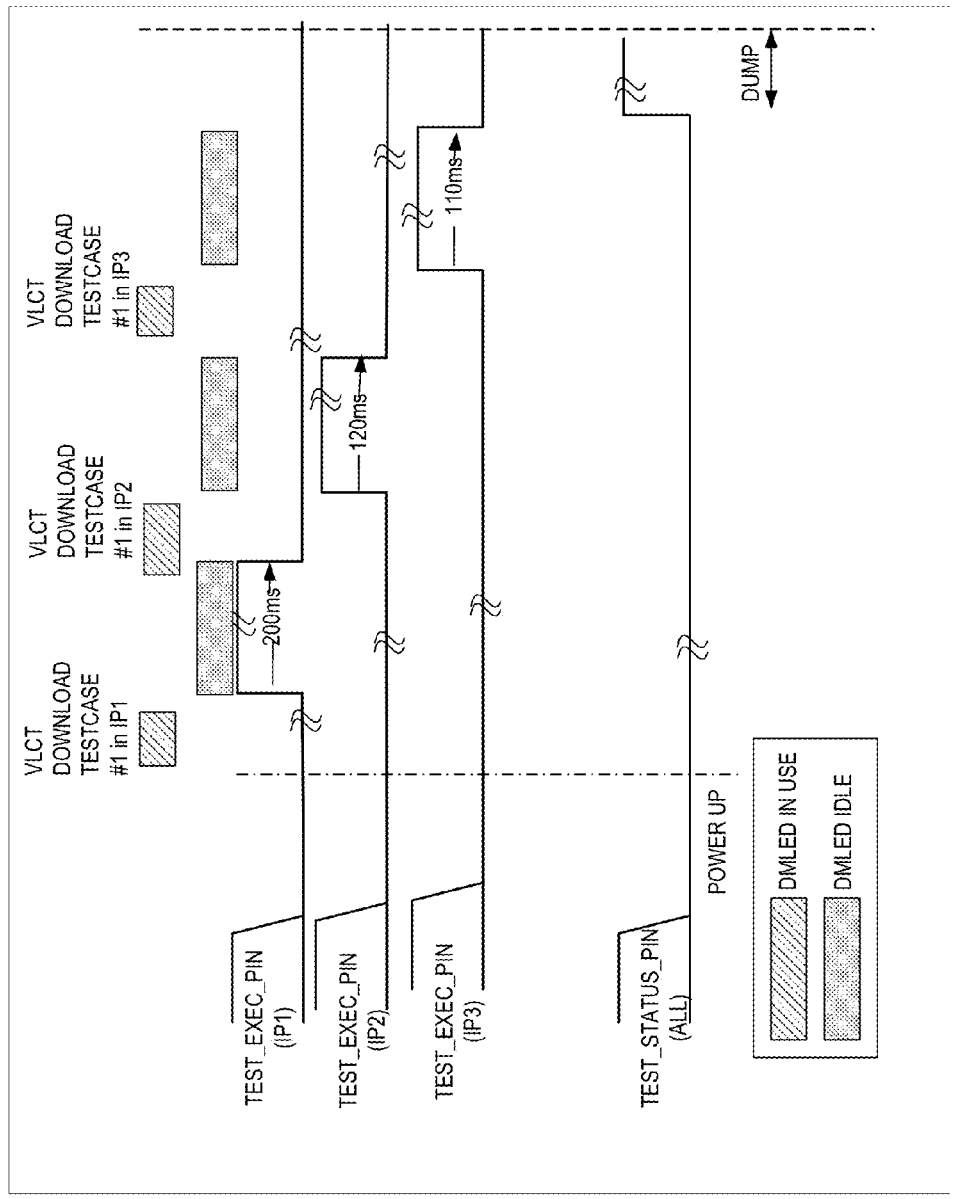
FIG. 11 is a waveform timing diagram of serially executed tests according to a conventional process that undesirably consumes test time.
Figure 12:
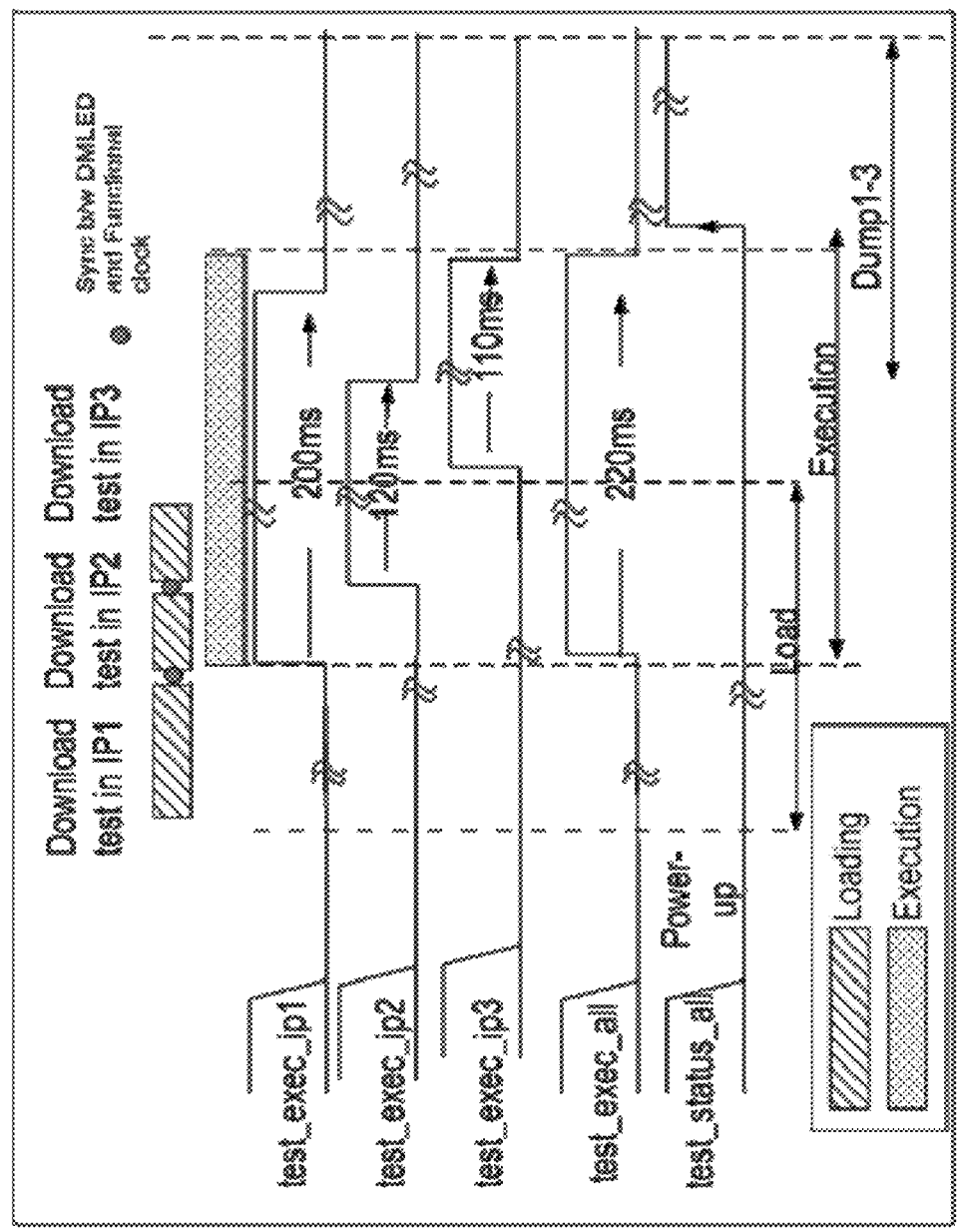
FIG. 12 is a waveform timing diagram of parallel-executed tests according to a dynamically scheduled process embodiment that reduces test time compared to that of FIG. 11.

FIG. 11 depicts various phases of operation of a DMLED test and how the conventional serial operation of FIG. 11 is performed. FIG. 11 illustrates serial testing of multiple IPs across a same or shared interface. Test cases are executed sequentially. The device test time is greater than or equal to sum total of individual IP test times. Such extended time is recognized as undesirably inefficient herein.

FIG. 12 shows waveforms for a process embodiment that provides parallel operations that are performed instead of those of FIG. 11. FIG. 12 illustrates parallel testing of multiple IPs across a same or shared interface of FIG. 9. Notice that the same initialization preamble is used for all the IPs, before the execution is permitted to start. The test-case DMLED Load operation of download is serial, for example, legended in FIG. 12 as Download test in IP1, IP2, IP3. Execution and power-up/loading are suitably carried out in parallel, as illustrated by overlapping, different-length pulses of width 200 ms, 120 ms, 110 ms. Comparing FIG. 12 with FIG. 8, the signals test_exec_ip1, 2, 3 generally correspond with the signals XX_dmled_test_exec of FIG. 8 that when active represent completion of execution of a test in a given IP core of FIG. 9. Also notice the 220 ms-wide signal test_exec_all of FIG. 12 generally corresponds with the execution status signal on the output line 330 of FIG. 8. Further flip-flop logic for FIG. 12 signal test_status_all, is reset on power up and toggled active on the trailing edge of signal test_exec_all. A DMLED Dump operation is activated immediately on the earliest trailing edge of any test completion, in this case test_exec_ip2, and Dump or upload to tester 5 proceeds until the results of the tests on all the IP's have been dumped.

Figure 13:
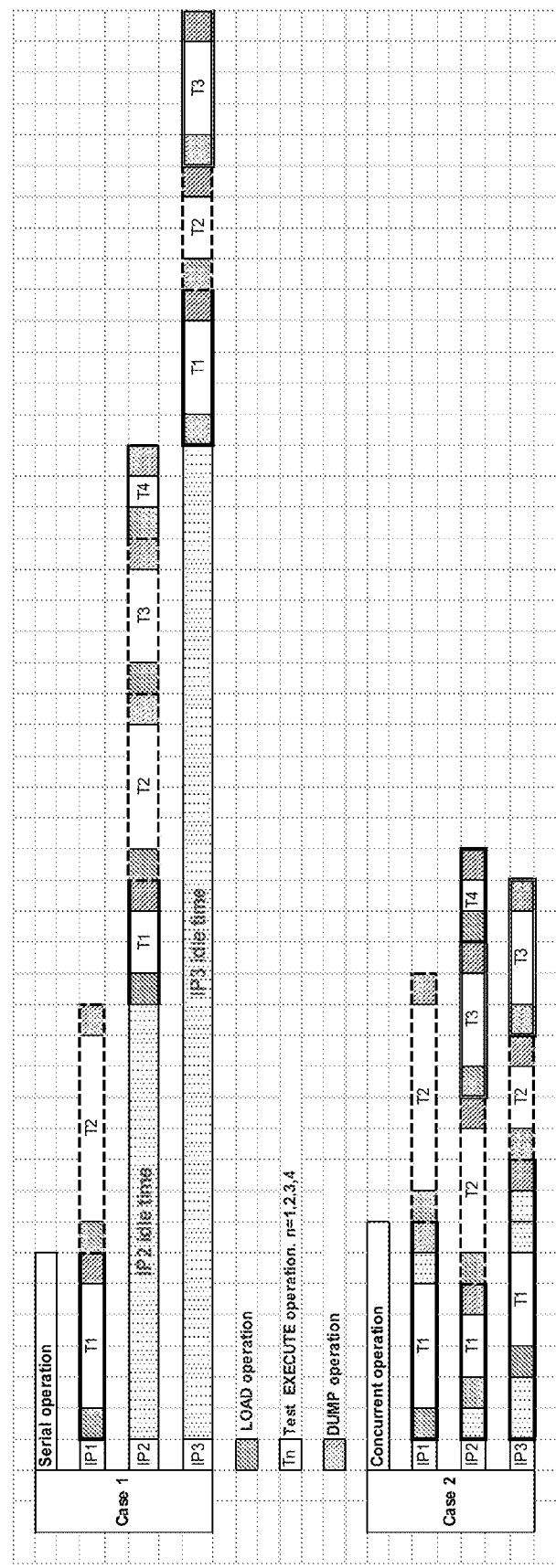
FIG. 13 is a pair of timing-bar diagrams comparatively showing conventional serially executed tests of Case 1 consuming test time compared to parallel-executed tests of Case 2 according to a dynamically scheduled process embodiment that reduces test time.

In its operation in a SOC, the scheduler 140 (e.g., state machine FSM) operates in FIG. 12 and Case 2 of FIG. 13 to perform the Load operations for each test in the first compatibility class one after the other. Scheduler 140 is also suitably arranged to respond to the test completion signals so that as soon as all the tests in a compatibility class are launched, then Dump is initiated for the first test to complete, and the Load operation is initiated when the first test in the next compatibility class is triggered. Such Dump occurs between steps 450 and 470 in FIG. 10 and is shown at step 590 of FIG. 17. Dumps from test(s) in one compatibility class and Loads for test(s) in the next compatibility class are interspersed for efficiently high usage of a serial line between SOC 80 and tester 5.

Some embodiments provide Software BIST-based concurrent test of RF cores (IPs). Design considerations (interfaces, test control operation) are described. In one complex SOC embodiment, four radio modules are to successfully co-exist. Concurrent test accommodates high levels of multi-site test with a low-cost tester platform, expected to result in an about 50% reduction in test time.

Figure 19:
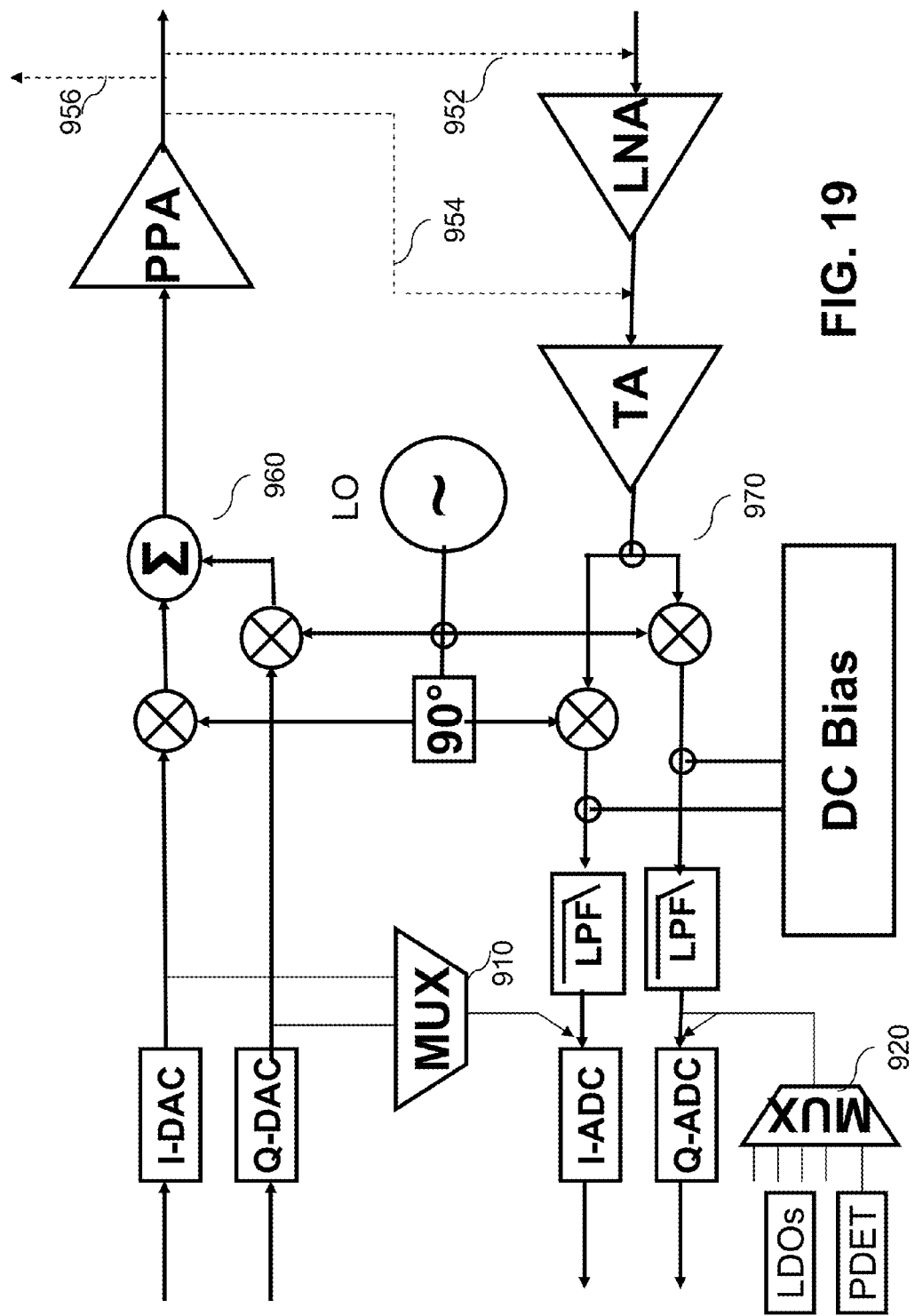
FIG. 19 is a block diagram of a radio transmitter and receiver circuit for a given core of FIG. 1 and FIG. 9, showing testability circuits and different forms of RF loop back.

Design and test considerations for an embodiment for parallel execution herein may include: 1) providing ability to allocate transmit/receive channels in loop-back modes of FIGS. 1, 9 and 19 within and across RF modules (see dotted lines 952, 954, 956 from power amplifier, PPA in FIG. 19). 2) checking for frequency and power level compatibility. 3) supporting loop-back either internally to the die or externally on the board. 4) providing additional amplifiers and attenuators in some cases. If additional CW (continuous wave) sources from tester 5 are used with desired strength, concurrency may be impeded. A common interface across all IPs is desirable and provided on chip instead herein.

Test grouping of compatible tests is discussed next. Test groups are formed as follows:
RX tests with external CW source.
RX tests with internal signals.
RX tests with external loop-back for compatible test.
TX tests with external measurement support on board/tester 5.
TX internal loop-back tests—No signal outside IP boundary.
Examples include: DCO (Digital Crystal Oscillator) tests, LDO (low dropout regulator) tests, TX-DAC (Transmitter Digital to Analog Converter) and PPA pre-power amplifier tests. RX tests which uses same frequency CW (continuous wave, a single tone on-off) source are also clubbed or test-grouped for running concurrently. Additionally, RX tests can also be run concurrently since interference is low between the radios when tested on receive.

FIG. 13 comparatively illustrates conventional sequential operation (Case 1) and advantageous parallel operation (Case 2) of an embodiment with specific tests T1, T2, T3, T4. For purposes of FIG. 13, the different Test IDs are understood as
IP1_T1, IP1_T2;
IP2_T1, IP2_T2, IP2_T3, IP2_T4;
IP3_T1, IP3_T2, IP3_T3.
In other words, tests IP1_T1, IP2_T1, IP3_T1 are different tests adapted for different cores, even though they might in some cases be somewhat analogous in their test objectives.

Note how the time-extended serial schedule in Case 1 of FIG. 13 is converted to a much more compact and time-efficient parallel schedule in Case 2. Different directions of crosshatching are applied to time intervals for Load and for Dump that respectively bound the test-legended intervals of Execute operation in FIG. 13. Different bars for the different enumerated IP cores depict their serial (Case 1) or desirably parallel (Case 2) operations over time In FIG. 14, compatible tests are shown. As an illustration, this analysis has been performed on devices with BT, FM, GPS and WLAN radio modules. Criteria of test compatibility can specify that tests are compatible if: 1) Frequencies across TX and RX channels match. 2) Different RF modules can be clocked together. 3) Device can supply power for concurrent execution. 4) Tester can provide source and measurement support for desired level of multi-site testing.

FIG. 14 illustrates an example of possible parallelism amongst compatible tests for an SOC with four radio IPs. Tests are grouped in compatibility classes approximately column-wise. Compatible tests can be run in parallel. Incompatible tests are run serially, i.e. those tests which cannot be run concurrently for different reasons, namely, requiring the same set of tester 5 resources, causing co-existence or coupling between the different RF modules, etc.

The illustration in FIG. 14 is one schedule; while a compatibility table like Test ID Table 110 of FIG. 3 or test association table like TABLE 1A implies various possible schedules depending on the order in which tests complete and are initiated on a dynamic basis. The hardware scheduler 140 need not guarantee the generation of an optimal schedule to provide quite substantial and desirable test time reductions, but see description of FIG. 23 for an optimization process embodiment. The hardware scheduler 140 automates the scheduling process in hardware given a user supplied Test ID Table 110 in FIG. 3. Also the tests within an IP core in FIG. 14 need not all be compatible, such as when only one test can run on an IP at a given time.

In FIG. 14, the tabular example (reading generally time-wise from left to right) results from a process that first identifies and establishes parallelism of tests across Rx (receiver chain) to reduce receiver chain test time. Then the process identifies and establishes parallelism across Tx (transmitter chain) to reduce transmitter chain test time. Thereafter, concurrency amongst internal tests (e.g. PLL, DAC) is identified and established. The hardware scheduler can deliver the tests in the manner shown in FIG. 14 given a particular ordering of the compatibility classes in a Test Id Table 110. Accordingly, suppose a table such as that of FIG. 14 is arrived at manually, or by off-line optimization is described elsewhere herein, or otherwise prior to operation of the scheduler 140. Then the scheduler can be made or forced as in FIG. 24 to deliver tests in the manner represented by such table as of FIG. 14 by generating and delivering the appropriate particular ordering of the compatibility classes in a Test ID Table 110.

FIG. 14 illustrates a parallel test schedule across four IP modules for WLAN, BT, FM, and GPS. Explanations for tests in FIG. 14 are listed next. The reader parses the lettered-designations of different tests with the help of the list here to best understand FIG. 14.

WR: WLAN tests which are independent of external input and do not send any data out of the IP. These tests are treated as WLAN RX tests. Tests with internal loop-back are also treated under this category.

BT: BT tests which are independent of external input and do not send any data out of the IP. These tests can run in parallel with WLAN and FM in RX mode.

FM: FM tests which are independent of external input and do not send any data out of the IP. There is no effect on these tests. If BT and WLAN are being tested in TX mode, i.e. these tests can run in parallel with BT and WLAN RX tests. (These tests have internal loop back and this distinguishes them from FMRX and FMTX tests).

WTX: WLAN tests which are in transmit mode. These tests transmit signals outside the SoC.

WTXRX: WLAN tests in transmit and receive modes. They transmit signals outside the SoC and there is loop back in receive path through wired connection. The direct feed in RX input reduces the risk of co-existence and inter-IP interference issues.

BTWR: BT RX tests. These BT tests can be run only when WLAN is in RX mode. Any WLAN tests in TX mode will affect the result of the tests.

T_BTWR: TX tests of BT which can affect WLAN RX tests. So while running these tests, WLAN should not be in RX mode. However, WTXRX tests can be run in parallel because they use wired loop-back connection.

G: GPS specific tests. These tests are receive path specific. Hence they can be run when all other IPs are in receive mode. G7 is DAC test and can be scheduled with any other IP tests. Hence it can be separated out.

FMRX: FM tests in receive mode. The results of these tests are affected if these tests run in parallel with BT/WLAN in TX mode.

FMTX: FM tests in transmit mode. These tests can run in parallel with other IP tests in TX mode.

Figure 15:
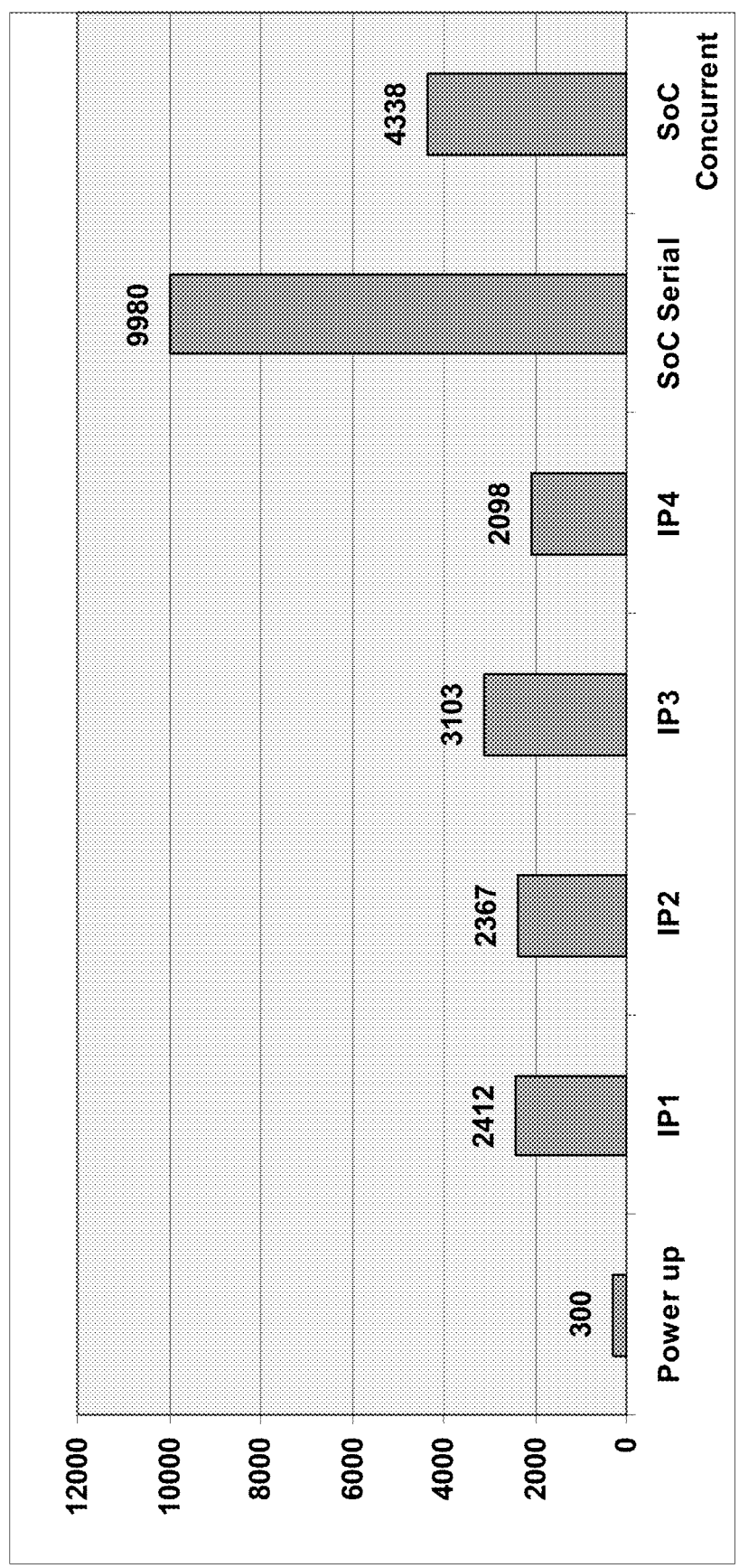
FIG. 15 is a histogram of execution times for various processes in FIG. 9, along with total-time bars for serially and concurrently scheduled tests.
Figure 16:
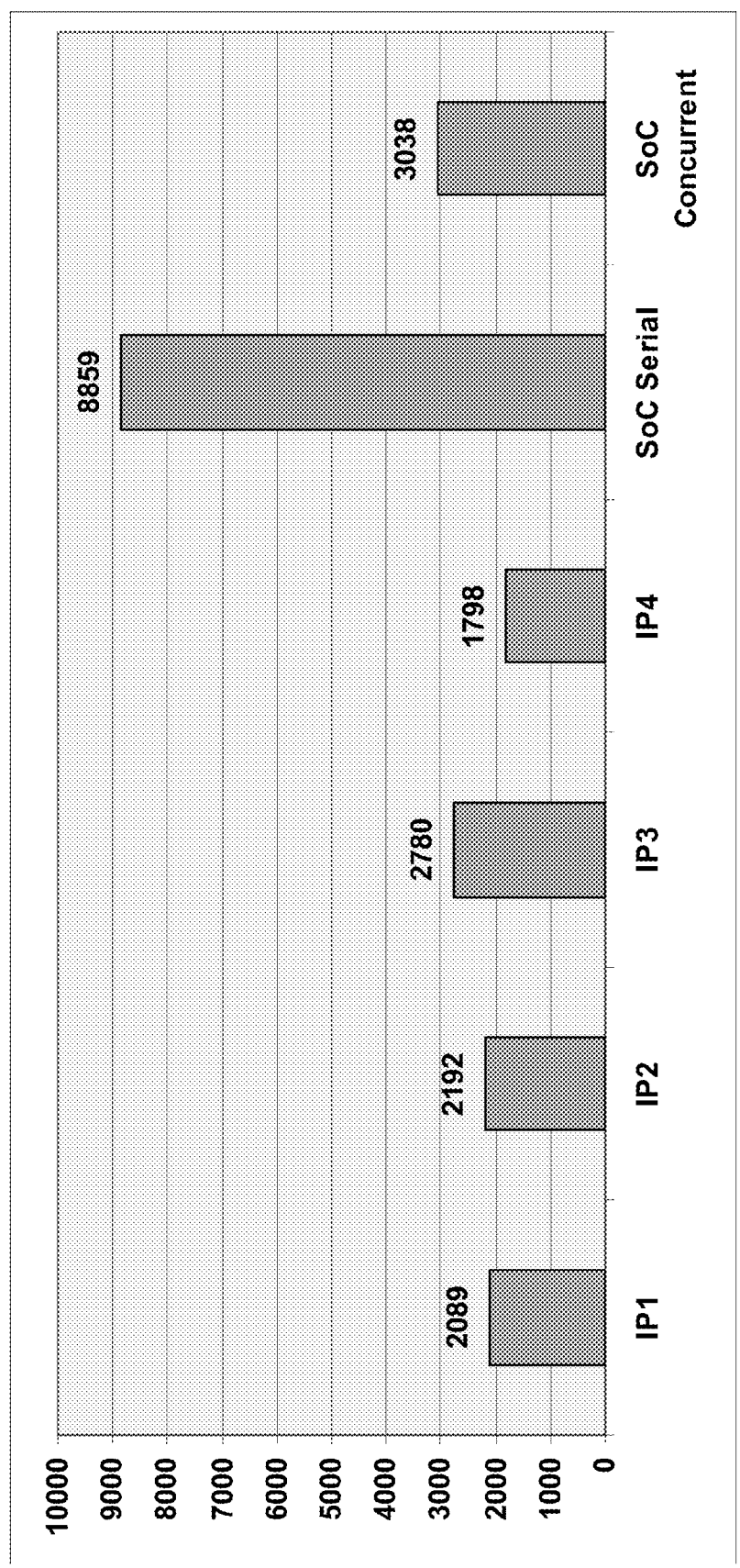
FIG. 16 is another histogram of execution times for various processes in FIG. 9, along with total-time bars for serially and concurrently scheduled tests.

FIG. 15 and FIG. 16 show Test Time Estimations. Test time calculation examples based on FIG. 15 follow. In serial mode, the test time mentioned for each IP, which includes power-up time, is =2367+3103+2412+2098=9980 milliseconds.

In concurrent mode, the SoC power-up corresponding to 300 ms will occur only once. IP tests running in parallel, i.e. time for TDL1 (T2.i ms)+time for TDL2 (T3.i ms)+time for TDL3 (T4.i ms) which is =300+1055+1137+846=3338 milliseconds. (Note: The legends like T2.i represent designations of test time variables in milliseconds, not decimal milliseconds.) Additional scheduling overhead of 1000 milliseconds is taken into account to avoid inter-IP RF interference in WTXRX tests. The total time in concurrent mode therefore =3338+1000=4338 milliseconds.

Overall, the saving is 9980−4338=5642 milliseconds, which is around 56%.

FIG. 15 is a bar chart of the test time savings statistics for the concurrent tests shown in FIG. 14, and shows the test time savings (4338 vs. 9980) for tested SOC with four radio IPs—WLAN, BT, FM, and GPS. In a test composition framework as in FIG. 14 herein, compatible tests are grouped together, and different sequences of test cases can alter these groups. Incompatible tests lie in different groups, and incompatibility may be due to different initialization, different resources, co-existence, etc. Test time varies based on combinations of these groups. Automated embodiments for test grouping and scheduling are shown herein. Test composition framework automation embodiments to automatically compose tests inside a group, are suitably provided herein to allow for different test case combinations to be included, excluded, and/or sequenced to minimize test time and create final production test package(s).

In FIG. 15, a single power-up sequence (300 ms) is provided across all IPs for concurrent test operation. Individual IP specific power-up is considered for serial operation and the power-up time is included inside the IP test time. For the purpose of illustration, this component (as well as the component of scheduling overhead of 1000 ms) is removed in FIG. 16. Here both the serial and concurrent test times are lower than those in FIG. 15. This difference also highlights the usefulness of embodiments herein that provide circuitry to support a comprehensive power-up mode to realize the benefits of test concurrency across different IPs.

In FIGS. 15 and 16, Total Test Time (height of each histogram bar) is the sum of Initialization time+test time of longest test case (within concurrent set)+test time for non-compatible test cases. A test time reduction of over half or over 50% is projected in the case of a SOC embodiment with four internal radio IPs. This concurrency process can also be used for burn-in test of all IPs for maximum stress and test time reduction. (The example numbers are indicative of the benefits. The actual test times will vary based on composition of IPs, types of tests, and specific implementation for DFT and concurrent testing).

In FIG. 17, an embodiment of process of control operation for FIGS. 3-6 is shown. FIG. 17 is also suitably used to prepare hardware design code that then is used by a tool to generate circuits for FIGS. 3-6. FIG. 5 Test List Control Logic 150 operations 500 in FIG. 17 are listed as follows:

Modify test list to reset bit corresponding to completed test. (590)

Fetch new test list (530)

If new test list is super-set (540) of present test list, merge test lists to trigger new tests (550). (Existing tests will continue.)

If new test list is not a super-set of present test list, discard new test list. Continue with existing tests in present test list in step 560.

Wait (580) for another test to complete and repeat steps.

FIG. 5 Address control logic 130, 234, 238 operations in FIG. 17:

Upon completion of one test, increment address (520).
Obtain next test list (530).
If compatible, merge with existing test list (at step 550, test list updating logic 150).
If not, decrement address (570). (Point to same test list).

Narratively, in the flow diagram of FIG. 17, operations commence with a BEGIN 510 with a test list, such as the one in TABLE 1A or Test ID Table 110. A row address variable j is initialized to zero, and present test list PT is initialized to empty (or all zeroes depending on manner of electronic representation). A number Jmax is loaded with the number of Table rows representing non-null compatibility classes. The row address j is incremented at a step 520. A step 530 fetches a next test list NT to which the Test Pointer or row address thus incremented currently points. Test list NT is analogous to a compatibility class C(j), i.e. all tests compatible with test T#=j, or as specified in a row j of TABLE 1A. Step 530 resets NT to empty (all zeroes) if j>Jmax, which may occur in a later loop through the process.

A decision step 540 determines whether test list NT is a superset (includes at least all the elements, if any) of the currently existing present test list PT that is also called the modified test list. Put another way, let test list NT have ones and zeros representing whether each test is in the list or not; and same format for test list PT. If Test list NT at least has ones wherever PT has ones or if PT is null, then NT is a superset of PT. In set notation, if NT∩PT)=PT, then NT is a superset of PT. If Yes at step 540, operations proceed to a step 550 that identifies any new tests NT&!PT (i.e., NT AND NOT PT), merges test lists NT and PT, and triggers any new tests thus identified. Notice that since merger of test lists depends on NT being a superset of PT in step 540, the merger of test lists is the same as the set NT itself, so some embodiments have a simpler code PT=NT instead of explicit merger code PT=NT U PT. Steps 520-550 operate analogous to making a previous table row inapplicable (or over-writing "N/A" entries into a row) in an earlier-hereinabove described particular table among TABLEs 1A-1K. Existing tests in progress are continued. On the other hand, if No at decision step 540, operations instead branch to a step 560 that continues executing existing tests in progress. Moreover, after step 560, a step 570 decrements the address (j=j−1) to restore the value of the address as it was just prior to incrementing step 520, analogous to staying at a particular table row j.

Further in FIG. 17, after either of steps 550 or 570, operations go to a decision step 580 that determines whether any of the tests now in progress is newly completed. If not, operations branch back to step 580 itself until a test is completed whereupon the operations proceed to a step 590. Step 590 resets an n-th bit Tn in test list PT, and resets the bit Tn for that n-th test in all the compatibility classes C(j), thereby electronically representing that the test is completed. This step 590 is analogous to making an n-th column inapplicable (or over-writing "N/A" entries into a column) in an earlier-hereinabove described particular table among TABLEs 1A-1K, and prevents triggering the same test possibly again on a subsequent pass through step 550. (Some embodiments, however, may omit such resets in compatibility classes for which it is actually intended to repeat a particular type of test.) Some embodiments accomplish the step 590 resets by ANDing the latest row vector C(j) by '& !Tn' for all tests Tn that have completed execution. Step 590 also initiates a Dump of test results from the just-completed Test Tn. From step 590, operations go to a decision step 595 that determines whether all the tests are Done as indicated by both NT=0 and PT=0 (both all zeroes). If not Done at step 595 (No), operations loop back to step 520 that increments the address j. Otherwise, if Done (Yes) at step 595, then operations are completed and reach a RETURN 599. See also pseudocode of TABLE 3 below.

For FIGS. 3-7, Test Execution Control and Test ID Issue Logic 140 (240) in some embodiments is represented by the following hardware design pseudocode and/or operational steps enumerated in the legends of FIG. 3 and listed below. Below, NT means new test list. PT refers to the present test list in the operations of FIG. 17. Test Tn means a particular test that is a member of (one of) the set of tests NT. Note that pseudocode can be used to prepare various embodiments such as in hardware by interpreting the pseudocode as representing hardware design code, or such as in firmware by interpreting the pseudocode as representing a program listing, or otherwise in an appropriate manner for preparing embodiments.

The symbol Φ signifies Null Set. The symbol U signifies set union, bit-wise logical ORing of test lists, or merging test lists. The symbol ∩ signifies set intersection, or bit-wise logical ANDing (&) of test lists. (The symbols ∩ and & are essentially equivalent as used here, even as they have slightly different connotations from set theory and Boolean logic.) The symbol "!" signifies the logical complement, NOT. The symbol "=" signifies equality in a truth evaluation such as a conditional argument, and otherwise "=" signifies replacement (←) to the left from the right. A maximum row number is designated Jmax. Let the address index be j. See pseudocode of TABLE 3 below for introduction to the more detailed form of the pseudocode of FIG. 4 for an embodiment.

TABLE 3

DYNAMIC SCHEDULING PSEUDOCODE, FIGS. 3-4

1. Initialise: Address = 0. PT = Φ. NT = Φ.
2. If (Address > Jmax), Stop.
3. NT = NT U PT.       // Merge NT and PT.
4. IF (NT ∩ PT) ≠ PT, //Decide if NT is NOT a superset of PT.
5. THEN NT = PT. Decrement (Address).
6. Increment (Address).
7. Execute tests in NT.
8. If test Tn is complete, set Tn = 0 in PT.
9. Go to Step 2.

A somewhat more detailed form of the pseudocode of FIG. 3 for an embodiment is listed in TABLE 4 below. The symbolism

!Tn represents a bit field having bit positions corresponding to each of the tests, and each respective bit being zero (0) if its test has completed and otherwise one (1) if its test is still in progress or has not yet been triggered. Multiplication by

!Tn effectively makes respective columns inapplicable (N/A) for the completed tests.

TABLE 4

DYNAMIC SCHEDULING PSEUDOCODE (DETAIL)

1. Initialise: $j = 1$. $PT = \Phi$. Set Jmax. $\bigcap_n !Tn = $ '11111'    // all ones.

2. If $(j > Jmax)$, Stop.
   //Access $C(j)$ in Test ID Table 110.

3A. $NT = C(j) \ \& \ \bigcap_n !Tn$,    for all tests Tn that have completed, if any.

3B. $PT1 = NT \cup PT$.    // Merge NT and PT.
4.  IF $(NT \cap PT) \neq PT$,    //Decide if NT is NOT a superset of PT.
5A. THEN $NT = PT$; $j = j - 1$    // Decrement (Address).
6A. ELSE $NT = PT1$, $PT = NT$.
6B. $j=j+1$    //Increment (Address).
7.  $NWT = NT$    //Load/Execute tests in NT. See FIG. 10.

8. IF $\bigcap_n !Tn = \Phi$, THEN Go to Step 2,

ELSE When a test Tn is complete, Dump, Set $Tn = 0$ in PT and in $\bigcap_n !Tn$.

9. Go to Step 2.

An alternative form of the pseudocode for an embodiment is listed in TABLE 5 below, and tracks the narration of FIG. 17 wherein the decision Step 4, or step 540 of FIG. 17, is arranged to decide Yes if NT is a superset of PT.

TABLE 5

DYNAMIC SCHEDULING PSEUDOCODE STEPS KEYED TO FIGS. 3-4

1.  BEGIN: $j = 0$. $PT = \Phi$. Set Jmax.    //The symbol $\Phi$ signifies Null Set, all zeroes.
2A. $j=j+1$    // Increment (Address).
2B. $NT = C(j)$
3.  IF $(j > Jmax)$, $NT= \Phi$.
4.  IF $(NT \cap PT) = PT$,    //Decide if NT is a superset of PT.
5.  THEN new tests $NWT= NT \cap !PT$; $PT = NT \cup PT$; Trigger NWT Load/Execute.
6.  ELSE $j=j-1$.
7.  Execution of tests in PT continues.
8.  IF Test Tn is complete, set $Tn = 0$ in PT, NT, all $C(j)$. Initiate Dump for Test Tn.
9A. IF $(NT= \Phi \ \& \ PT= \Phi)$, DONE = 1.
9B. IF DONE, Go to RETURN.
9C. ELSE Go to Step 2A.
9D. RETURN Comparing FIG. 3 with the above steps, such as from TABLE 3 or 4, note that Test Execution Control and Test ID Issue Logic 140 has a Stop input ('Result of 2') that receives Stop active from Address Generator 130 when step 2 condition is met in TABLE 3. Test Execution Control and Test ID Issue Logic 140 provides outputs to Address Generator 130 to cause it to effectuate address-related parts of steps 1, 2, 5, 6 as legended in FIG. 3. Test Execution Control and Test ID Issue Logic 140 provides outputs to cause Test List Updating Logic 150 to list-update according to various parts of steps 1, 3, 4, 5, and 8 also as legended in FIG. 3 and blocked out in FIG. 6 for there-designated Test List Control Logic 250. Test List Updating Logic 150 in FIG. 3 or 4 delivers the output from step 4, 5 to Test Execution Control and Test ID Issue Logic 140. (Step 4 signals whether a superset relationship was found or not, so that a FIG. 25 FSM in control 140 transitions to an appropriate state. States can be arranged straightforwardly, such as to correspond to step numbers in the pseudocode.) Test List Updating Logic 150 provides the Test List as Test IDs (NWT register bits) to the qualifying circuitry 180 for individual IPs in the SOC. Test ID=1 means a bit in NWT 152 is set to Execute the Test to which the bit position corresponds, else Ignore Test. In Step 8, completion of the test by an IP sends a Test Complete signal back to Test Execution Control and Test ID Issue Logic 140. See FIG. 9 for Test exec signal lines that provide suitable Test Complete signals.

The tree of particular example operation shown by FIG. 7 arises from the dynamically determined conditional outcomes of the hereinabove-listed looping process of the pseudocode listed or other processes tabulated for FIG. 17 and FIG. 3.

TABLE 6 shows an example result of deriving a Test Compatibility Table (TABLE 6) from a Test Association Table (TABLE 1A). Each type of Table is suitably used with a type of circuitry 140, 150 or firmware arranged to process it properly, such as by examples of tabulated pseudocode as taught herein. TABLE 6 is derived from TABLE 1A by the following procedure in TABLE 6A or any other appropriate procedure. Various embodiments can run the conversion in TABLE 6A or reverse-conversion in TABLE 6B either on the DUT chip, or off-chip beforehand, or not at all. For conciseness of expression in TABLES 6A and 6B, the column index n is omitted from matrices R(m, n) and C(j, n), which are instead referred to as R(m) and C(j).

TABLE 6

TEST COMPATIBILITY TABLE DERIVED FROM TABLE 1A BY PROCEDURE 'CONVERT' OF TABLE 6A

|    | T1 | T2 | T3 | T4 |
|----|----|----|----|----|
| C1 | Y  | Y  |    |    |
| C2 | Y  |    | Y  |    |
| C3 |    |    | Y  | Y  |

TABLE 6A

CONVERSION OF A TEST ASSOCIATION TABLE TO A TEST COMPATIBILITY TABLE: PSEUDOCODE

```
*PROCEDURE CONVERT(R(m), Mmax, C(j), Jmax ) //C(j), Jmax are outputs
    IF R(m) delivered as input is not symmetric, THEN output an Error message. Stop.
    j=0
    FOR m=1 to Mmax
    j=j+1
    C(j) = R(m)             //Row in Test Association Table R(m)
    FOR k=1 to Mmax
    IF [(R(m) ∩ R(k) = R(k)) AND R(m) ≠ R(k)]   // Detect a proper subset
        THEN C(j) = Tm U (C(j) & !Tm & !R(k))   //Tm has only one '1' at bit j.
    END FOR
    END FOR
    DEL_DUP[C(j), Jmax]     //Delete any row duplication, so all rows are distinct.
    Jmax = COUNT[C(j)]      //Count rows after any deletions.
```

TABLE 6B shows a procedure for a conversion in reverse, i.e., from a Test Compatibility Table to a square, symmetric Test Association Table.

TABLE 6B

REVERSE CONVERSION PSEUDOCODE

```
PROCEDURE REVERSE_CONVERT(C(j)), Jmax, R(m), Mmax) //R(m), Mmax output
    FOR m=1 to Mmax
    FOR j=1 to Jmax
    R(m) = Φ
    IF  Tm ∩ C(j) ≠ Φ        //Find each row j with m-th Test Tm.
        THEN R(m) = R(m) U C(j)   //Merge rows that each have Test Tm.
    END FOR
    END FOR
```

Next, the discussion turns to the more complex Test ID Table entries of FIG. 3 that are shown there as Yes (Y) or blanks TABLE 7 shows the same entries in digital 1/0 form.

TABLE 7

TEST ID TABLE 110 EXAMPLE FROM FIG. 3 IN DIGITAL FORM Cj)

|    | T1 | T2 | T3 | T4 | T5 |
|----|----|----|----|----|----|
| C1 | 1  | 1  | 1  | 0  | 1  |
| C2 | 1  | 1  | 0  | 1  | 0  |
| C3 | 0  | 1  | 0  | 1  | 0  |
| C4 | 0  | 0  | 1  | 1  | 1  |
| C5 | 0  | 0  | 1  | 0  | 1  |
| C6 | 0  | 0  | 0  | 1  | 0  |

TABLE 8 shows the evolving sets PT and NT as one example of a process embodiment performs its dynamic scheduling operations using TABLE 7 rows C(j) and TABLE 4 pseudocode. Set NT is replaced from the Test ID Table 110 (compatibility table) row-by-row, one row at a time, when the row address increments (j=j+1) in accordance with the flow in FIG. 17. Notice additional TABLE 7 rows and columns " . . . " that can have further possible entries in FIG. 3 are omitted to simplify TABLE 8. This simplification may affect some of the last three rows of TABLE 8, which are nevertheless shown to facilitate some further comparison with the pseudocode of TABLE 4.

TABLE 8

SETS PT AND NT USING TABLE 7 C(j) AND TABLE 4 PSEUDOCODE

| NT | PT | PT1 | $\cap_n$ !Tn | Addr j | Remarks |
|----|----|----|----|----|----|
| 11101 | 00000 | 11101 | 11111 | 1 | Trigger T1, T2, T3, T5 |
| 11101 | 11101 | 11101 | 01111 | 2 | T1 ends |
| 01010 | 01101 | 01111 | 01111 | 1 |  |
| 01101 | 01100 | 01111 | 01110 | 2 | T5 ends |
| 01010 | 01100 | 01110 | 01110 | 1 |  |
| 01100 | 01100 | 01110 | 01010 | 2 | T3 ends |
| 01010 | 01000 | 01010 | 01010 | 2 |  |
| 01010 | 01010 | 01010 | 00010 | 3 | Trigger T4; T2 ends some time later. |

TABLE 8-continued

SETS PT AND NT USING TABLE 7 C(j) AND TABLE 4 PSEUDOCODE

| NT | PT | PT1 | $\_\bigcap_n$ !Tn | Addr j | Remarks |
|---|---|---|---|---|---|
| 00010 | 00010 | 00010 | 00000 | 3 | T4 ends |
| 00010 | 00010 | 00010 | 00000 | 4 | |
| 00000 | 00000 | 00000 | 00000 | 5 | |
| 00000 | 00000 | 00000 | 00000 | 6 | |
| 00000 | 00000 | 00000 | 00000 | 7, | Stop. |

Different definitions of "compatibility class" lead to different sets of values for Test ID Table 110 and different embodiment Categories, as discussed next for at least four Categories. Different process embodiments can be applied to such sets of values and affect the manner of triggering new tests in FIG. 17 step 550 and of executing other steps.

CATEGORY 1—Compatibility classes on table rows represent all largest distinct sets of tests that can execute concurrently. A formal definition for Category I is: 'A given set of tests forms a compatibility class if every test in that set is compatible with all other tests in that set.' In this type of embodiment, a latest table row is reached by the process provided that any tests that have been previously triggered from an earlier table row and are still running are all found in the latest table row. Then all remaining tests, if any, specified in that table row that have not already been triggered previously are triggered as quickly and concurrently with each other as possible. Put another way, all remaining tests, if any, specified in that latest set that have been up to that time yet to be triggered, are triggered approximately concurrently with each other.

Example 1

Compatibility class is {T1, T2, T3} if all three tests can execute concurrently.

Example 2

If T1 can only execute with T2 or execute with T3 but not both, the compatibility classes are {T1, T2} and {T1, T3}.

Example 3

In FIG. 3, the rows show the compatibility classes and the leftmost column shows the Compatibility Class Id C(j) and not the Test ID. This example in FIG. 3 corresponds with the formal definition just provided. The compatibility classes in FIG. 3 are: C1: <T1, T2, T3, T5>, C2: <T1, T2, T4>, C3: <T2,T4>, C4: <T3, T4, T5>, C5: <T3,T5> and C6: <T4>. In some examples, the last compatibility class, e.g. C6, also is defined to include some or all Test IDs greater than those entered in the number of columns provided in the table, so that C6: <T4, Tests greater than Id 5>.

In FIG. 17 step 550, a type of suitable logic for this Category 1 triggers one or more tests out of the current compatibility class C(j). For purposes of comparing this Category 1 triggering logic with the Category 2 logic described in the next paragraph, note that compatibility class C(j) can also be identically represented by a bit-wise Boolean logic expression or function Tj U [C(j) & !Tj], this being a Boolean logic identity, where the notation "Tj" corresponds to all zeros except for a logic one in the j-th bit position.

CATEGORY 2: The table rows indicate sets of tests, each called a test association herein, that respectively comprise each test that is compatible (can execute concurrently) with the test signified by the Test ID in the leftmost column. Test associations on table rows represent at least one set of tests with any one of which a given test can execute concurrently. Table rows R(m) represent all largest sets of tests that can execute concurrently with the test signified by the Test ID in the leftmost (labeling) column. The rows do not directly indicate compatibility classes. This is because test compatibility "c" is intransitive, where (T2 c T1) AND (T1 c T3)--/→(T2 c T3), meaning that if a test is compatible with each of two other tests, the other two tests are not necessarily compatible with each other. In some embodiments, the Test ID is entered down the main diagonal of the table as in TABLE 1A, and in some other embodiments the Test ID is regarded as implicit, or already represented by a row index, and is omitted from the main diagonal. In some Category 3 forms, the table represents a symmetric array because when test T1 is compatible with test Tj, then test Tj is compatible with test T1; and vice versa. In some other Category 3 forms, the table represents a triangular array to represent the same information but save space.

Example 1

In TABLE 1A, for test T1, T2, T3 are compatible. For test T2, the test T1 is compatible. For test T3, Tests T1, T4 are compatible. For test T4, the test T3 is compatible.

Example 2

Test association is also {T1, T2, T3} if T1 can only execute with T2 or execute with T3. But at least one additional test association like {T1, T2} is specified if not all three tests can execute concurrently. When {T1, T2, T3} is the current test association, logic compares {T1, T2, T3} with the next-listed (or an elsewhere-listed) test association {T1, T2} and triggers tests appropriately out of the current test association. More generally, a subset of tests are triggered represented by a subset of data bits in one set of test association bits, and the control for the triggering is remarkably also based on data bits in another such set.

The tabular example in TABLE 1A is based on Category 2, Example 2—see row pairs (1,2) cut away as TABLE 9. Given intransitivity in TABLE 1A, TABLE 6 is an example of a test compatibility table that corresponds to the test association table TABLE 1A. With FIG. 9 in mind, a first type of logic embodiment under Category 2 interprets the next-listed test association as specifying tests to be launched together as a subset out of the current test association. In FIG. 7 hardware scheduler operations, test T1 and T2 are chosen at "A" to run in parallel instead of all three tests T1, T2, T3 in the test association of the first row R1. In the interpretation recognized by the type of embodiment of Category 2, Example 2, it may be noted from the first two rows that test T1 is compatible to T2, T3, and T2 is compatible to T1. Hence T2 and T3 are mutually not compatible. As a result, tests T1 and T2 or tests T1 and T3 can be parallelized, but not tests T2 and T3. More than two tests could be allowed to run concurrently, e.g., if in the Table 1A, all pairs <T1,T2>, <T1,T3> as well as <T2,T3> were compatible. This can be indicated either by omitting the qualifying test row 2 (T2: Y, Y) and leaving the first test row (T1: Y, Y, Y) or by making each of these two test row entries (Y, Y, Y).

TABLE 9

TWO TEST ROW ENTRIES FROM FIG. 1A

|  | T1 | T2 | T3 | T4 |
|---|---|---|---|---|
| R1 | Y | Y | Y |  |
| R2 | Y | Y |  |  |

A first type of suitable logic for Category 2 is represented by bit-wise Boolean logic expression or function Tj U [(R(j) & !Tj)& (R(j+1) & !T(j))], where the notation "Tj" corresponds to all zeros except for a logic one in the j-th bit position. Boolean simplification of the logic expression yields a logically equivalent but simpler expression Tj U [R(j) & !Tj & R(j+1)]. For example, logic at test row 1 (Tj=10000) compares {T1, T2, T3}='11100' with the next-listed test association {T1, T2}='11000' by that logic, and computes 10000 U [11100 & 01111 & 11000], which evaluates to 11000 and identifies tests T1 and T2 but not T3 out of the current test association {T1, T2, T3}. Thus, detailed flow steps and logic circuitry specifically determine which two tests out of T1, T2, T3 in the row R1 test association are actually triggered at step 550 of FIG. 17.

For an embodiment that operates in a way like Category 2 above and as narrated for FIG. 7, another example of pseudocode is listed in TABLE 10 below.

TABLE 10

DYNAMIC SCHEDULING PSEUDOCODE

1. BEGIN: j = 0. PT = Φ. Set Jmax. $\bigcap_n$ !Tn = '11111'   // all ones.

2A. j=j+1   // Increment (Address).

2B. NT = R(j) & $\bigcap_n$ !Tn,   for all tests Tn that have completed, if any.

3. IF (j > Jmax), NT= Φ.
4. IF (NT ∩ PT) = PT,   //Decide if NT is a superset of PT.
5. THEN PT=NT; new tests NWT= Tj U [R(j) & !Tj & R(j+1)]; trigger NWT.
6. ELSE j=j-1.
7. Execution of triggered or already-triggered tests in PT continues.
8. If test Tn is complete, Dump, Set PT = PT & !Tn and NT = NT & !Tn.
9A. IF (NT= Φ & PT= Φ), DONE = 1.
9B. IF DONE, Go to RETURN
9C. ELSE Go to Step 2A.
9D. RETURN Another type of logic embodiment is somewhat like TABLE 10 but instead interprets a test association table like TABLE 1A by looking at a table row R(j) and then a next-listed (or some other) table row R(j+1) as telling what tests should not be launched together out of the current table row R(j). This second type of logic uses the logic function Tj U [(R(j) & !Tj)& !(R(j+1) & !T(j))], which simplifies to Tj U [R(j) & !Tj & !R(j+1)]. For example, logic at test row 1 (Tj=10000) compares {T1, T2, T3}='11100' with the next-listed table row R(j) {T1, T2}='11000' by that logic, and computes 10000 U [11100 & 01111 & 00111], which evaluates to 10100 and identifies tests T1 and T3 but not T2 out of the current table row R(j)={T1, T2, T3}. Thus, detailed flow steps and logic circuitry specifically determine which two tests out of T1, T2, T3 in the row R1 table row R(j=1) are actually triggered at step 550 of FIG. 17. More generally, in this type of embodiment a subset of tests are triggered represented by a subset of data bits in one set of test association bits, and the control for the triggering is also based on data bits in another such set representing at least one other of the tests in that other set, wherein that at least one other of the tests is not in that foregoing subset.

Accordingly, determination of which tests can be triggered from a given table row R(j) depends on information outside of that table row R(j). For instance in some of these embodiments, both the current table row R(j) and the next-listed table row R(j) are used as input to logic that determines what tests can be launched from the current table row R(j). Relative to the previous table row, though, the operation is as described for Category 1, i.e., a latest table row is reached by the process provided that any tests that have been previously triggered from an earlier table row and are still running are all found in the latest table row. However, an important difference is that one or more remaining tests, if any, that are specified in that table row and that have not already been triggered previously or are still running, are triggered now subject to the determination by the logic that consults not only a latest table row R(j) but also the next-listed table row R(j+1) at step 550 of FIG. 17. Put another way, all remaining tests, if any, specified in that latest set that have been up to that time yet to be triggered, are triggered approximately concurrently with each other.

Other distinct embodiments of this type may be arranged, if the relationship among the various tests might call for it, by applying a logic function not only to the current test row and the next-listed one, but also the one after that—so that the logic function involves three or more test rows to determine what test(s) to trigger or launch out of a current test table row. For example, such a triggering logic function for step 550 of FIG. 17 in one such embodiment can be: Tj U [(R(j) & !Tj) & !(R(j+1) & !T(j)) & !Tj)& !(R(j+2) & !T(j))].

Referring now to TABLE 11A note that, in the FIG. 7 narration of TABLE 1F, one type of embodiment monitors all active rows (i.e., NT≠Φ) of TABLE 1F on each pass and can go all way back to the first row if necessary. TABLE 11A shows pseudocode to execute that kind of monitoring all active rows of the table on each pass and executes an overall two-step that works with each row differently in a superset-subset pair of rows.

TABLE 11A

DETECTING 1st REMAINING ACTIVE ROW AND DYNAMIC
SCHEDULING RE FIG. 7

1. BEGIN: PT = NWT = Φ. Set Jmax. PT = Φ. $\bigcap_n$ !Tn = '11111'  // all ones.

//Inner loop Part 1
2A1. FOR j=1 to Jmax + 1
2A2.   FOR k=j to Jmax + 1

2B1.     NT = R(j) & $\bigcap_n$ !Tn, for all tests Tn that have completed, if any.

//Inner loop Part 1 detects first remaining active row
2B2.     IF NT≠ Φ THEN Go to Step 4. Retain NT and index values j and k.
3.       IF (j > Jmax), NT= Φ.
         END FOR
         END FOR                        //End of Inner loops Part 1
4. IF (NT ∩ PT) = PT,                   //Decide if NT is a superset of PT.
5.   THEN PT=NT.                        //Implicit merger of PT U NT
6. New tests NWT= R(j) & R(k); Trigger NWT Load/Execute.
7. Execution of already-triggered, not-yet completed tests continues in IP core(s).

8A. IF Test Tn is complete, Dump, Set PT = PT & !Tn. Update $\bigcap_n$ !Tn.

8B1. FOR j=1 to Jmax + 1               // Inner loop Part 2

8B2.   NT = R(j) & $\bigcap_n$ !Tn, for all tests Tn that have completed, if any.

//Inner loop Part 2 now again detects first remaining active row
8B3.   IF NT≠ Φ THEN Go to Step 4. Retain NT and index value j.
3.     IF (j > Jmax), NT= Φ.
       END FOR                          //End of Inner loop Part 2
4. IF (NT ∩ PT) = PT,                   //Decide if NT is a superset of PT.
5, 6.   THEN New tests NWT= NT ∩ !PT; Trigger NWT; PT=NT.   //Distinct NWT
7. Execution of already-triggered, not-yet completed tests continues in IP core(s).

8. IF Test Tn is complete, Dump, Set PT = PT & !Tn. Update $\bigcap_n$ !Tn.

9A. IF (NT= Φ & PT= Φ), DONE = 1.
9B. IF DONE, Go to RETURN.
9C.   ELSE Go to Step 2A.              //Outer Loop for Dynamic Schedule
9D. RETURN Referring now to TABLE 11B, still another embodiment is represented in pseudocode for an overall process based on FIG. 7. That TABLE 11B pseudocode combines a CONVERT procedure of TABLE 6A to convert a test association table R(m) for FIG. 7 into a test compatibility table C(j) together with pseudocode that then triggers the tests based on the test compatibility table C(j) or any desired permutation of the rows therein (such as supported by Test ID Indexing Table 170). The combined pseudocode in some embodiments is partitioned into a DUT on-chip portion, and an off-chip portion for CONVERT such as in tester 5.

TABLE 11B

DETECTING 1st REMAINING ACTIVE ROW AND DYNAMIC
SCHEDULING RE FIG. 7

1A. BEGIN: j = 0. PT = Φ. $\bigcap_n$ !Tn = '11111'   // all ones.

1B. PROCEDURE CONVERT(R(m), Mmax, C(j), Jmax)   //C(j), Jmax are outputs
2A. j=j+1                              // Increment (Address).

2B. NT = C(j) & $\bigcap_n$ !Tn

3. IF (j > Jmax), NT= Φ.
4. IF (NT ∩ PT) = PT,                  //Decide if NT is a superset of PT.
5.   THEN new tests NWT= NT ∩ !PT; PT = NT U PT; Trigger NWT.
6.   ELSE j=j-1.

TABLE 11B-continued

DETECTING 1st REMAINING ACTIVE ROW AND DYNAMIC
SCHEDULING RE FIG. 7

7. Execution of tests in PT continues.

8. IF Test Tn complete, reset nth bit = 0 in PT, NT, $\bigcap_n$ !Tn. Initiate Dump of Test Tn.

9A. IF (NT= Φ & PT= Φ), DONE = 1.
9B. IF DONE, Go to RETURN.
9C. ELSE Go to Step 2A.
9D. RETURN The description of some Categories of embodiments turns now to Category 3:

CATEGORY 3: Some embodiments are designated Category 3 when they have some kind of sequential logic circuit coupled with a storage circuit that can be loaded in some way with data bits and to which the sequential logic circuit responds in a manner that issues test trigger signals so that tests that are incompatible are prevented from executing in an overlapping manner. Notice how the various Categories and varieties of embodiments indicate the robustness and breadth of the technology covered.

Example 1

Test ID Table might have a given pair of tests indicated as compatible in one table row, and not indicated as compatible in another table row; or a pair of table rows might have logically inconsistent information according to some definitional interpretation and yet can still support concurrent testing of modules in actuality without issuing actually-incompatible tests. This example also relates to various forms that would be in Category 3 but that represent an array that is neither symmetric nor symmetric implemented triangular.

Example 2

Some sets of register file test IDs might not readily admit of consistent definition and yet deliver at least some concurrent operation of various tests that are not incompatible with one another. Put another way, various sets of pseudo-code described herein, and other sequential logic circuit designs that can be prepared based on the teachings herein, are likely able to respond to various sets of data, whether or not illustrated in any of the TABLES herein, that don't fully fit any of the other Category descriptions and yet like them can usefully issue, initiate or trigger test triggers or commands for tests in a coordinated manner that executes faster than executing the tests seriatim, while preventing tests that are incompatible from executing in an overlapping manner.

Testing for proper operation of the dynamic scheduler of FIGS. 3-7 is done through access to SOC/IP production testing.

Compatibility classes exist between tests within an IP as well as across IPs. Hence, the embodiments in another type of applicability can provide support for multiple tests to be executed in parallel within an IP as well as across IPs. Note from a practical viewpoint, parallelism of tests within an IP may involve circuits wherein the test resources within an IP, namely, DMLED interface and other test mode control, and/or the processor inside are replicated or otherwise can support some parallelism (e.g., multiple circuits or processor CPUs). Also, a single DMLED interface at the SOC level may prohibit parallelism of tests within an IP unless that DMLED interface has sufficient parallelism itself. To the extent that some types of ICs may benefit from such embodiments, this support for multiple tests to be executed in parallel within an IP is pointed out.

Returning to the test schedule, it can be dynamically created, i.e. a set of tests can be moved across compatibility classes, since the scheduler 100 can combine the tests based on their unique Test IDs and as per the compatible test list, as in FIGS. 3-4 and the merging operation in FIG. 17. This parallelism in test execution across multiple IPs is independent of the overall multi-site test solution created at the wafer/dies level. So, even though multiple dies are being tested in parallel, within a die multiple IPs can be tested in parallel.

Some examples of SoC embodiments can have 1) BT, FM, NFC and WLAN cores; 2) BT, FM, GPS, NFC, WLAN and MIMO (Multiple Input Multiple Output, for use with multiple antennas) cores; 3) UMTS/WCDMA/GPRS cellular, DVB, GPS, WLAN, BT; 4) DSL, WLAN, WiMax, WUSB/UWB, MiMO gateway. Many other SoC embodiments can be provided based on the teachings herein.

Test concurrency for multiple IPs inside an SOC is provided and enhanced or extended in two forms herein: (i) An implementation structure operates for forking multiple tests and combining their results through the DMLED interface. (ii) A process of concurrent test is extended to include support for creating a dynamic schedule for the set of concurrent tests, through a hardware BIST controller, thereby providing various levels and types of concurrency amongst different radio IPs and the individual tests therein, which can be configured inside the SOC itself.

Figure 18:
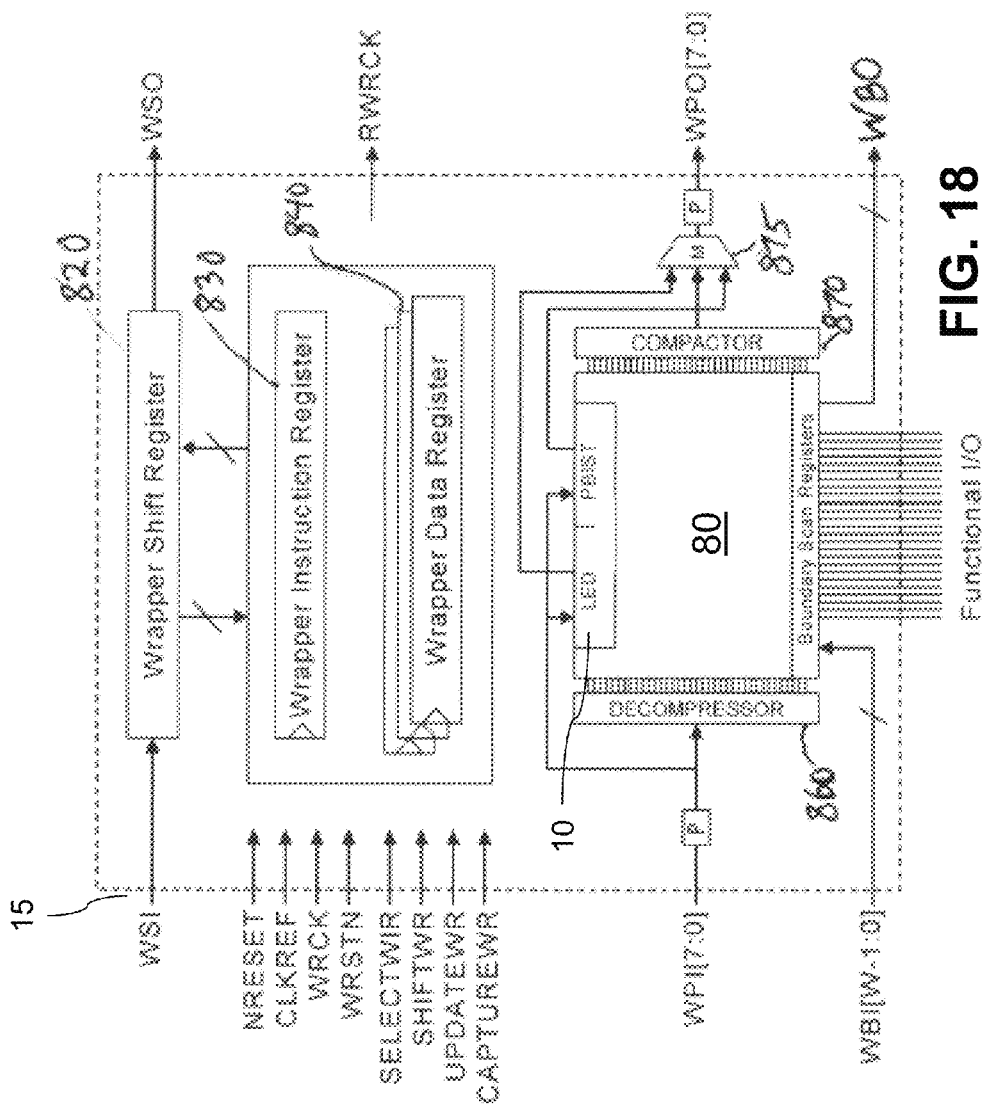
FIG. 18 is a block diagram of a test interface for use in the circuits of FIGS. 1 and 9.

In FIG. 18, an interface 15 compatible with IEEE 1500 is used to setup/control many of the test related features within the functional integrated circuit 80 according to embodiments combining FIG. 18 with circuits and processes of any of the other Figures. In this way, tester 5 in FIG. 1 communicates with an interface 820, 830, 840, 875 that couples chip-level test pins with a functional integrated circuit 80 and provides a test wrapper to allow access to the functional integrated circuit 80. The test wrapper has a Wrapper Shift Register 820 for serial entry of instructions and data via a Wrapper Shift Input WSI and can scan out resulting information at Wrapper Shift Output WSO. A Wrapper Instruction Register 830 is coupled and controlled to receive the test instructions from Wrapper Shift Register 820. A Wrapper Data Register 840 is coupled and controlled to receive the test data from Wrapper Shift Register 820 or conversely to deliver resulting data to Wrapper Shift Register 820 for serial scan out at WSO. A set of control signals NRESET, CLKREF, WRCK, WRSTN, SELECTWIR, SHIFTWR, UPDATE WR, AND CAPTUREWR control these operations.

Further in FIG. 18, an 8-wide input WPI[7:0] feeds a Decompressor 860 as well as a Load Execute Dump LED interface 10 and a programmable BIST or PBIST, interface and improved as in FIGS. 2-6 and the other Figures herein. Decompressor 860 provides and sets up a bit-image for functional integrated circuit 80 to operate upon. LED 10 and PBIST interface 100 are coupled to control what operations are to occur and be tested as taught herein. Decompressor 860 cooperates with scan chains in circuit 80, and Compactor 870, as well as IR drop monitoring circuits if desired, and any or all of them are included in combination embodiments with the test wrapper of FIG. 18. A mux 875 has three inputs respectively fed by a Compactor 870, by an output from the Load Execute Dump LED interface 10, and by an output from the PBIST interface 100. Mux 875 delivers test results to an output designated WPO[7:0]. Functional integrated circuit 80 also has boundary scan registers that provide functional I/O and also have a serial input WBI[(W−1):0] and a serial output WBO. FIG. 18 is one illustration of a particular on-chip test interface 15 to tester 5, and various embodiments may use some other test interface or none at all.

Figure 20:
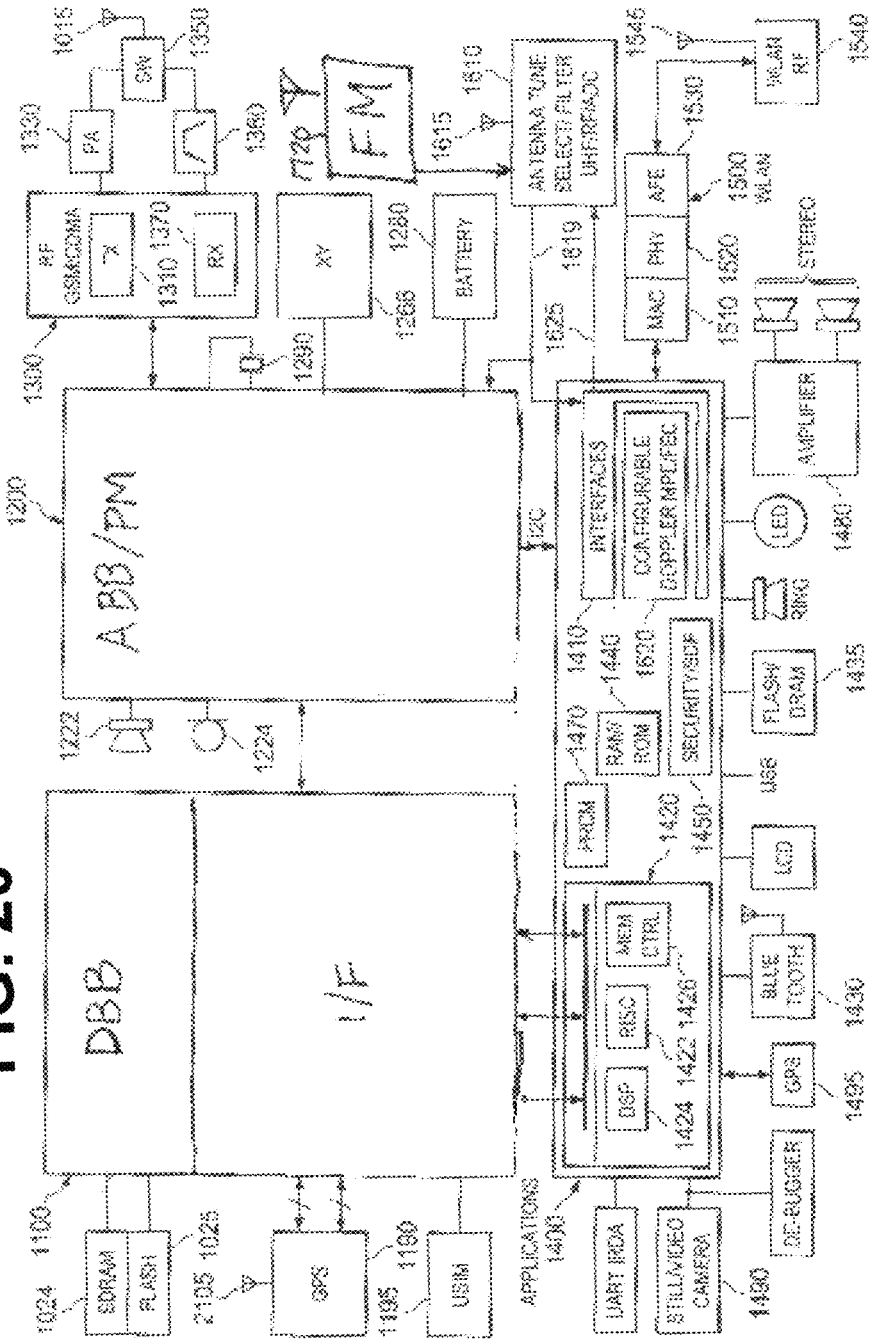
FIG. 20 is a block diagram of a system on a chip (SOC) having various cores and including one or more testing circuit embodiments of the other Figures and for testing according to processes of the other Figures.

In FIG. 19, an RF transmit/receive TX/RX circuitry section is tested in a given one of the IP cores of FIGS. 1, 9 and 20. The transmit TX and receive RX circuits are in approximately the upper and lower halves respectively of FIG. 19. FIG. 19 depicts a Cartesian coordinates-based implementation, and various tests herein may also be performed on a Polar coordinates ('r' and theta θ) implementation of a radio. Various tests include 1) TX DACs linearity. 2) DCO (digitally controlled oscillator) circuit scan checks performance of all capacitances (varactors) and inductances. 3) Phase Noise BiST PHE in TX means possible transmissions into unintended frequency channels. 4) Loopback gain BIST covers the Pre-Power Amplifier (PPA). 5) Signal paths may be impaired due to IC defects in either the RX or TX paths. 6) RX DACs linearity, sensitivity. 7) RX Phase Error PHE can lead to reduced sensitivity. 8) Loopback gain BiST to cover Low Noise Amplifier (LNA), and cover Transconductance Amplifier (TA) and mixers. Test multiplexer MUX 910 operates on some tests to couple either I-DAC or Q-DAC (Digital analog converter from the in-phase (I) channel or quadrature (Q) channel) of the transmitter circuit path back to either the I-ADC or Q-ADC (analog to digital converter for 1 or Q) of the receiver circuit path. A test multiplier MUX 920 couples various test sources such as LDOs or PDET to test the I-ADC and Q-ADC and further circuitry farther down the receive chain. In other tests for testing still more of the circuitry, as shown by dashed lines, external loopback 952 goes between PPA and LNA, and/or internal loopback 954 goes between PPA and TA. In this way, an up-converter 960, and down converter 970, as well as PPA, LNA, and TA, are conveniently tested too. In still other tests, such as for coexistence or non-interference between radios, external loopback 956 goes from PPA of one radio to the LNA of another radio in the system or in SOC 80.

Effectively, these embodiments are applicable for the concurrent test of any suitable type integrated circuit with any kind and suite of tests. Radio modules provide a particularly interesting case of a type of integrated circuit that calls for such a variety of tests in that it makes test scheduling difficult. This is because (i) the test schedule is often dynamic, since the impact of one test on another (co-existence amongst IPs) may force a re-grouping of these tests, (ii) it is statically difficult to create these tests, since tests across multiple IPs have to be packaged together keeping in mind the exact number of test execution cycles, and (iii) inherently these tests often change based upon the pass/fail criteria associated with specific performance parameters for the individual radio modules. As a result, a one-time schedule as part of the overall SOC test plan is increasingly difficult to fix. Hence, a hardware scheduler embodiment herein provides the flexibility to dynamically configure these tests. Numerous implementations of the hardware scheduler 100 are possible relating to the structure of the Test ID Table 110, and regarding Test Execution Control and Test ID Issue Logic 140 and Test List Updating Logic 150, among other structures shown or possibly used in still other embodiments.

As noted, the embodiments in this disclosure are applicable, among other things, to all classes of digital circuits where concurrent testing can be used and to all types of systems using such circuits. Another system context is depicted in FIG. 20, by way of example and not of limitation.

It is contemplated that the skilled worker uses each of the integrated circuits shown in FIG. 20, or such selection from the complement of blocks therein provided into appropriate other integrated circuit modules, or provided into one single integrated circuit module, in a manner optimally combined or partitioned between the modules, to the extent needed by any of the cellular telephones, radios and televisions, Internet audio/video content players, fixed and portable entertainment units, WLAN gateways, routers, pagers, personal digital assistants (PDA), organizers, scanners, faxes, copiers, household appliances, office appliances, microcontrollers coupled to controlled mechanisms for fixed, mobile, personal, robotic and/or automotive use, combinations thereof, and other application products now known or hereafter devised for increased, partitioned or selectively determinable advantages. For some background on system on chip technologies, see U.S. Patent Application Publication 20080307240 (TI-60478) "Power Management Electronic Circuits, Systems, and Methods and Processes of Manufacture," which is incorporated herein by reference in its entirety.

In FIG. 20, a cell phone modem 1100, 1200, 1300 is suitably interfaced with an applications processor 1400 and various radios for WLAN 1500, Bluetooth 1430, GPS 1495, FM 1720, and others. Applications processor 1400, for example, can include a RISC processor 1422 (such as MIPS core(s), ARM core(s), or other suitable processor), a digital signal processor (DSP) 1424 such as from the TMS320C55x™ DSP generation and/or the TMS320C6x™ DSP generation from Texas Instruments Incorporated or other digital signal processor(s), and a shared memory controller 1426 with DMA (direct memory access), and a graphic accelerator for a 2D or 3D (two/three-dimensional display) 1266. The RISC processor 1422 and the DSP 1424 suitably have access via an on-chip extended memory interface (EMIF/CF) to off-chip memory resources 1435 including as appropriate, mobile DDR (double data rate) DRAM, and flash memory of any of NAND Flash, NOR Flash, and Compact Flash. On-chip RAM/ROM 1440 provides on-chip storage, and interfaces 1410 couple the processors 1422 and 1424 to the off chip peripherals. A USIM (universal subscriber identification module) 1195 is coupled with an interface portion of DBB/IF 1200.

In FIG. 20, circuitry for digital baseband DBB/IF 1100, analog baseband/power management ABB/PM 1200, and RF TX/RX 1300 supports and provides wireless modem interfaces for any one or more of GSM, GPRS, EDGE, UMTS, and OFDMA/MIMO (Global System for Mobile communications, General Packet Radio Service, Enhanced Data Rates for Global Evolution, Universal Mobile Telecommunications System, Orthogonal Frequency Division Multiple Access and Multiple Input Multiple Output Antennas) wireless, with or without high speed digital data service HSDPA/HSUPA (High Speed Downlink Packet Access, High Speed Uplink Packet Access) (or 1×EV-DV, 1×EV-DO or 3×EV-DV), via an analog baseband chip and GSM/CDMA transmit/receive chip (in cell modem). SDRAM 1024 and flash memory 1025 suitably provide memory support for DBB/IF 1100. FIG. 19 provides a representative detail of parts of RF TX/RX for any of the wireless modems such as RF TX/RX 1310/1370, WLAN RF 1540, Bluetooth 1430, and others. A switchplexer or circulator 1350 couples RF power amplifier 1330 and RX 1370 with bandpass filter 1360 to a cell phone antenna 1015.

An audio/voice block in ABB/PM 1200 is suitably provided to support audio and voice functions and interfacing. A microphone 1224 and an audio output transducer 1222 are coupled with ABB/PM 1200. Speech/voice codec(s) and speech recognition are suitably provided in memory space in an audio/voice block in ABB/PM 1200 for processing. Applications processor 1400 in some embodiments is coupled to location-determining circuitry for satellite positioning such as GPS (Global Positioning System) 1190 or 1495 and/or to a network-based positioning (triangulation) system, to an accelerometer, to a tilt sensor, and/or other peripherals to support positioning, position-based applications, user real-time kinematics-based applications, and other such applications.

ABB/PM 1200 includes a power conversion block, power save mode control, and oscillator circuitry based on crystal 1290 for clocking the cores. A display 1266 is provided off-chip. Batteries 1280 such as a lithium-ion battery provide power to the system and battery data.

Further in FIG. 20, chip (or core) 1400 interfaces to high-speed WLAN 802.11a/b/g/n (Wi-Fi) MAC (media access controller) 1510, PHY 1520, AFE 1530, WLAN RF 1540 and a WLAN antenna 1545. Other data wireless interfaces are suitably provided for coe-existing IEEE 802.15 (Bluetooth and low and high rate piconet, Zigbee, and personal network communications) wireless circuit. Other interfaces suitably include a MCSI voice interface, a UART interface for controls and data to position unit GPS and otherwise, and a multi-channel buffered serial port (McBSP) for data. FM radio front end 1720 is coupled with a DVB front end 1810, and they are together coupled with ABB/PM mixed signal chip 1200 and/or applications processor 1400 by control line 1625 and input lines 1619. A configurable Doppler MPE/FEC circuit 1620 supports the DVB. Further in peripherals, a MicroWire (u-wire 4 channel serial port), and USB, and a multi-channel buffered serial port (McBSP) to Audio codec, a touch-screen controller, and audio amplifier 1480 to stereo speakers. External audio content and touch screen (in/out) and LCD (liquid crystal display), organic semiconductor display, and DLP™ digital light processor display from Texas Instruments Incorporated, are suitably provided in various embodiments and coupled to interface of core 1400 for fixed, portable, mobile and/or vehicular use. An interface provides EMT9 and Camera interfacing to one or more off-chip still cameras or video cameras 1490, and/or to a CMOS sensor of radiant energy. PRCM 1470 (power, resets and control module) provides power management.

In FIG. 20, in some embodiments, GPS 1495 operates in close coordination with any one, some, or all of WLAN, WiMax, DVB (digital video broadcasting), or other network, to provide positioning, position-based, and user real-time kinematics applications. Still other additional wireless interfaces such as for wideband wireless such as IEEE 802.16 WiMAX mesh networking and other standards are suitably provided and coupled to the applications processor integrated circuit and other processors in the system.

Various production-testable and/or field-testable system embodiments with one or more SOCs are provided on a printed circuit board (PCB), a printed wiring board (PWB), and/or in an integrated circuit on a semiconductor substrate.

Figure 21:
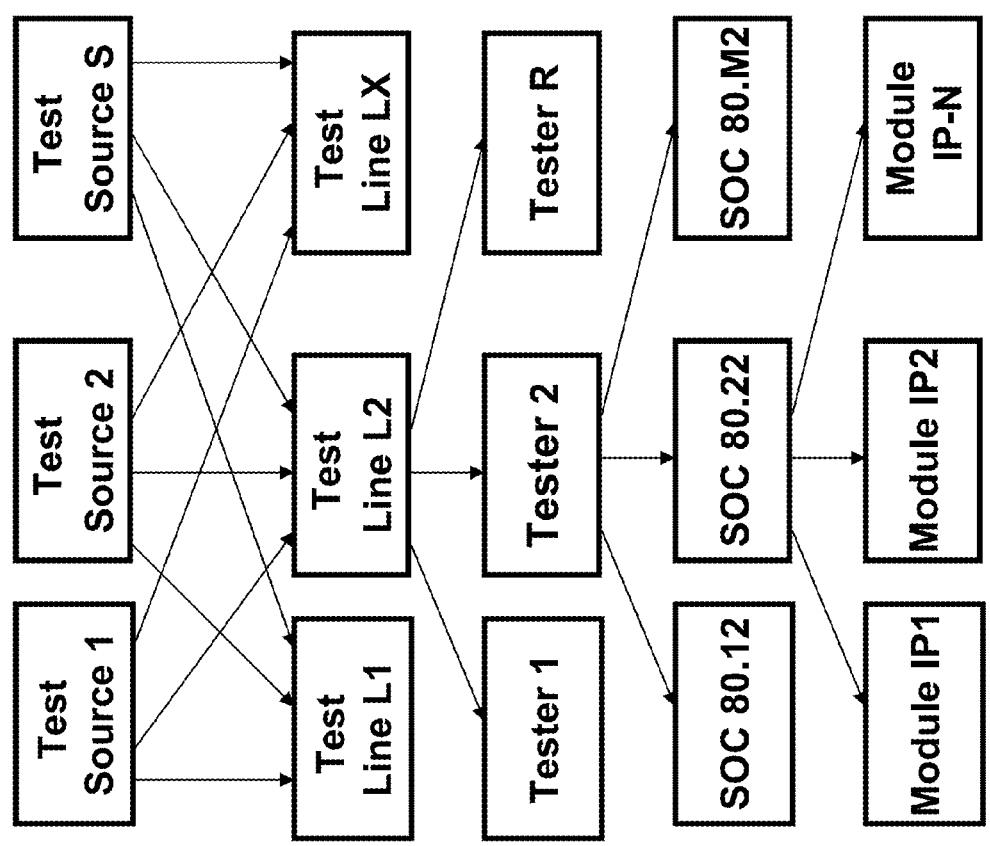
FIG. 21 is a block diagram of a multi-site test and manufacturing system and process embodiment.

In FIG. 21, a multi-site (multi-die) system and process are shown. As described herein, one level of test concurrency is within the SOC device. Hence if the SOC has N radio modules (e.g., as in FIG. 2, 9 or 20) and the tests amongst them are compatible, then each SOC 80.M can effectively have up to N tests running in parallel, one in each IP core or module IP1, IP2, . . . IP-N. Likely values for N are in the range 3 to 5 and other values are possible. Multi-site test capability can also provided by the tester 5 of FIG. 1, or by each or any of several testers 1, 2, . . . R. For a by-M (i.e. xM) multi-site capability, M devices are tested in parallel, wherein M dies (SOCs 80.1$k$, .2$k$, . . . M$k$ of a given SOC type k) are contacted simultaneously by the tester 5. Some values of M for one type of tester 5 (VLCT) are 2, 4, 8, and 16. The x16 multi-site can be attained by some devices, and some can go to x32 and x64. Hence in this case, N*M tests are run in parallel, where M and N are mutually independent. It may, however, be noted that the VLCT has finite resources to support the test of M devices with N IPs in each. These are number of power supplies, number of signal generators, number of PLLs and clocks, number of measurement channels, etc. Nevertheless, the embodiments do not restrict M and N from a capability point of view. The number M of devices tested in parallel need not be considered by the controller 100 in each SOC 80, while the number N of parallel tests only increases the size of the Test ID Table 110, (and possibly Test ID Indexing Table 170) with no impact on the FIG. 25 FSM or other controller 140 for the hardware scheduler. Moreover, in FIG. 22, designate the SOCs 80.$ik$ of type k SOC die individually indexed i within type k. Each particular tester 5.$k$, in one kind of manufacturing system embodiments, suitably tests multiple dice i of one type k of a SOC 80. Each tester 5.$k$ is provided with the appropriate Test ID Table 110 like TABLE 1A, to test SOCs of type k, or the tester is provided with sufficient information in FIG. 22 data storage 2530 to generate and download the Test ID Table to each die i for one type k of SOC. In another kind of system embodiment, a tester R is provided with sufficient information in FIG. 22 data storage 2530 to generate the Test ID Tables for two or more types k of SOC, and the tester communicates via multiple probe assemblies with different dice i of each type k of SOC 80.$ik$ under test.

In FIG. 21, higher levels of sourcing and control are also shown. Production test or production lines L1, L2, . . . LX are suitably provided in a wafer fabrication facility, or an assembly/test facility or in different ones of such facilities. Each of the X test lines has a test line gateway for appropriately distributing test code for various tests from a test storage or library to one or more testers 1, 2, . . . R like tester 5 of FIGS. 1-2. At an even higher level, a number S of Test Sources 1, 2, . . . S, such as at different remotely located design sites, originate electronic packages having one or more test codes to any one, some or all of the facilities having the production test lines L1-LX. The distribution between levels is suitably either wired or wireless. The various levels have numerousness values S, X, R, M, N that are independent and allow any amount of replication and concurrency of tests suitable to different products, technologies of SOCs and the modules, and varying volume of production or facility loading in ongoing manufacturing operations.

Figure 22:
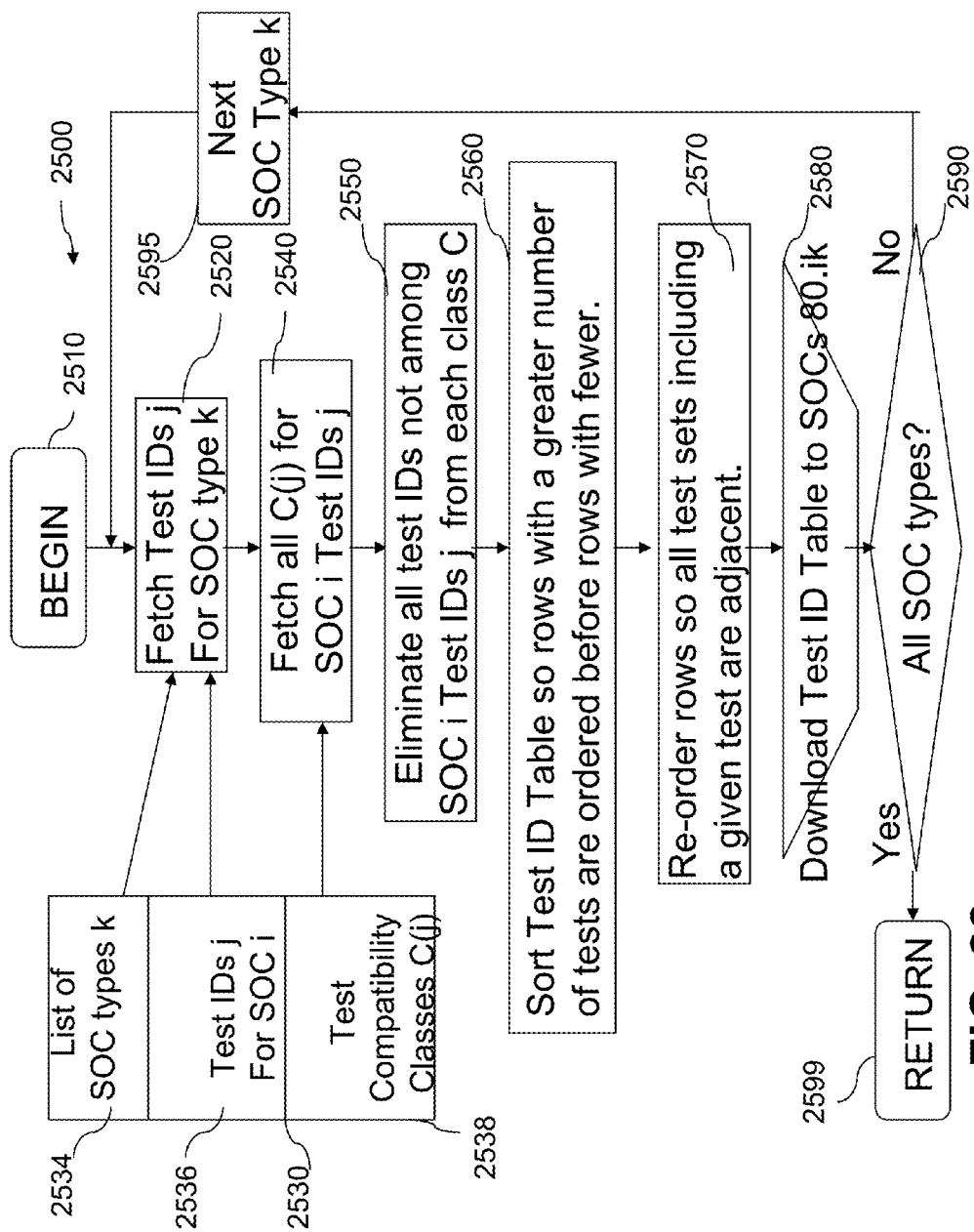
FIG. 22 is a flow diagram of a process embodiment to generate a scheduling table called a Test ID Table for use in FIGS. 3-6 and 17.

FIG. 22 shows an example of a test sub-process 2500 that generates, e.g., values for TABLE 1A or Test ID Table 110 in FIG. 3. In FIGS. 1-2, this sub-process 2500 is suitably stored as instructions in tester storage and executed by a tester processor in tester 5 and conveyed by a tester interface to the DUT SOC 80. The instructions may alternatively be stored and executed in a test line gateway or at a remote original source or elsewhere in FIG. 21. Recall that Test Table 110 is processed according to the flow description of FIG. 7 or of FIG. 17. FIG. 22 describes how that Test Table is generated or loaded in the first place. Test ID Table 110 has a Number of columns $N_C$ equal to a Total number Tn of tests (marked as T1-T5, etc). Number of rows $N_R$=Jmax equals a Total number Cn of compatibility classes (marked as C1-C4, etc). Operations in FIG. 22 commence with a BEGIN 2510 and proceed to a step 2520 to fetch Test IDs j of the particular tests to be applied to a given type of SOC 80.i to be tested as DUT. Step 2520 accesses a storage 2530 that has a space 2534 for a list of types of SOCs i, a space 2536 for a list of the Test IDs j applicable to each type of SOC i, and a space 2538 specifying the tests in each of the compatibility classes C(j) for each of the Test IDs j. A succeeding step 2540 fetches only the particular compatibility classes C(j) for each of the Test IDs j actually found or determined in step 2520 to be used in testing SOC i. (In some embodiments, the space 2538 may itself provide compatibility classes C(i, j) specific to each particular SOC i.) A further step 2550 for each of the Test IDs j eliminates, from each compatibility class C(j) that was fetched, all Test IDs except those Test IDs j actually found or determined in step 2520 to be applicable for use in testing SOC i. (In some process embodiments, step 2550 is omitted if the compatibility classes have been prepared with only SOC i in mind.)

In a succeeding step 2560, the embodiment sorts the Test ID Table 110 with a descending order of test cardinality, i.e. rows with more number of tests are ordered before rows with fewer number of tests. Then in a step 2570 operations re-order the rows such that all tests for a given test are adjacent. See the example tables in FIG. 3 or TABLE 1A. Put another way, steps 2560 and 2570 together re-order the rows so that the leftmost active entry in the first row is the test T1 in the first column. In succeeding rows, these steps 2560 and 2570 together arrange the rows so rows with the same leftmost active entry are grouped together in descending order of cardinality, and then the test represented by the leftmost active entry increments in an increasing order. So, for example, in FIG. 3, the leftmost active entries row-by-row are: T1, T1, T2, T3. In TABLE 1A, the leftmost active entries row-by-row are: T1, T1, T1, T3.

A step 2580 downloads resulting table data to constitute Test ID Table 110 in each of one or more integrated circuit dice i of SOC type k, whereupon operations go to and branch back from a decision step 2590 via a step 2595 that selects the next SOC type k for support at step 2520, and so on. Decision step 2590 detects (Yes) when all the one or more types k of SOC have had their Test ID Table generated and downloaded, whereupon operations reach RETURN 2599.

Figure 23:
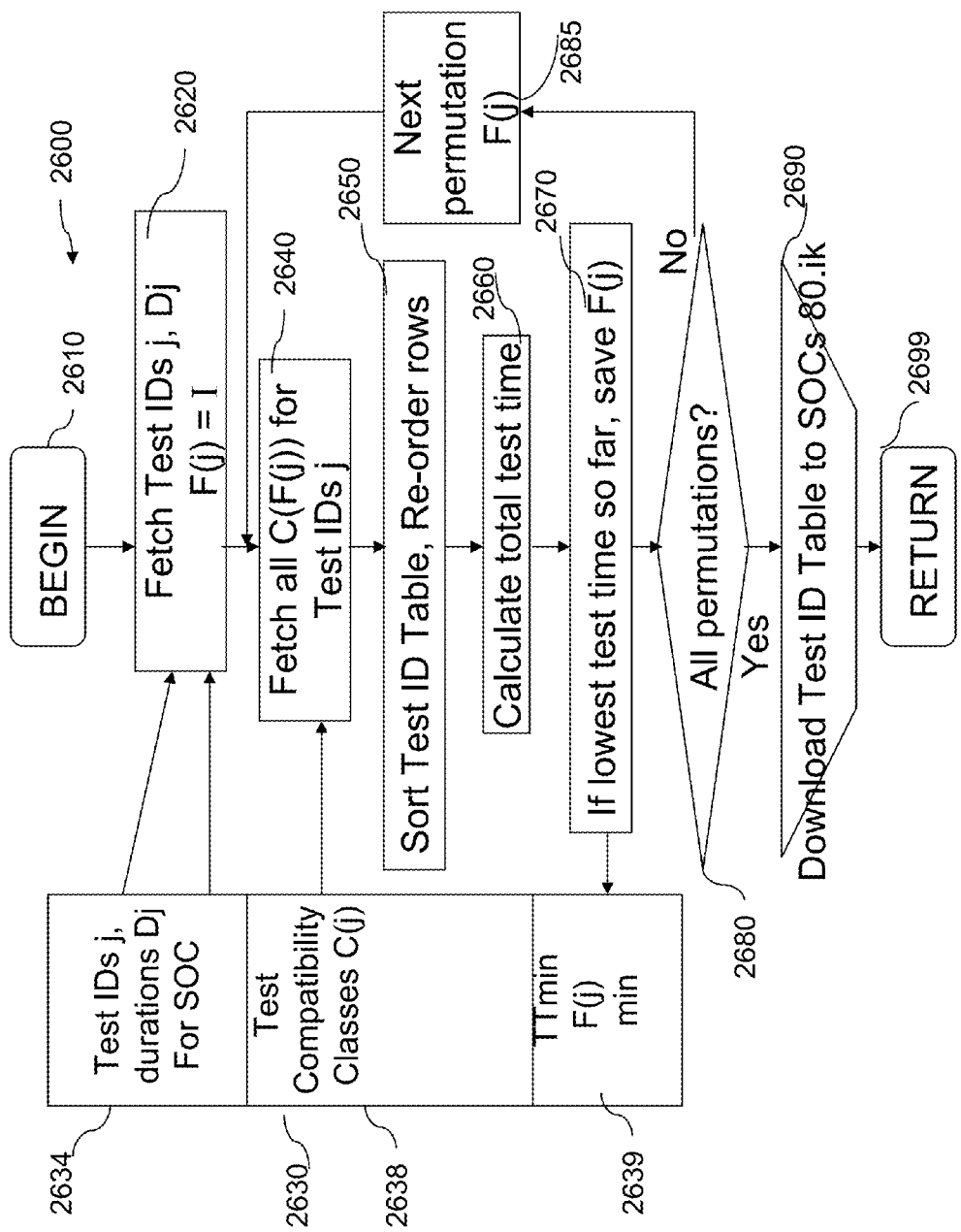
FIG. 23 is a flow diagram of a process for generating an even more nearly optimal Test ID Table.

Turning to FIG. 23, note also that the order of execution of the same tests Tn may change depending on their order of enumeration in Test ID Table 110 of FIG. 3 or 4. For example, if the tests T1-T6 were instead designated so that T1 is called 'T6', T2 is called 'T5', . . . and T6 is called 'T1', then the Test ID Table 110 would be arranged in a different order of rows by the process of FIG. 22. In general, the dynamic scheduling process provides a more efficient schedule of concurrent or overlapping tests when at least one pair of the tests are compatible (i.e., feasibly and more efficiently run concurrently, compared with a static schedule that runs all the tests one after the other). Moreover, some embodiments predetermine the length of time that each test takes to run on the DUT as a set of respective duration values $D_j$, such as by running each test individually in simulation or on a prototype of the SOC as DUT. Then the total length of time is optimized off-line according to the process flow of FIG. 23. One way of doing this is to execute the process of FIG. 23 for all N! permutations F(j) of the N Test ID designations j, determine a dynamic schedule according to FIG. 17 and calculate the total length of time (instead of actually executing production tests yet on the DUT) based on the dynamic schedule for each Test ID Table permutation, and then determine which total time is minimum and issue the Test ID Table permutation to the DUT as an optimized Test ID Table 110 in FIG. 3 or 4. Alternative optimization embodiments can likely smartly reduce the amount of off-line calculations below N! by taking advantage of any symmetries or interchangeabilities for scheduling purposes among the tests. The schedule of FIG. 14 represents an example of a relatively compacted schedule for particular tests and types of IP cores as illustrated. Some embodiments then specifically cause or enforce the order by ordering the compatibility classes in a Test ID Table suitably and downloading them from the tester 5 to DUT Test ID Table 110.

In FIG. 23, this off-line looping process embodiment 2600 commences with a BEGIN 2610 and then proceeds to a step 2620 that gets the test identifications j and durations Dj from an area 2634 of a storage 2630. On the first time through step 2620, a permutation function F(j) is an identity function F(j)=I or identity matrix I that leaves the vector of test identifications j unchanged (not permuted). Then by accessing a storage area 2638, a step 2640 obtains the compatibility classes C(F(j)) for the tests in their current order F(j). A succeeding step 2650 sorts and reorders the compatibility classes C(F(j)) to make a scheduling table as described for FIG. 22 steps 2560 and 2570. A succeeding step 2660 in FIG. 23 then computes a total test time TT that would be consumed by executing the tests in an overlapping manner based on the particular scheduling table generated by step 2650. A further step 2670 performs a determination of whether that test time TT value is less than any TT value thus far found, and if so, stores the particular permutation F(j) and the latest TT value as TTmin in area 2639 of storage 2630. Until all permutations have been checked, operations loop back via a step 2685 that systematically applies the next different permutation function F(j) out of the N! possibilities and then goes to step 2640 again, and so on. Step 2685 applies the permutation function F(j) such as by entering F(j) or otherwise suitably programming in FIG. 4 Test ID Indexing Table 170. Eventually, all the permutations are evaluated, and operations go from decision step 2680 to a step 2690. At step 2690, the scheduling table that yielded the minimum total time TTmin is generated by A) retrieving the permutation function F(j) that was involved in obtaining TTmin, B) executing steps 2640 and 2650 to generate that scheduling table, and C) downloading the resulting scheduling table to the tester 5 if not already there. Tester 5 downloads that scheduling table to the DUTs for production test. Following the step 2690, a RETURN 2699 is reached.

Figure 24:
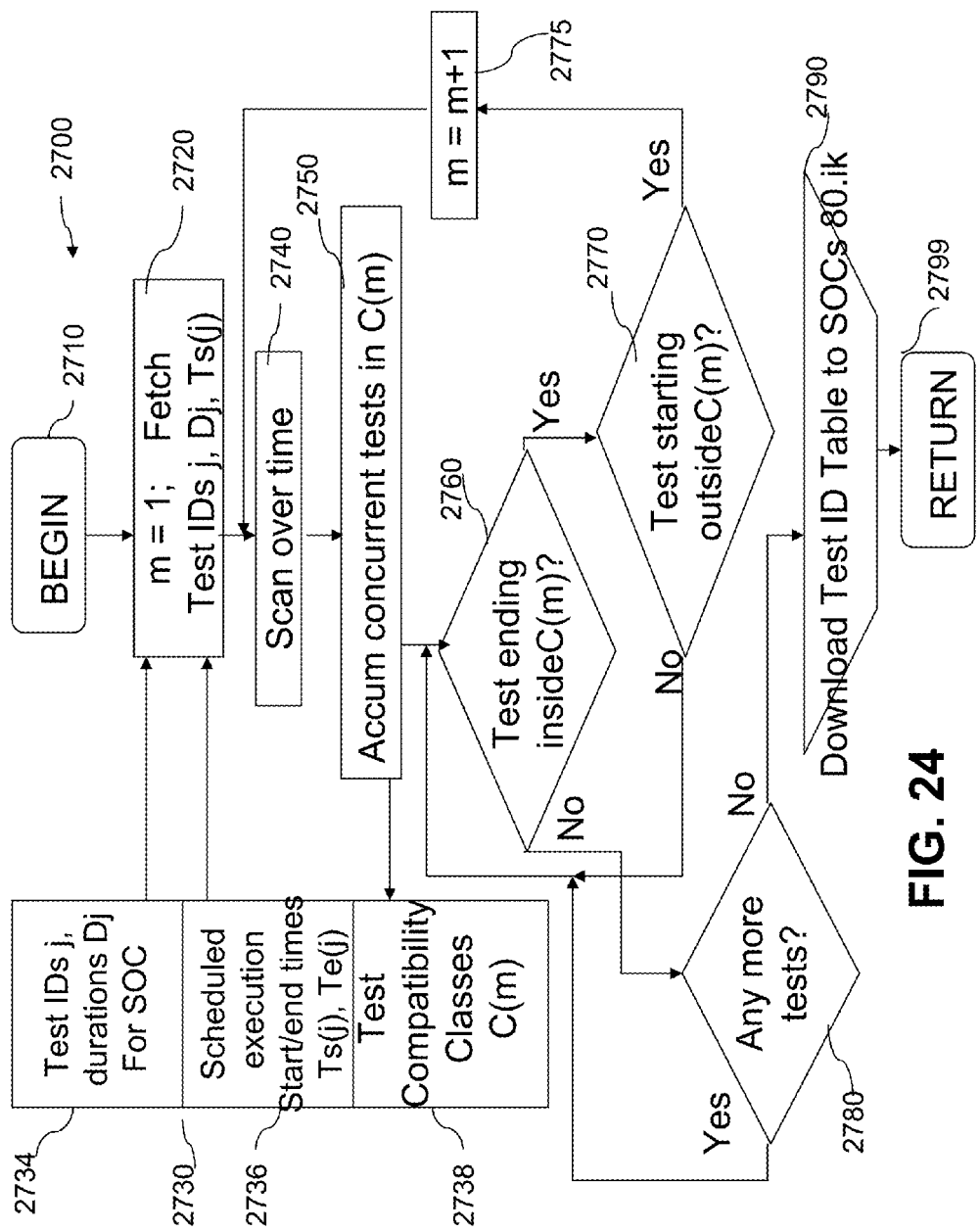
FIG. 24 is a flow diagram of a process for generating a particular ordering of compatibility classes for a Test ID Table starting from a schedule such as of FIG. 14 and that has been arrived at beforehand.

In FIG. 24, a process embodiment 2700 generates a particular ordering of compatibility classes C(m) for a Test ID Table starting from a schedule such as of FIG. 14 in case that schedule has been arrived at beforehand. Basically, the overall process 2700 scans across the schedule and assembles compatibility classes as it goes. Process 2700 commences with a BEGIN 2710 and then a step 2720 initializes a compatibility class index m to one (1) and accesses the storage 2730 for the various test IDs j and their durations (area 2734), and for times Ts(j) of starting execution and times Te(j) of ending execution (area 2736). A further step 2740 repeatedly scans or accesses the schedule in timewise order. A first compatibility class C1, or C(m=1) is the set union or accumulation in step 2750 of all tests that execute compatibly. Process 2700 assembles the compatibility classes C(m) and stores them in area 2738 using FIG. 14 as follows:

C1={T1, T2, T3, T4} where
  T1 is WLAN tests WR1+WR2+WR3+WR4+WR7+ WTXRX11+WTX8,
  T2 is BT tests BTWR2+BTWR3+BTWR4+BTWR1+ BT9,
  T3 is FM tests FMRX2+FM7+FM6+FM4+FM5,
  T4 is GPS tests G1+G2+G3+G4+G5+G6+G8+G9+G10.
C2={T5, T6, T7, T8} where
  T5 is WLAN tests WTX9+WTXRX12,
  T6 is BT tests T_BTWR5+T_BTWR6+T_BTWR7+ T_BTWR8.
  T7 is FM tests FM3+FM8+FM9+FM10,
  T8 is GPS test G7.
C3={T9, T10} where
  T9 is WLAN test WTX10, and
  T10 is FM test FMTX1.

In TABLE 12, the appropriate particular ordering of those compatibility classes for a Test ID Table 110 is correspondingly derived using the flow of FIG. 24 and the particular schedule of FIG. 14.

C(m) has just ended. If so (Yes) at step 2760, then operations go to a decision step 2770 that waits and determines whether a test that is not in the current compatibility class C(m) has just started. If Yes at step 2770, then a new compatibility class m=m+1 is established at a step 2775. Operations loop back from step 2775 to steps 2740 and 2750 so that new C(m) includes any test(s) from the just-previous compatibility class that are still in progress plus the test that just started. Over successive loops back, the following compatibility classes C1-C6 based on Case 2 of FIG. 13 are progressively evolved according to the process 2700 of FIG. 24 as follows:

C1={IP1_T1, IP2_T1, IP3_T1}
C2={IP2_T2, IP1_T2}
C3={IP1_T2, IP3_T2}
C4={IP1_T2, IP2_T3}
C5={IP2_T3, IP3_T3}
C6={IP2_T4}.

Process 2700 includes a branch from decision step 2770 (No) back to decision step 2760 as long as no new test is starting outside the current compatibility class C(m). Also, until a test ends inside C(m) at step 2760, operations branch from step 2760 (No) to a decision step 2780 the checks whether there are any more tests indicated in the schedule obtained from storage 2730. If so (Yes), then operations branch from decision step 2780 to the decision step 2760. At some point, no more tests exist and operations instead go from decision step 2780 to an output step 2790 that downloads a Test ID Table 110 comprised of compatibility classes C1-C6 to the SOCs 80.ik.

Notice that some embodiments can operate on lists or sets as written out as records in the above example, and some other embodiments operate on a storage table 110 as in TABLE 13 equivalently as follows:

TABLE 13

SCHEDULING TABLE (FIGS. 13, 24 EXAMPLE)

|    | IP1_T1 | IP2_T1 | IP3_T1 | IP2_T2 | IP1_T2 | IP3_T2 | IP2_T3 | IP3_T3 | IP2_T4 |
|----|--------|--------|--------|--------|--------|--------|--------|--------|--------|
| C1 | Y      | Y      | Y      |        |        |        |        |        |        |
| C2 |        |        |        | Y      | Y      |        |        |        |        |
| C3 |        |        |        |        | Y      | Y      |        |        |        |
| C4 |        |        |        |        | Y      |        | Y      |        |        |
| C5 |        |        |        |        |        |        | Y      | Y      |        |
| C6 |        |        |        |        |        |        |        |        | Y      |

TABLE 12

SCHEDULING TABLE EXAMPLE (FOR FIGS. 14, 24)

|    | T1 | T2 | T3 | T4 | T5 | T6 | T7 | T8 | T9 | T10 |
|----|----|----|----|----|----|----|----|----|----|----|
| C1 | Y  | Y  | Y  | Y  |    |    |    |    |    |     |
| C2 |    |    |    |    | Y  | Y  | Y  | Y  |    |     |
| C3 |    |    |    |    |    |    |    |    | Y  | Y   |

Suppose, for another example and to more fully describe the process of FIG. 24, that process is applied to the schedule represented by Case 2 of FIG. 13. The process at step 2750 accumulates in the same compatibility class C(m) any test(s) that starts executing while all the others are still in progress, i.e. concurrently with one another whether or not they are somewhat staggered. After step 2750, a decision step 2760 determines whether any test in a current compatibility class Some additional embodiments explicitly recognize in a data structure which IP cores the tests run on. See FIG. 12, Case 2. For instance, suppose test T1 can run on cores 2 and 3 concurrently, and test T2 can run on cores 1 and 2 concurrently. Suppose test T1 and test T2 cannot run on the same core concurrently, however. Test T2 could be launched on core 1 concurrently with test T1 commencing on cores 2 and 3. As soon as test T1 completes on core 2, perhaps prior to completing on core 3, then test T2 can be launched on core 2 in parallel with the ongoing test T1 in progress on core 3. An embodiment of a dynamic test process and structure is thus contemplated that uses all three of the dimensions of compatibility class, test type, and IP cores.

Where each IP core has unique tests, Test N may be uniquely associated to a particular IP core M. For example, one can arrange a full set of 10 tests for IP1 numbered T1 to T10, a full set of 8 tests for IP2 numbered T11 to T18, and a full set of 7 tests for IP3 numbered T19 to T25, etc. This unique numbering is applicable such as when a given test cannot run on any IP core other than the one it is associated with. DMLED operation involves a processor and memory. Each core has its dedicated processor. Hence a test may likely be uniquely associated with a processor and IP. Some embodiments recognize or perform a generalization wherein identical tests across IP cores are considered in compatibility classes. In some other embodiments or their Test ID Table, one can choose instead to just enumerate and number similar tests uniquely as well, in systems or SOCs wherein the tests are dedicated to a processor inside a radio module.

Figure 25:
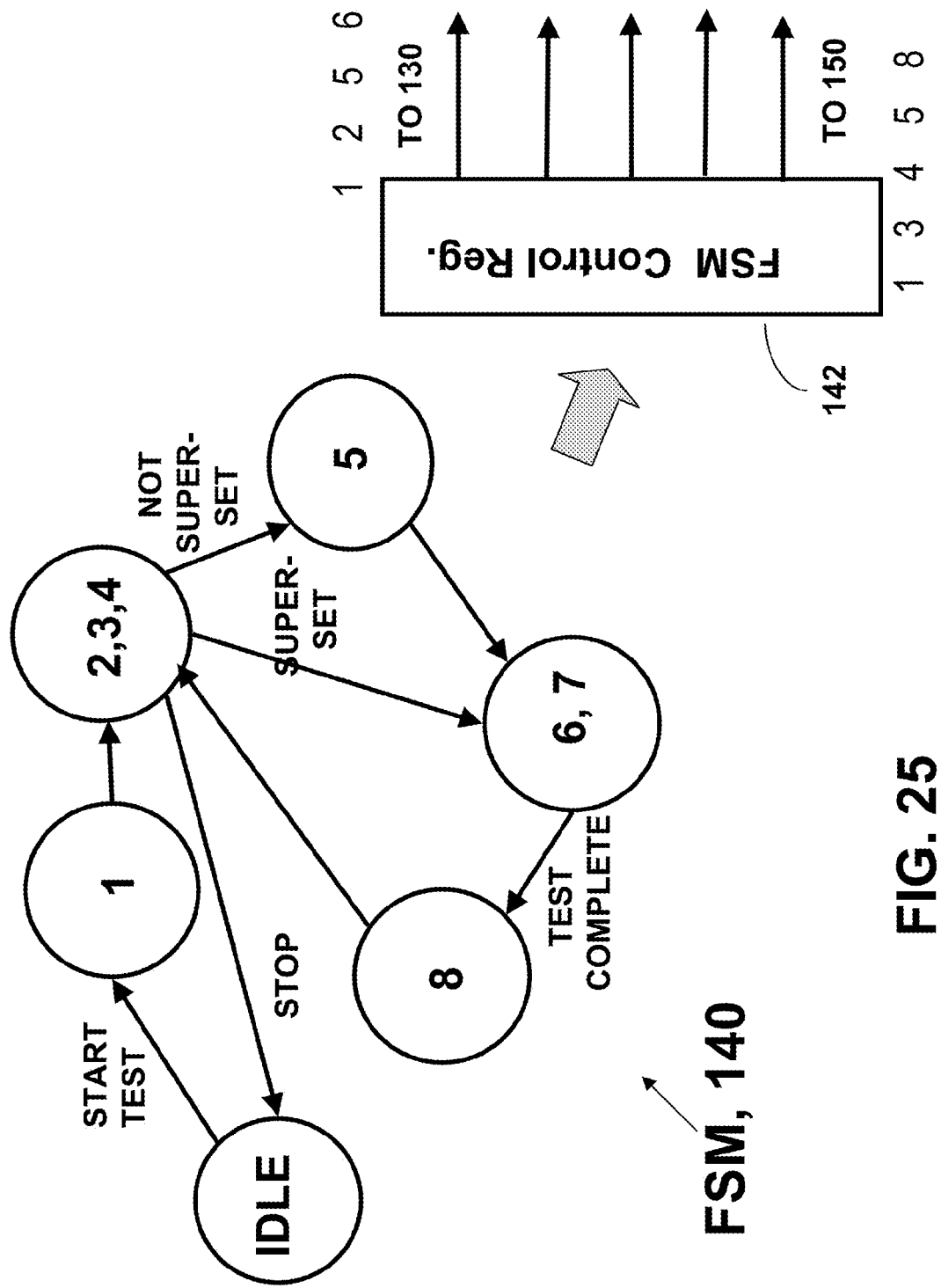
FIG. 25 is a state transition diagram of a finite state machine FSM embodiment for Test Execution Control and Test ID Issue Logic 140 (240) of FIGS. 3-6.

Turning to FIG. 25, a finite state machine FSM embodiment is shown for Test Execution Control and Test ID Issue Logic 140 (240) of FIGS. 3-6. FSM executes the process represented by TABLES 3, 4 hereinabove. This FSM is represented by the FIG. 25 state transition diagram that has an IDLE state to which all any currently active FSM state implicitly goes upon test circuit Reset or system Reset. FSM operations commence at the IDLE state when such Reset is lifted from the scheduling logic. Any unmarked transition arrow transitions on test clock. A combined state, or states between which transitions occur on test clock, can be indicated by multiple numerals in a circle. An FSM control register 142 has output bits wherein a respective bit in register 142 is set active (e.g., 1) when its corresponding state is entered by FSM 140, and reset inactive (0) upon exit from that state. These register 142 bits act as enables for the logic circuits in Address Generator 130 and Test List Updating Logic 150 that perform their enumerated operations. The operations of FSM as illustrated in FIG. 25 relate to TABLES 3-4 and the descriptions of FIGS. 3-6, 10 and 17. The FSM state transition diagram is readily rearranged to correspond to intended operations for other embodiments, such as indicated by the various different TABLES of pseudocode herein.

The test circuitry herein also facilitates testing of operations in cores or modules having any of RISC (reduced instruction set computing), CISC (complex instruction set computing), DSP (digital signal processors), microcontrollers, PC (personal computer) main microprocessors, math coprocessors, VLIW (very long instruction word), SIMD (single instruction multiple data) and MIMD (multiple instruction multiple data) processors and coprocessors as cores or standalone integrated circuits, and in other integrated circuits and arrays. The diagnostic circuitry is useful in other types of integrated circuits such as ASICs (application specific integrated circuits) and gate arrays and to all circuits with structures and analogous problems to which the advantages of the improvements described herein commend their use.

In addition to inventive structures, devices, apparatus and systems, processes are represented and described using any and all of the block diagrams, logic diagrams, and flow diagrams herein. Block diagram blocks are used to represent both structures as understood by those of ordinary skill in the art as well as process steps and portions of process flows. Similarly, logic elements in the diagrams represent both electronic structures and process steps and portions of process flows. Flow diagram symbols herein represent process steps and portions of process flows in software and hardware embodiments as well as portions of structure in various embodiments of the invention. Steps in flow diagrams may in some cases be changed in their order, supplemented or deleted to form still further process embodiments. The embodiments may have logic circuits that are high-active (active=1) as primarily used in the description, or may employ low-active logic (active=0), or mixtures of both. Some embodiments can include multiple bits and error correcting logic instead of using a one-hot single bit (such as the trigger bit for each test) in the description hereinabove.

ASPECTS

See Notes Paragraph at End of this Aspects Section

17A. The wireless chip claimed in claim 17 wherein at least one of said cores has a RF (radio frequency) plus MS (mixed-signal) circuit, and said test circuit has an embedded processor that is operable to provide controls to said RF plus MS circuit including transmission and reception, so that a test runs on said embedded processor that in turn controls the operation and sequencing of such RF+MS circuit in at least one of said cores to run a transmit and/or receive sequence through loopback between the transmit and receive channels within or across radios.

41A. The electronic process claimed in claim 41 wherein when the condition is met that said another compatibility class takes the place of the one such accessed compatibility class in the conditional determination.

41B. The electronic process claimed in claim 41 wherein when at least one test completes, the electronically executing step is then repeated.

42A. The integrated circuit claimed in claim 42 further comprising functional modules responsive to the test trigger output signals to selectively perform one more test represented by the test trigger output signals and to supply a test completion signal indicating which test is completed to said sequential control logic.

42A1. The integrated circuit claimed in claim 42A wherein said sequential control logic is responsive to said test completion signal to update a command signal to said address generator.

42A2. The integrated circuit claimed in claim 42A wherein said test list updating logic is operable to reset one or more bits in at least one such test list in response to the test completion signal for each test that is completed.

42A3. The integrated circuit claimed in claim 42A wherein said sequential control logic is responsive to said test completion signal to again actuate said test list updating logic.

42A4. The integrated circuit claimed in claim 42A wherein said sequential control logic is responsive to said test completion signal to initiate a Dump for each newly-completed test.

42B. The integrated circuit claimed in claim 42 wherein said test list updating logic is operable to signal said sequential control logic with a determination whether one test list is a superset of another test list or not, and said sequential control logic is responsive to that determination to signal said address generator to change or effectively maintain an address to said control storage.

42C. The integrated circuit claimed in claim 42 wherein said sequential control logic is responsive to said test list updating logic to signal said address generator to change or effectively maintain an address to said control storage, the address when effectively maintained being the result of said address generator reversing a change to the address.

42D. The integrated circuit claimed in claim 42 wherein the test trigger output signals initiate a Load operation for each newly-triggered test.

42E. The integrated circuit claimed in claim 42 wherein said test list updating logic includes further logic coupled to operate on at least two of the tester output signals in tandem.

42F. The integrated circuit claimed in claim 42 wherein said test list updating logic includes a structure to associate a first group of one or more of the tests to a particular functional module and to associate a second different group of one or more of the tests to a different functional module.

43A. The testable apparatus claimed in claim 43 further comprising a user interface coupled with said processor and operable to actuate operations involving said first modem and said second modem.

43B. The testable apparatus claimed in claim 43 further comprising a printed wiring board coupling said storage circuit and said processor.

43C. The testable apparatus claimed in claim 43 wherein said modems, processor, and storage circuit are adapted for an article selected from the group consisting of 1) cellular telephone, 2) internet content player, 3) wireless gateway, 4) television, 5) automotive wireless entertainment unit.

44A. The electronic test circuit claimed in claim 44 wherein said processing circuit is further operable to conditionally access the second portion of said storage for the additional entries before all tests in the first portion are completed on the condition that the remaining tests in the first portion are included in the second portion.

44A1. The electronic test circuit claimed in claim 44A wherein said processing circuit is operable to issue test trigger signals based on the second portion of said storage depending on a condition.

44B. The electronic test circuit claimed in claim 44 further comprising an address generator operable to actuate said storage with at least one address to access said first portion and at least another address to access said second portion of said storage.

44C. The electronic test circuit claimed in claim 44 further comprising a test updating logic circuit having a trigger enable register and coupled with said storage and operable to update said trigger enable register based on information from a least one said portion of said storage and information already in said trigger enable register.

44C1. The electronic test circuit claimed in claim 44C further comprising a functional circuit operable in response to said trigger enable register to execute a test and to signal completion of the test to said processor circuit.

44C2. The electronic test circuit claimed in claim 44C further comprising a functional circuit operable in response to said trigger enable register for a test execution and to signal completion of the test, said test updating logic circuit operable to update said trigger enable register after the signal occurs.

44C3. The electronic test circuit claimed in claim 44C wherein said trigger enable register has bits indicating compatible tests that are ready for execution.

44C4. The electronic test circuit claimed in claim 44C further comprising at least two functional cores, a set of logic gates coupled to receive respective bits from the trigger enable register, and a second register indicating functional core enables coupled to plural ones of the logic gates in said set of logic gates, said logic gates having outputs coupled to said functional cores.

45A. The electronic circuit claimed in claim 45 wherein said storage circuit holds data bits representing compatibility classes that represent all largest distinct sets of tests that can execute concurrently such that every test in that set is compatible with all other tests in that set.

45B. The electronic circuit claimed in claim 45 wherein said sequential logic circuit logic forms a logic function based on plural sets of the data bits and triggers tests out of a selected set of the data bits based on a selection condition involving the logic function.

45B1. The electronic circuit claimed in claim 45B wherein the selection condition involving the logic function includes a superset relationship between at least one pair of the sets.

45C. The electronic circuit claimed in claim 45 wherein a latest set is accessed from said storage circuit by said sequential logic circuit provided that any tests that have been previously triggered from an earlier-accessed such set and are still running are all represented in the latest set.

45C1. The electronic circuit claimed in claim 45C wherein all remaining tests, if any, specified in that latest set that have been up to that time yet to be triggered by said sequential logic circuit, are triggered approximately concurrently with each other.

45D. The electronic circuit claimed in claim 45 wherein said sequential logic circuit is operable to launch a subset of tests represented by data bits in one set based on data bits in another set.

45E. The electronic circuit claimed in claim 45 wherein said sequential logic circuit is operable to launch a subset of tests represented by data bits in one set based on data bits representing at least one other of the tests outside that subset and in another set.

45F. The electronic circuit claimed in claim 45 wherein said sequential logic circuit is operable to effectively make one or more particular data bits inapplicable in one or more of the sets.

45G. The electronic circuit claimed in claim 45 wherein said sequential logic circuit is operable to effectively make one or more particular sets inapplicable.

45H. The electronic circuit claimed in claim 45 wherein said storage circuit holds data bits representing only a triangular portion of a symmetric array.

46A. The multi-site system claimed in claim 46 wherein the distribution is wireless.

46B. The multi-site system claimed in claim 46 further comprising wafer probe assemblies respective to each of the testers, at least one said wafer probe assembly adapted for manufacturing multiple die per wafer.

46C. The multi-site system claimed in claim 46 wherein each of said testers is operable in response to the test codes and the compatibility data to run multiple tests in parallel in each of multiple die.

46D. The multi-site system claimed in claim 46 further comprising wafers with multiple die per wafer, the testers operable each to download at least a portion of the test codes and compatibility data as between tests into each die under test.

46D1. The multi-site system claimed in claim 46D wherein each of the multiple die has a scheduling circuit operable to run at least some of the tests concurrently and dynamically schedule them based on the compatibility data and actual completion events of at least some of the tests in each such die.

47A. The tester claimed in claim 47 wherein the first storage area in said storage includes a space for a list of types of integrated circuits and a space for a list of test identifications applicable to each such type of integrated circuit, and a space specifying the test identifications in respective compatibility classes, and wherein said tester processor is operable to fetch the particular compatibility classes applicable to a given integrated circuit.

47B. The tester claimed in claim 47 wherein the first storage area in said storage includes a space for a list of test identifications, and a space specifying the test identifications in respective compatibility classes, and wherein said tester processor is operable to use the particular compatibility classes to generate the test scheduling table.

47B1. The tester claimed in claim 47B wherein the test identifications are orderable and said tester processor is operable to fetch compatibility classes from said storage and re-order the compatibility classes in order of test identification therein.

47B2. The tester claimed in claim 47B wherein the test identifications are orderable and said tester processor is operable to fetch compatibility classes from said storage and re-order the compatibility classes in order of test identification therein and in descending order of cardinality within groups of the compatibility classes having the same first test identification therein.

47C. The tester claimed in claim 47 wherein said tester processor is operable to fetch particular compatibility classes from said storage and sort those compatibility classes so that compatibility classes with a larger number of tests are ordered before compatibility classes with a fewer number of tests.

47C1. The tester claimed in claim 47C wherein the first storage area in said storage includes a space for a list of test identifications and the test identifications are orderable and said tester processor is operable after fetching and sorting particular compatibility classes from said storage to re-order the sorted compatibility classes in order of test identification therein.

47D. The tester claimed in claim 47 for manufacturing a particular type of integrated circuit wherein said tester processor is operable to fetch compatibility classes from said storage applicable to that particular type of integrated circuit, said tester processor further operable to effectively permute the particular compatibility classes and estimate a predicted test time for each such permutation and identify a particular permutation that corresponds to a predicted test time that is no greater than for other such permutations and then store information specifying the identified particular permutation.

48. A process of dynamic scheduling comprising:
providing a test list;
initializing a row address variable;
incrementing the row address;
fetching a next test list NT to which the row address currently points wherein test list NT indicates a compatibility class C(i) of tests compatible with test T#=i;
determining whether test list NT is a superset of a currently existing test list PT, and if so, merging test lists NT and PT to trigger execution of at least one new test, but if not then discarding the new test list NT and decrementing the address to restore the value of the address as it was just prior to the incrementing; and
continuing existing tests in progress so that as soon as any of the tests now in progress is completed, then resetting a T# bit associated with the test list PT, where that T# bit represents that the test is completed; and
looping back to the incrementing.

48A. The process claimed in claim 48 further comprising terminating the process when the rows of the test list are exhausted by the incrementing of the row address.

48B. The process claimed in claim 48 further comprising progressively applying the tests to different radio cores in a system.

48C. The process claimed in claim 48 wherein the at least one of the compatibility classes is selected from the group consisting of 1) receive tests with external source, 2) receive tests with internal signals, 3) receive tests with external loop-back, 4) transmitter tests with external measurement support, 5) transmitter internal loop-back tests.

Notes about Aspects above: Aspects are paragraphs which might be offered as claims in patent prosecution. The above dependently-written Aspects have leading digits and internal dependency designations to indicate the claims or aspects to which they pertain. Aspects having no internal dependency designations have leading digits and alphanumerics to indicate the position in the ordering of claims at which they might be situated if offered as claims in prosecution.

Processing circuitry comprehends digital, analog and mixed signal (digital/analog) integrated circuits, ASIC circuits, PALs, PLAs, decoders, memories, and programmable and nonprogrammable processors, microcontrollers and other circuitry. Internal and external couplings and connections can be ohmic, capacitive, inductive, photonic, and direct or indirect via intervening circuits or otherwise as desirable. Process diagrams herein are representative of flow diagrams for operations of any embodiments using any one, some or all of hardware, software, or firmware, and processes of manufacture thereof. Flow diagrams and block diagrams are each interpretable as representing structure and/or process. While this invention has been described with reference to illustrative embodiments, this description is not to be construed in a limiting sense. Various modifications and combinations of the illustrative embodiments, as well as other embodiments of the invention may be made. The terms including, includes, having, has, with, or variants thereof are used in the detailed description and/or the claims to denote non-exhaustive inclusion in a manner similar to the term comprising. The appended claims and their equivalents should be interpreted to cover any such embodiments, modifications, and embodiments as fall within the scope of the invention.

What is claimed is:

1. A wireless chip comprising:
mixed-signal cores for at least two different radios, at least one of the radios has a transmitter and a receiver; and
a test circuit coupled with the radios, the test circuit including a configurable controller operable to trigger compatible tests and to dynamically create a schedule responsive to test completions for concurrent tests on the radios, the test circuit providing the at least two different levels of concurrency among the cores for the radios and the tests in the cores.

2. The wireless chip claimed in claim 1 further comprising a combining circuit and a load execute dump interface, the combining circuit coupled to said cores for the at least two different radios to combine results of the tests and transfer the results through said load execute dump interface.

3. The wireless chip claimed in claim 1 wherein said test circuit is operable for forking multiple tests and combining their results through an output interface.

4. The wireless chip claimed in claim 1 wherein said cores each have radio frequency (RF) modules, and said test circuit has an embedded processor operable to trigger concurrent execution of tests on the RF modules in said cores according to a dynamic test schedule.

5. The wireless chip claimed in claim 1 wherein said test circuit is operable to run a combined and concurrent transmit and receive test through loopback between transmit and receive channels within or across the cores for the at least two radios.

6. The wireless chip claimed in claim 1 wherein said test circuit is operable to assign different tests, or sets of tests, unique test identifications.

7. The wireless chip claimed in claim 1 wherein said test circuit is further operable to select one or more of the test identifications at a time to trigger one or more corresponding tests, and to deliver results of individual tests as output.

8. The wireless chip claimed in claim 1 wherein said test circuit is further operable to trigger at least one test to overlap an execute phase of the test in at least one of said cores with a download of at least one other test into another at least one of said cores.

9. The wireless chip claimed in claim 1 wherein said test circuit is further operable to trigger at least one test to overlap an execute phase of the test in at least one of said cores with a phase selected from the group consisting of 1) load, 2) execute, 3) dump of at least one other test in another at least one of said cores.

10. The wireless chip claimed in claim 1 wherein said test circuit is further operable to trigger at least one test to overlap an execute phase of a test in at least one of said cores with a dump-results phase of at least one other test from another at least one of said cores.

11. The wireless chip claimed in claim 1 wherein said cores for the least two radios each have a processor, and said test circuit is further operable to trigger at least one test by communicating controls including a test identification to each said processor.

12. The wireless chip claimed in claim 1 wherein the tests are selected from the group consisting of: 1) receiver and transmitter digital-to-analog converters testing, 2) digitally controlled oscillator testing, 3) phase noise testing for transmissions into unintended frequency channels, 4) receiver phase error testing, 5) loopback gain testing of pre-power amplifier and receiver front end, 6) external loopback testing for non-interference between radios.

13. The wireless chip claimed in claim 1 wherein at least one of the radios is selected from the group consisting of 1) Wi-Fi (802.11) wireless local area networking, 2) Bluetooth (802.15), 3) FM, 4) GPS, 5) near field communications (NFC), 5) cellular telephony, 6) WiMax.

14. The wireless chip claimed in claim 1 wherein at least one of said cores has a RF (radio frequency) plus MS (mixed-signal) circuit, and said test circuit has an embedded processor that is operable to provide controls to said RF plus MS circuit including transmission and reception, so that a test runs on said embedded processor that in turn controls the operation and sequencing of such RF+MS circuit in at least one of said cores to run a transmit and/or receive sequence through loopback between the transmit and receive channels within or across radios.

15. A wireless chip comprising:
mixed-signal cores for at least two different radios, at least one of the radios has a transmitter and a receiver; and
a test circuit coupled with the radios, the test circuit including a configurable controller operable to trigger compatible tests and to dynamically create a schedule responsive to test completions for concurrent tests on the radios, in which concurrency is based on a parallel application of identical test stimuli by the test circuit to the cores for two of the different radios and on parallel execution of different particular firmware sequences as tests on the cores for the two different radios to provide concurrency of tests for the cores.

16. A wireless chip comprising:
mixed-signal cores for at least two different radios, at least one of the radios has a transmitter and a receiver; and
a test circuit coupled with the radios, the test circuit including a configurable controller operable to trigger compatible tests and to dynamically create a schedule responsive to test completions for concurrent tests on the radios, the test circuit being operable to issue test identifications to one or more selected cores, and to trigger one or more tests in the selected cores, the cores respectively operable to validity-check the test identifications directed to them.

* * * * *